(12) United States Patent
Lin et al.

(10) Patent No.: US 12,302,564 B2
(45) Date of Patent: May 13, 2025

(54) MEMORY DEVICE COMPRISING SECOND MEMORY CELL HAVING FIRST TERMINAL COUPLED TO FIRST SIGNAL LINE THROUGH FIRST MEMORY CELL

(71) Applicant: Taiwan Semiconductor Manufacturing Company, Ltd., Hsinchu (TW)

(72) Inventors: Meng-Han Lin, Hsinchu (TW); Chia-En Huang, Hsinchu County (TW); Han-Jong Chia, Hsinchu (TW); Yi-Ching Liu, Hsinchu (TW); Sheng-Chen Wang, Hsinchu (TW); Feng-Cheng Yang, Hsinchu County (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 425 days.

(21) Appl. No.: 17/582,001

(22) Filed: Jan. 24, 2022

(65) Prior Publication Data
US 2023/0038021 A1 Feb. 9, 2023

Related U.S. Application Data

(60) Provisional application No. 63/230,063, filed on Aug. 6, 2021.

(51) Int. Cl.
*H01L 23/52* (2006.01)
*H01L 23/522* (2006.01)
*H10B 43/10* (2023.01)
*H10B 43/27* (2023.01)

(52) U.S. Cl.
CPC ......... *H10B 43/27* (2023.02); *H01L 23/5226* (2013.01); *H10B 43/10* (2023.02)

(58) Field of Classification Search
CPC ...... H10B 43/27; H10B 43/10; H01L 23/5226
USPC .......................................................... 257/288
See application file for complete search history.

(56) References Cited

U.S. PATENT DOCUMENTS

| | | | |
|---|---|---|---|
| 2018/0240504 A1* | 8/2018 | Jang | G11C 16/30 |
| 2018/0261575 A1* | 9/2018 | Tagami | H01L 25/0657 |
| 2019/0115077 A1* | 4/2019 | Shin | G11C 16/0425 |
| 2020/0295031 A1* | 9/2020 | Lue | H01L 21/76224 |
| 2022/0254413 A1* | 8/2022 | Han | G11C 11/56 |
| 2022/0293628 A1* | 9/2022 | Chen | G11C 16/14 |

FOREIGN PATENT DOCUMENTS

| | | | | |
|---|---|---|---|---|
| CN | 112349774 A1 * | 2/2021 | | H10B 51/20 |
| KR | 20180011549 A * | 2/2018 | | H10B 43/35 |

* cited by examiner

*Primary Examiner* — Phuc T Dang
(74) *Attorney, Agent, or Firm* — JCIPRNET

(57) ABSTRACT

A memory device includes a first signal line, a second signal line, a first memory cell and a plurality of second memory cells. The first memory cell is coupled to the first signal line. Each of the second memory cells has a first terminal coupled to the first signal line through the first memory cell and a second terminal coupled to the second signal line.

20 Claims, 46 Drawing Sheets

MEMORY DEVICE COMPRISING SECOND MEMORY CELL HAVING FIRST TERMINAL COUPLED TO FIRST SIGNAL LINE THROUGH FIRST MEMORY CELL

CROSS-REFERENCE TO RELATED APPLICATION

This application claims the priority benefit of U.S. provisional applications serial no. 63/230,063, filed on Aug. 6, 2021. The entirety of the above-mentioned patent application is hereby incorporated by reference herein and made a part of this specification.

BACKGROUND

As the size of the integrated circuit keeps decreasing, the integration density of the component or device gradually increases. Semiconductor memory devices include volatile memories and non-volatile memories. For semiconductor memory devices, the increased memory cell density leads to compact structure designs with reduced sizes but maintaining the performance of the semiconductor memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
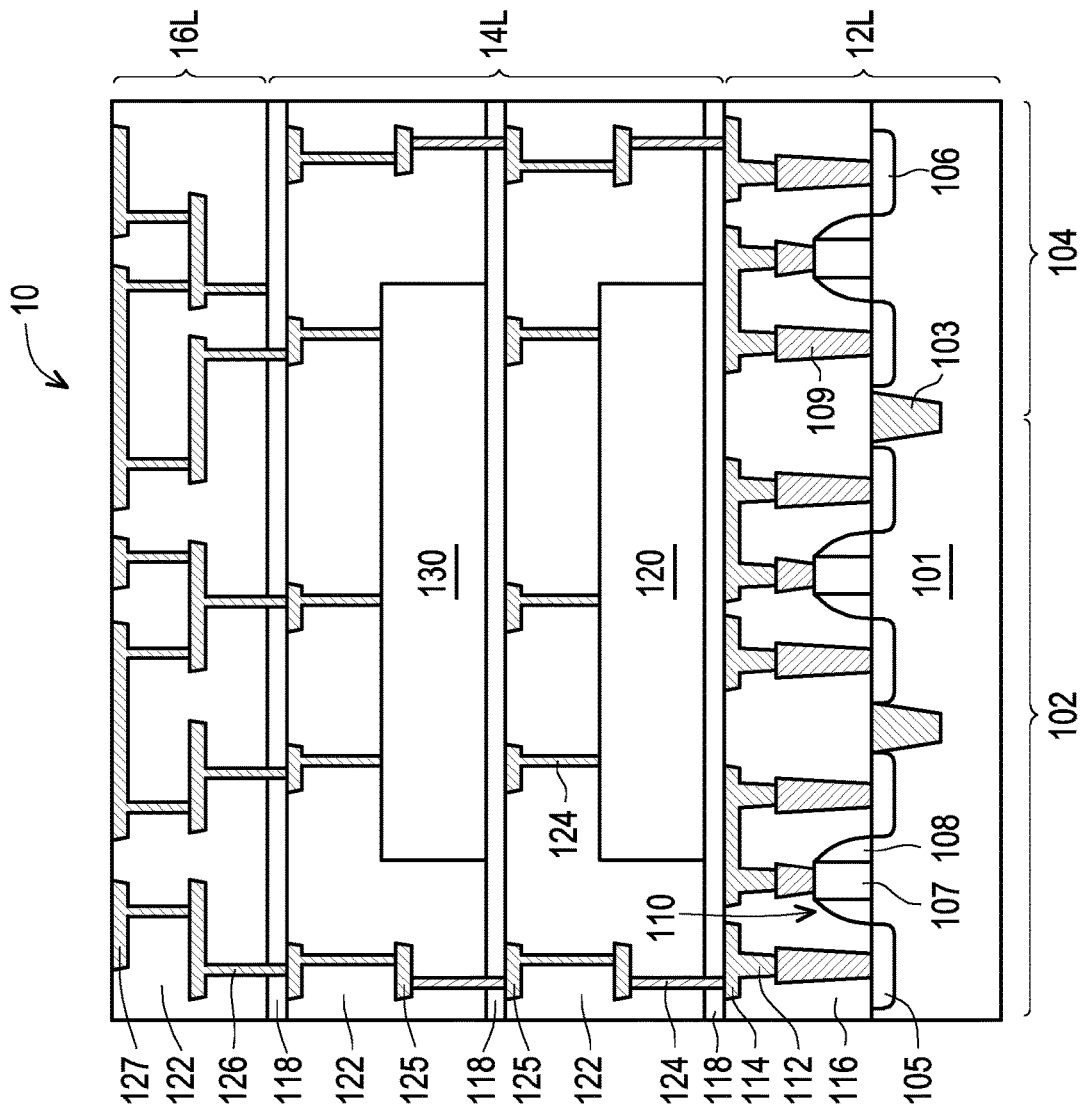
FIG. 1 illustrates a cross-sectional view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross-sectional view of a semiconductor device 10 in accordance with some embodiments. In some embodiments, the semiconductor device 10 is formed with integrated memory devices 120 and 130. The semiconductor device 10 may include field effect transistor (FET) devices 110 and three-dimensional (3D) memory devices 120, 130. In one embodiment, the FET devices 110 is formed through the front-end-of-line (FEOL) manufacturing processes and include fin field effect transistors (FinFETs). The at least one of the memory devices 120, 130 may include three-dimensional (3D) ferroelectric random access memory (FeRAM) devices formed through the back-end-of-line (BEOL) manufacturing processes. It is understood that FinFETs are used as examples, and other kinds of FEOL devices such as planar transistors or gate-all-around (GAA) transistors may be used herein and included within the scope of the present disclosure. That is, the 3D memory devices 120, 130 may be integrated with or in any suitable semiconductor devices. In FIG. 1, the details of the memory devices 120, 130 are not shown and further details will be described later in subsequent figures.

As illustrated in FIG. 1, the semiconductor device 10 includes different regions for forming different types of circuits. For example, the semiconductor device 10 includes a first region 102 for forming logic circuits and a second region 104 for forming peripheral circuits, input/output (I/O) circuits, electrostatic discharge (ESD) circuits, and/or analog circuits. The semiconductor device 10 may also include other regions for forming other types of circuits which are fully intended to be included within the scope of the present disclosure. The semiconductor device 10 includes a substrate 101. In some embodiments, the substrate 101 is a bulk substrate, such as a silicon substrate, doped or undoped, or an active layer of a semiconductor-on-insulator (SOI) substrate. In some embodiments, the substrate 101 includes other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. For example, additional electrical components, such as resistors, capacitors, inductors, diodes, or the like, is formed in or on the substrate 101 during the FEOL manufacturing processes.

As seen in FIG. 1, the FET devices 110 are formed on the substrate 101, and isolation regions 103, such as shallow trench isolation (STI) regions, are formed between or around the FET devices 110. In some embodiments, the FET device 110 includes a gate electrode 107 and source/drain regions 105/106. The gate electrode 107 may be formed over the substrate 101 with gate spacers 108 along sidewalls of the gate electrode 107. The source/drain regions 105/106 such as doped or epitaxial source/drain regions are formed on opposing sides of the gate electrode 107. In some embodiments, conductive contacts 109, such as gate contacts and source/drain contacts, are formed over and electrically coupled to respective underlying electrically conductive features (e.g., gate electrodes 107 or source/drain regions 105/106). In some embodiments, a dielectric layer 116, such as an inter-layer dielectric (ILD) layer, is formed over the substrate 101 and covering the source/drain regions 105/106, the gate electrode 107 and the contacts 109, and other electrically conductive features, such as metallic interconnect structures including conductive vias 112 and conductive lines 114, are embedded in the dielectric layer 116. It is understood that the dielectric layer 116 may include more than one dielectric layers of the same or different dielectric materials. Collectively, the substrate 101, the FET devices 110, the contacts 109, conductive features 112/114, and the dielectric layers 116 shown in FIG. 1 may be referred to as the front-end level 12L.

Referring to FIG. 1, dielectric layers 118 and dielectric layers 122 are formed over the dielectric layer 116 in alternation. In one embodiment, at least one of the dielectric layers 118 includes an etch stop layer (ESL). In some embodiments, the materials of the dielectric layers 118 is different from the materials of the dielectric layers 116 and 122. In some embodiments, the material of the dielectric layer(s) 118 includes silicon nitride or carbide formed by plasma-enhanced physical vapor deposition (PECVD). In some embodiments, one or more of the dielectric layers 118 is omitted. In some embodiments, the dielectric layers 116 and 122 is formed of any suitable dielectric material, such as silicon oxide, silicon nitride, silicon oxynitride, phosphosilicate glass (PSG), borosilicate glass (BSG), boron-doped phosphosilicate glass (BPSG), or low-k materials, formed by a suitable method, such as spin coating, physical vapor deposition (PVD), chemical vapor deposition (CVD), or the like. In FIG. 1, memory devices 120 and 130, each of which may include a plurality of memory cells, are formed in the dielectric layer 122 and coupled to electrically conductive features (e.g., metallic vias 124 and metallic lines 125) in the dielectric layer 122.

In FIG. 1, the memory devices 120 and 130 are formed at different layers of the dielectric layers 122. The memory device 120 is formed at the lower layer, and the memory device 130 is formed at the upper layer. In some embodiments, the memory devices 120 and 130 have the same or similar structure. In some embodiments, the memory devices 120 and 130 have different structure designs. Although two layers of memory devices are depicted in FIG. 1, other numbers of layers of memory devices, such as one layer, three layers, or more, are also possible and are encompassed within the scope of the present disclosure. Collectively, the layers of memory device 120 and 130 are referred to as the memory device level 14L or a memory region of the semiconductor device 10. The memory device level 14L may be formed in the BEOL processes of semiconductor manufacturing. The memory devices 120 and 130 may be formed in the BEOL processes at any suitable locations within the semiconductor device 10, such as over the first region 102, over the second region 104, or over a plurality of regions.

After the memory device level 14L is formed, an interconnect level 16L including electrically conductive interconnecting features (e.g., metallic vias 126 and metallic patterns 126) embedded in the dielectric layer(s) 122 is formed over the memory device level 14L. Any suitable methods may be employed to form the interconnect level 16L, and the details are not described herein. In some embodiments, the interconnect level 16L is electrically connect the electrical components formed in/on the substrate 101 to form functional circuits. In some embodiments, the interconnect structure 140 is also electrically coupled the memory devices 120, 130 to the FET devices 110 and/or the components in/on the substrate 101. In addition, the memory devices 120 and 130 may be electrically coupled to an external circuit or an external device through the structure of the interconnect level 16L. In some embodiments, the memory devices 120 and 130 are electrically coupled to the FET devices 110 of the front-end level 12L and/or other electrical components formed in the substrate 101, and are controlled or accessed (e.g., written to or read from) by functional circuits of the semiconductor device 10. Alternatively, the memory devices 120, 130 are electrically coupled to (e.g., controlled or accessed) an external circuit of another semiconductor device through the structure of the interconnect level 16L.

FIGS. 2A, 3, 4, 5, 6A, 7A, 8A, 9A, 10A, 11A, 12A, 13A, 14A, 15A, 16A, 17A 18A, 19A, 20A and 21A illustrate varying views of manufacturing a memory device in accordance with some embodiments. FIGS. 2B, 6B, 7B and 8B are illustrated along reference cross-section I-I' illustrated in FIGS. 2A, 6A, 7A and 8A. FIGS. 9B, 10B, 11B, 12B, 13B and 14B are illustrated along reference cross-section II-II' illustrated in FIGS. 9A, 10A, 11A, 12A, 13A and 14A. FIGS. 15B, 16B, 17B, 18B, 19B and 20B are illustrated along reference cross-section III-III' illustrated in FIGS. 15A, 16A, 17A, 18A, 19A and 20A. In FIGS. 8A, 9A, 10A, 11A, 12A, 13A, 14A, 15A, 16A, 17A 18A, 19A, 20A and 21A, the enlarged partial 3D view of a portion of the structure is shown at the right side.

Figure 2A:
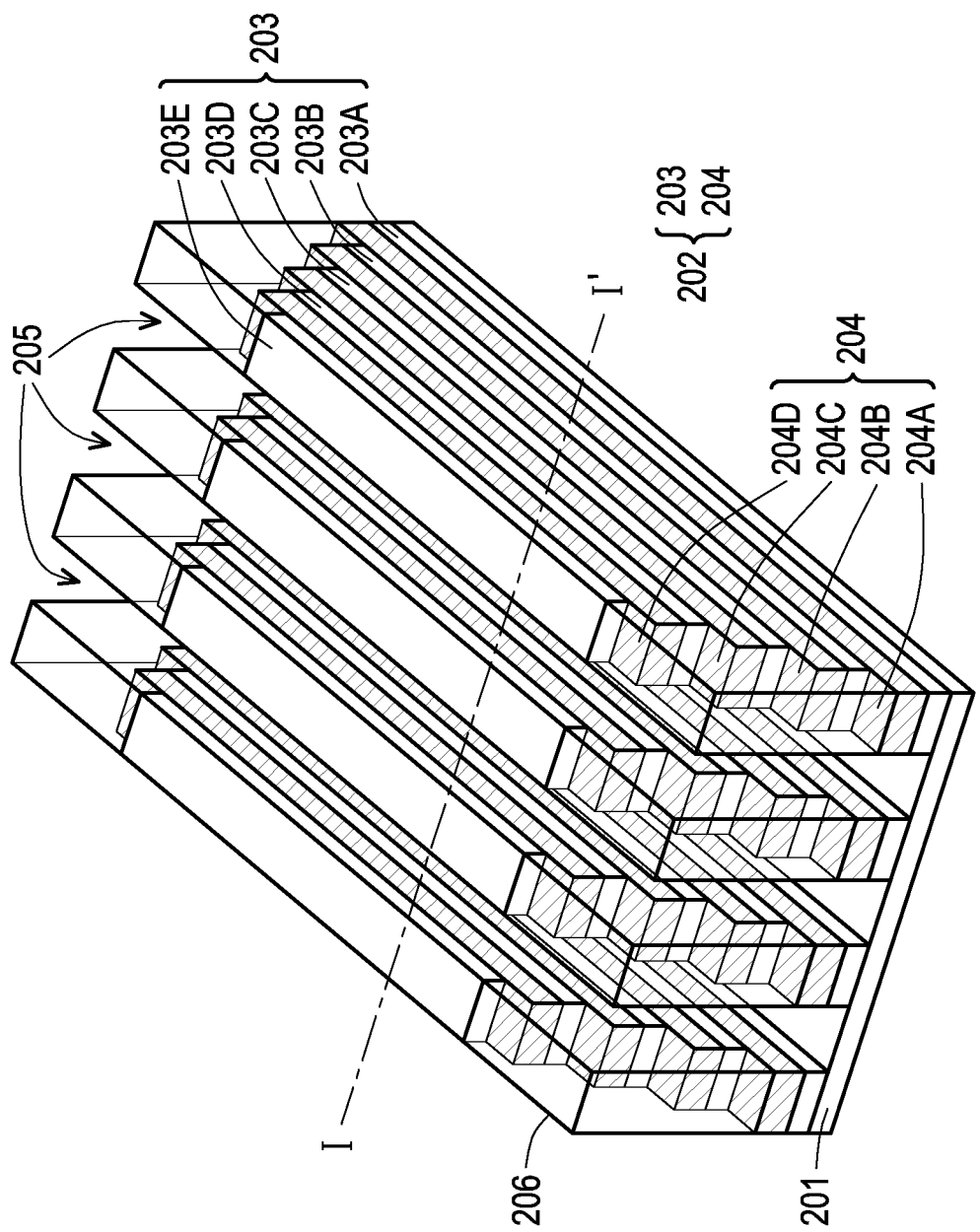
FIGS. 2A, 3, 4, 5, 6A, 7A, 8A, 9A, 10A, 11A, 12A, 13A, 14A, 15A, 16A, 17A 18A, 19A and 20A illustrate varying views of manufacturing a memory device in accordance with some embodiments.
Figure 2B:
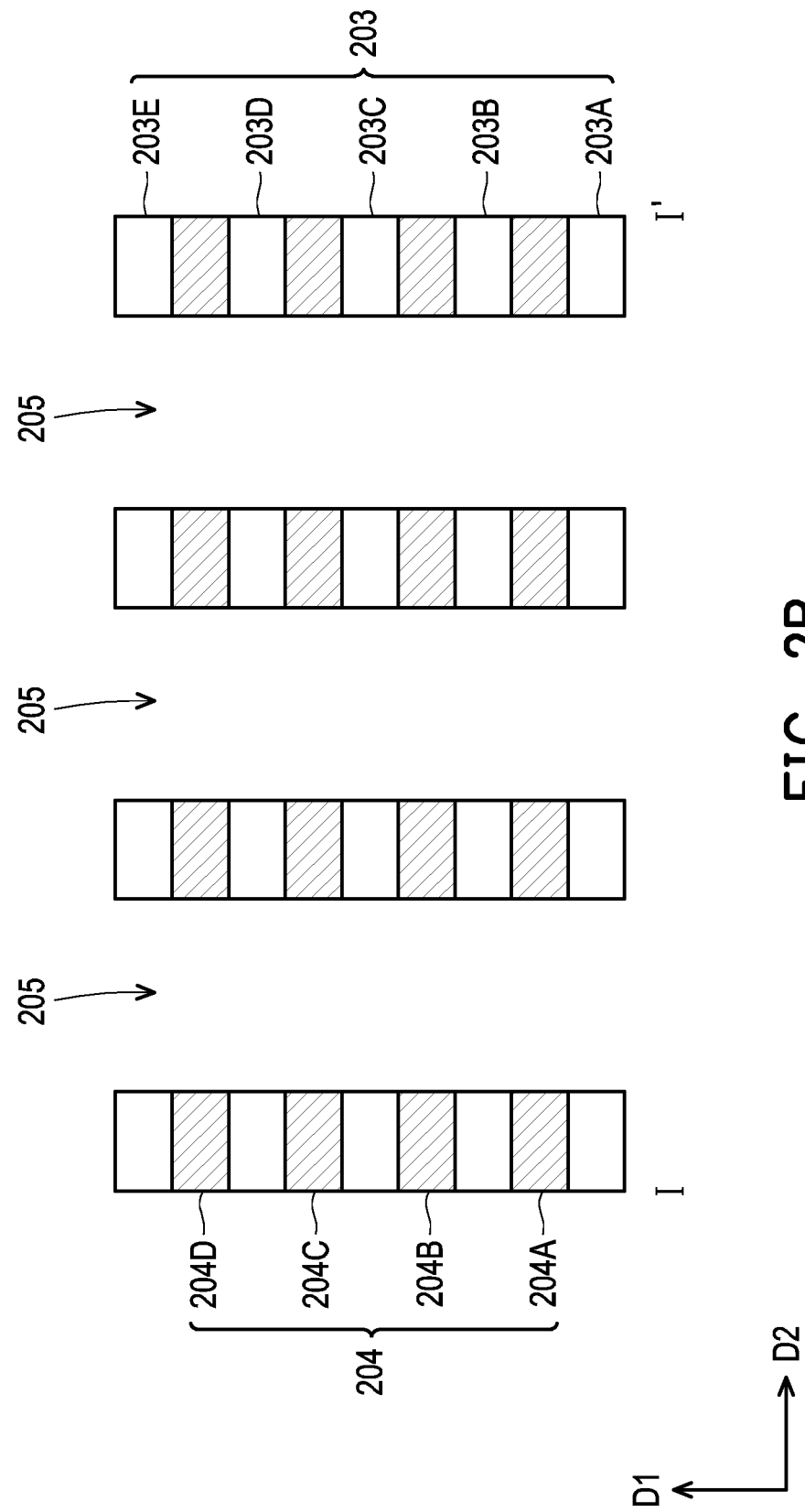
FIGS. 2B, 6B, 7B and 8B are illustrated along reference cross-section I-I' illustrated in FIGS. 2A, 6A, 7A and 8A, FIGS. 9B, 10B, 11B, 12B, 13B and 14B are illustrated along reference cross-section II-II' illustrated in FIGS. 9A, 10A, 11A, 12A, 13A and 14A, and FIGS. 15B, 16B, 17B, 18B, 19B and 20B are illustrated along reference cross-section III-III' illustrated in FIGS. 15A, 16A, 17A, 18A, 19A and 20A.

Referring to FIGS. 2A and 2B, a plurality of stacks 202 are formed. The stacks 202 may be formed on a dielectric structure 201 over a substrate (not shown), and the substrate may be part of the front-end level 12L as described in the previous embodiments. In such embodiments, it is understood that the substrate is not considered part of the 3D memory device. The dielectric structure 201 may be part of the dielectric layers 118 as described in the previous embodiments.

In some embodiments, the stack 202 is a strip-shaped staircase structure of multiple alternating dielectric layers 203A-203E (collectively referred to as dielectric layers 203) and conductive lines 204A-204D (collectively referred to as conductive lines 204 or conductive layers). In some embodiments, the dielectric layers 203A-203E and the conductive lines 204A-204D are stacked alternately along a stacking direction D1 (e.g., vertical direction or z-direction). In some embodiments, the stacks 202 are arranged along a direction D2 (e.g., x-direction) substantially perpendicular to the stacking direction D1. The conductive lines 204A-204D may function as word lines of the memory device. In FIG. 2A, four stacks 202 are shown and these stacks 202 are separated by trenches 205, but the number of the stacks 202 depends on the number of the trenches 205 and may vary depending on the layout design. The conductive lines 204A-204D may have a staircase configuration such that lower conductive lines 204A-204D are longer than and extend laterally past endpoints of upper conductive lines 204A-204D. The conductive lines 204A-204D are extended along an extending direction D3 (e.g., y-direction) respectively. For example, in FIG. 2A, multiple, stacked layers of conductive lines 204A-204D are illustrated with topmost conductive lines 204D being the shortest and bottommost conductive lines 204A being the longest. Respective lengths of the conductive lines 204A-204D may increase. In this manner, a portion of each of the conductive lines 204A-204D may be accessible.

The conductive line 204A-204D may each include two barrier layers (not shown) and a metal layer between the barrier layers. Specifically, a barrier layer is disposed between the metal layer and the adjacent dielectric layer 203A-203E. The barrier layers may prevent the metal layer from diffusion to the adjacent dielectric layers 203A-203E. The barrier layers may also provide the function of increasing the adhesion between the metal layer and the adjacent dielectric layers 203A-203E, and may be referred to as glue layers in some examples. In some embodiments, both barrier layers and glue layers with different materials are provided as needed. The barrier layers are formed of a first conductive material, such as a metal nitride, including titanium nitride, tantalum nitride, molybdenum nitride, zirconium nitride, hafnium nitride, or the like. The metal layer may be formed of a second conductive material, such as a metal, including tungsten, ruthenium, molybdenum, cobalt, aluminum, nickel, copper, silver, gold, alloys thereof, or the like. The barrier layers and metal layer may each be formed by an acceptable deposition process such as CVD, PVD, ALD, PECVD, or the like. In some embodiments, the dielectric layers 203A-203E are formed by any compatible formation method, such as CVD, PVD, ALD, or the like. In FIG. 2A, the stack 202 includes five layers of the dielectric layers 203A-203E and four layers of the conductive lines 204A-204D. It is comprehended that the number of the dielectric layers 203A-203E and the number of the conductive lines 204A-204D may be any suitable number and may be adjusted based on product design.

In some embodiments, the material of the dielectric structure 201 is different from the materials of the dielectric layers 203A-203E, and the dielectric structure 201 functions as an etch stop layer to provide etching selectivity for subsequent etching processes. In such embodiments, the material of the dielectric structure includes silicon carbide (SiC), silicon carbonitride, metal oxides such as aluminum oxide, or titanium oxide, metal nitrides such as aluminum nitride, titanium nitride, or the combination thereof.

In some embodiments, the stacks 202 are covered by a dielectric material 206. The dielectric material 206 may be formed by suitable method, such as CVD, PECVD, flowable CVD (FCVD), or the like. The dielectric material 206 may include phospho-silicate glass (PSG), boro-silicate glass (BSG), boron-doped phospho-silicate glass (BPSG), undoped silicate glass (USG), or the like. In some embodiments, the dielectric material 206 includes an oxide (e.g., silicon oxide or the like), a nitride (e.g., silicon nitride or the like), a combination thereof or the like. Other dielectric materials formed by any acceptable process may be used.

Figure 3:
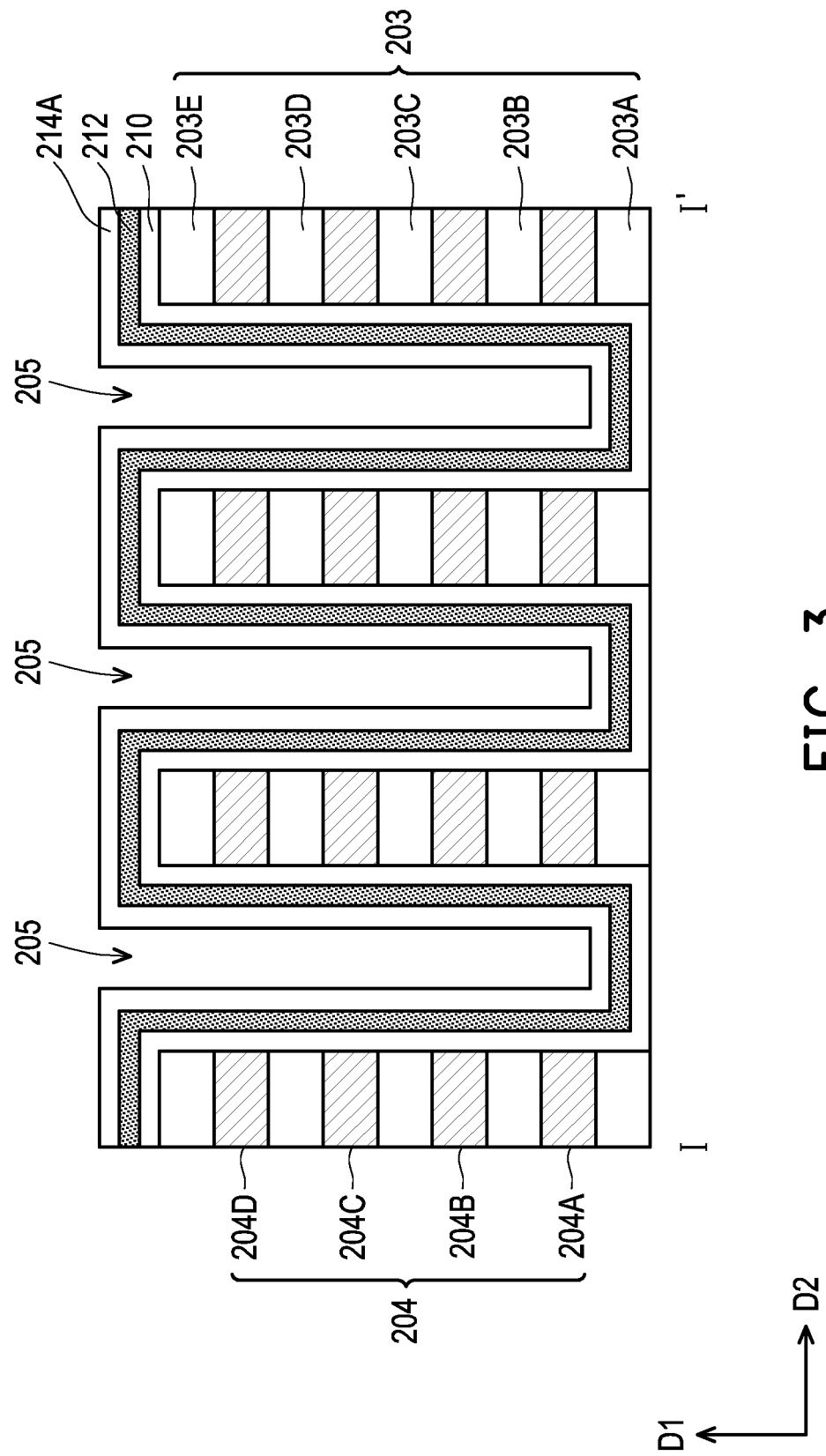

Referring to FIG. 3, a memory material layer 210, a channel layer 212, and a dielectric material 214A are deposited in the trenches 205. In some embodiments, the memory material layer 210 is deposited conformally in the trenches 205 along sidewalls of the conductive lines 204A-204D and the dielectric layers 203A-203E, along top surfaces of the topmost dielectric layer 203E, and along the bottom surfaces of the trenches 205. The memory material layer 210 may include materials that are capable of switching between two different polarization directions by applying an appropriate voltage differential across the memory material layer 210. For example, the memory material layer 210 includes a high-k dielectric material, such as a hafnium (Hf) based dielectric materials or the like. In some embodiments, the memory material layer 210 includes hafnium oxide, hafnium zirconium oxide, silicon-doped hafnium oxide, or the like.

The memory material layer 210 may include barium titanium oxide ($BaTiO_3$), lead titanium oxide ($PbTiO_3$), lead zirconium oxide ($PbZrO_3$), lithium niobium oxide ($LiNbO_3$), sodium niobium oxide ($NaNbO_3$), potassium niobium oxide ($KNbO_3$), potassium tantalum oxide ($KTaO_3$), bismuth scandium oxide ($BiScO_3$), bismuth iron oxide ($BiFeO_3$), hafnium erbium oxide ($Hf_{1-x}Er_xO$, hafnium lanthanum oxide ($Hf_{1-x}La_xO$), hafnium yttrium oxide ($Hf_{1-x}Y_xO$), hafnium gadolinium oxide ($Hf_{1-x}Gd_xO$), hafnium aluminum oxide ($Hf_{1-x}Al_xO$), hafnium zirconium oxide ($Hf_{1-x}Zr_xO$, HZO), hafnium titanium oxide ($Hf_{1-x}Ti_xO$), hafnium tantalum oxide ($Hf_{1-x}Ta_xO$), or the like. In some embodiments, the memory material layer 210 may include different ferroelectric materials or different types of memory materials. For example, the memory material layer 210 is replaced with a non-ferroelectric material, such as a multi-layer memory structure including a layer of SiNX between two $SiO_x$ layers (e.g., an ONO structure). In some embodiments, the method of forming the memory material layer 210 includes performing a suitable deposition technique, such as CVD, PECVD, metal oxide chemical vapor deposition (MOCVD), ALD, RPALD, PEALD, MBD or the like.

In some embodiments, the memory material layer 210 has a thickness of about 1-20 nm, such as 5-10 nm. Other thickness ranges (e.g., more than 20 nm or 5-15 nm) may be applicable. In some embodiments, the memory material layer 210 is formed in a fully amorphous state. In alternative embodiments, the memory material layer 210 is formed in a partially crystalline state; that is, the memory material layer 210 is formed in a mixed crystalline-amorphous state and having some degree of structural order. In alternative embodiments, the memory material layer 210 is formed in a fully crystalline state. In some embodiments, the memory material layer 210 is a single layer. In alternative embodiments, the memory material layer 210 is a multi-layer structure.

After the memory material layer 210 is deposited, an annealing step may be performed, so as to achieve a desired crystalline lattice structure for the memory material layer 210. In some embodiments, upon the annealing process, the memory material layer 210 is transformed from an amorphous state to a partially or fully crystalline sate. In alternative embodiments, upon the annealing, the memory material layer 210 is transformed from a partially crystalline state to a fully crystalline sate.

Then, the channel layer 212 is conformally deposited in the trenches 205 over the memory material layer 210. The channel layer 212 includes materials suitable for providing channel regions for the memory cells. For example, the channel layer 212 includes oxide semiconductor (OS) such as zinc oxide (ZnO), indium tungsten oxide (InWO), indium gallium zinc oxide (InGaZnO, IGZO), indium zinc oxide (InZnO), indium tin oxide (ITO), combinations thereof, or the like. In some embodiments, the channel layer 212 includes polycrystalline silicon (poly-Si), amorphous silicon (a-Si), or the like. The channel layer 212 may be deposited by CVD, PVD, ALD, PECVD, or the like. The channel layer 212 may extend along the sidewalls and the bottom surfaces of the trenches 205 over the memory material layer 210. After the channel layer 212 is deposited, an annealing step may be performed to activate the charge carriers of the channel layer 212.

In some embodiments, the dielectric material 214A is deposited in the trenches 205 over the channel layer 212. In some embodiments, the dielectric material 214A includes silicon oxide, silicon nitride, silicon oxynitride, or the like, which may be deposited by CVD, PVD, ALD, PECVD, or the like. The dielectric material 214A may extend along sidewalls and bottom surfaces of the trenches 205 over the channel layer 212. In some embodiments, the dielectric material 214A is optional and may be omitted as needed.

Figure 4:
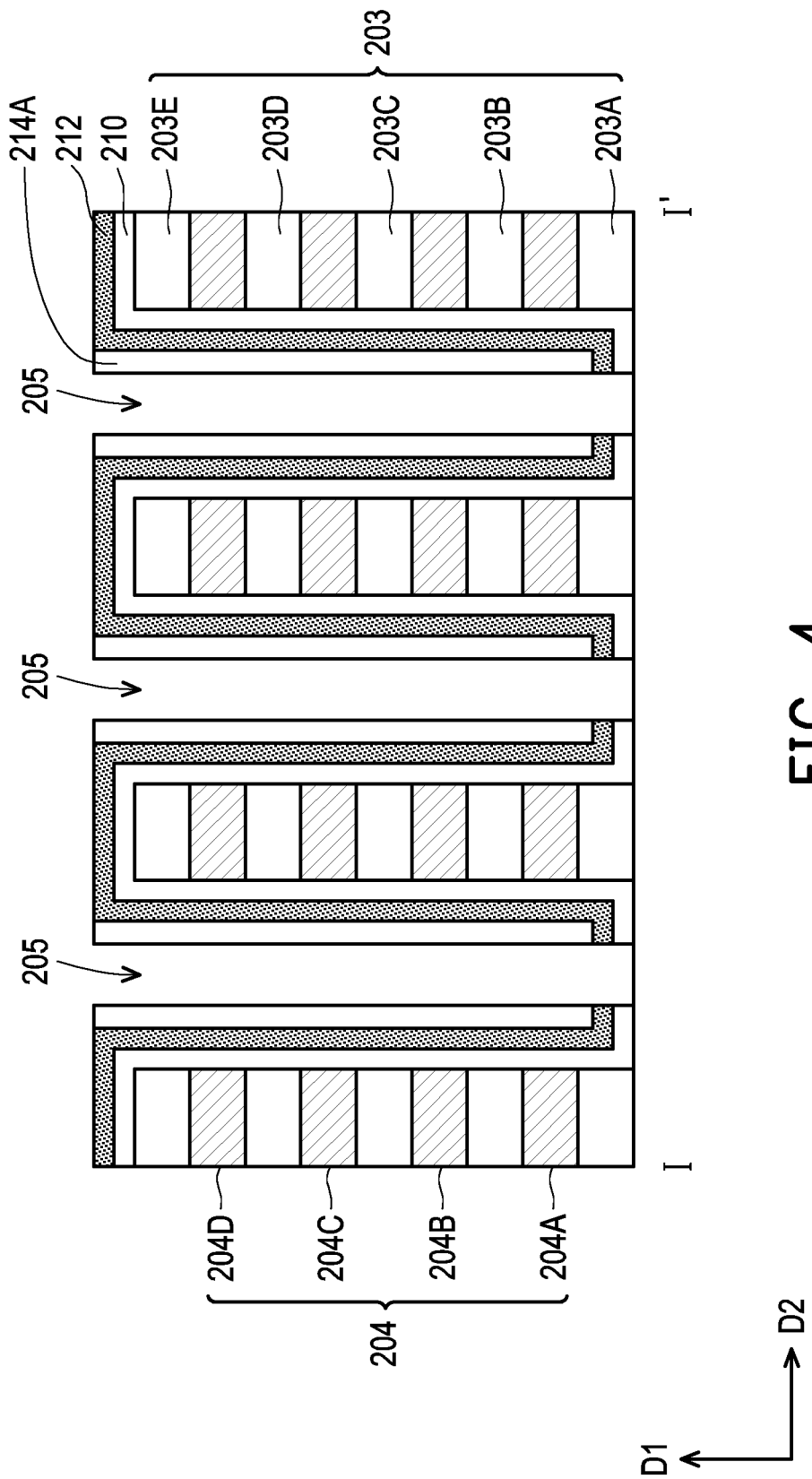

Referring to FIG. 4, bottom portions of the dielectric material 214A, the channel layer 212 and the memory material layer 210 are removed in the trenches 205. In some embodiments, upper portions of the dielectric material 214A above the channel layer 212 are also removed. The removal process includes an acceptable etching process, such as a dry etch (e.g., RIE, NBE, the like), a wet etch, the like, or a combination thereof. The etching may be anisotropic. In some embodiments, portions of the channel layer 212 on opposing sidewalls of the trenches 205 may be separated from each other, which improves isolation between the memory cells of the memory device. In some embodiments, upper portions of the channel layer 212 on the memory material layer 210 are exposed.

Figure 5:
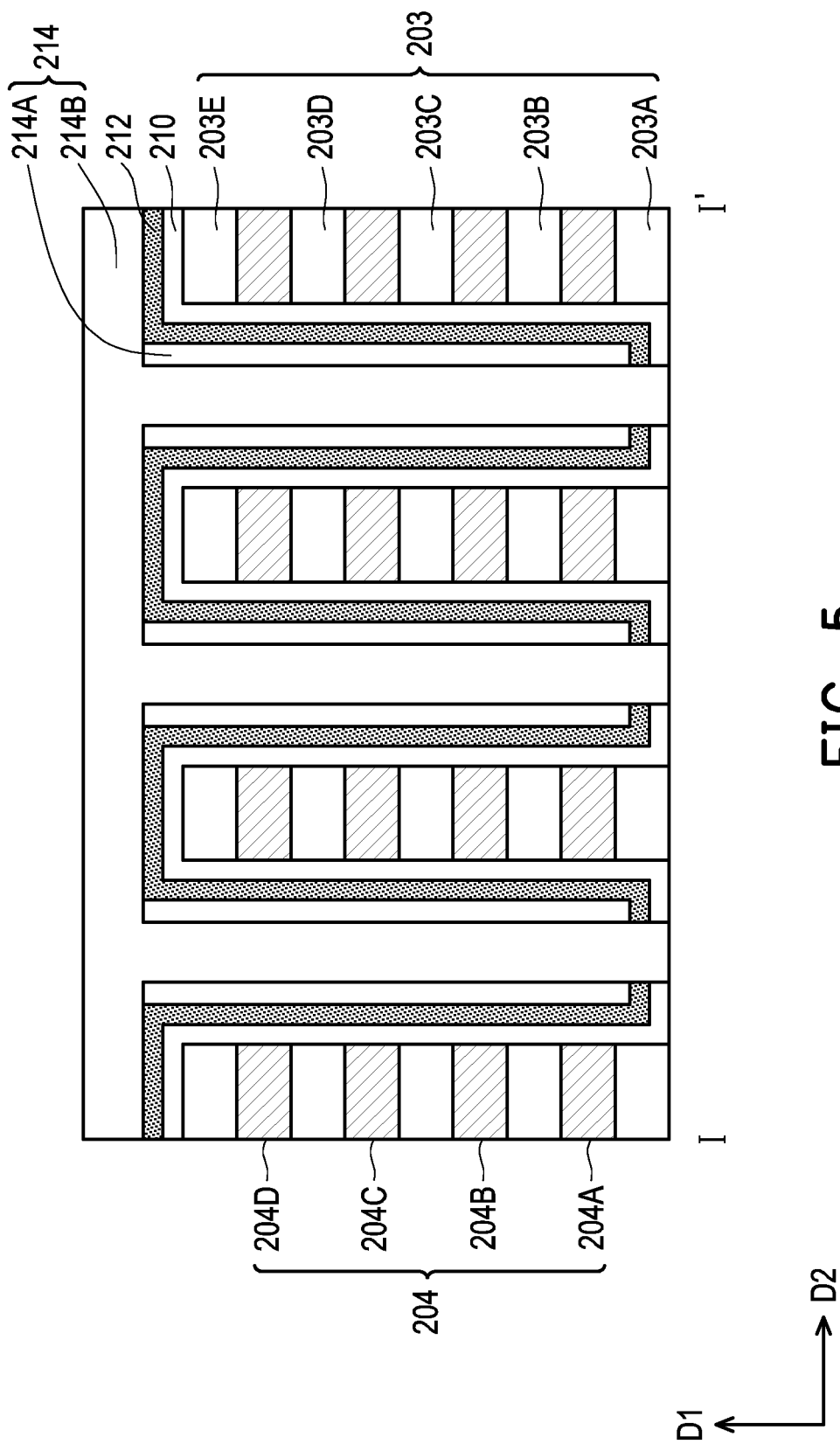

Referring to FIG. 5, a dielectric material 214B is deposited to completely fill the trenches 205. The dielectric material 214B may be formed of one or more materials and by processes the same as or similar to those of the dielectric material 214A. In some embodiments, a material of the dielectric material 214B is different from a material of the dielectric material 214A.

Figure 6A:
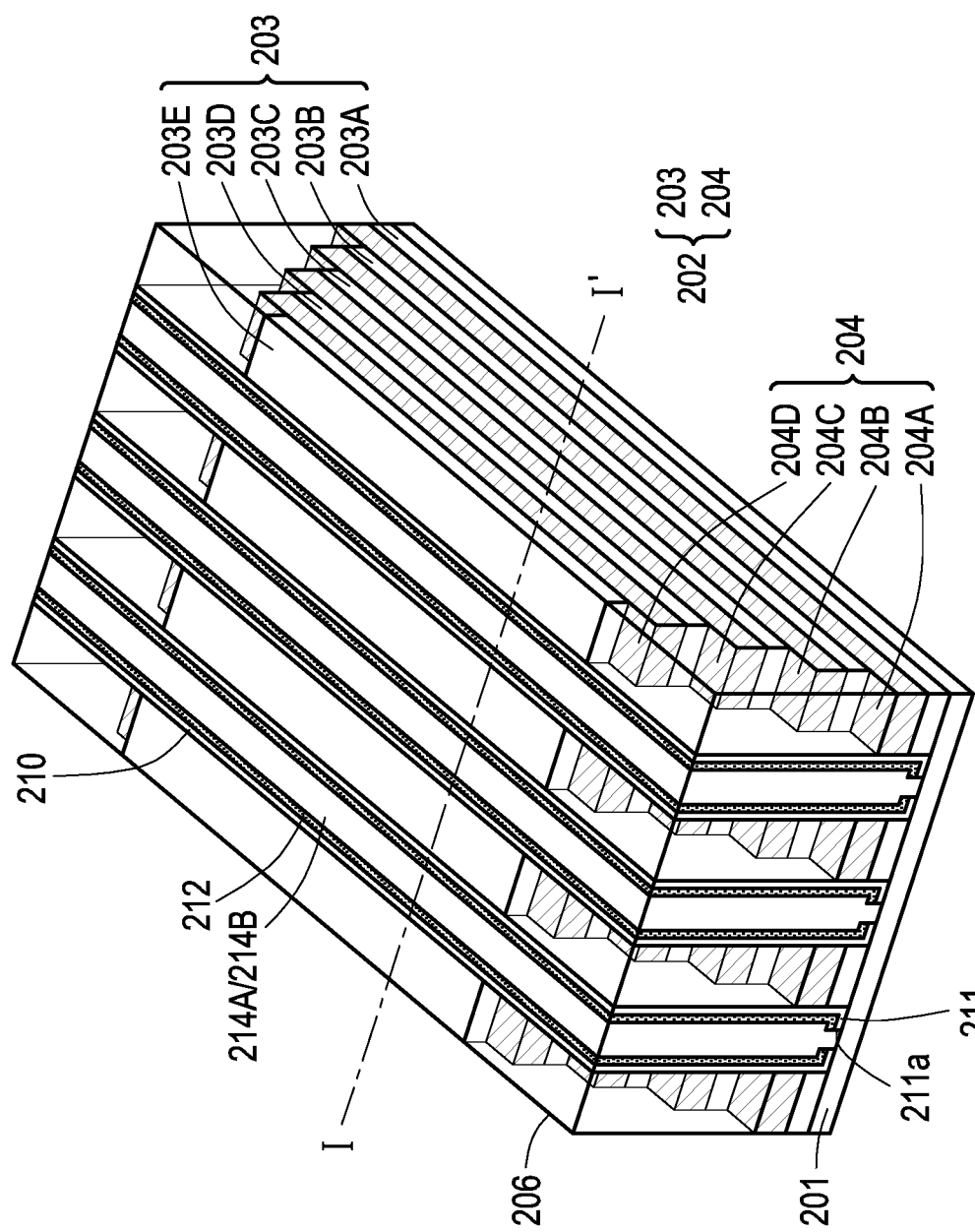
Figure 6B:
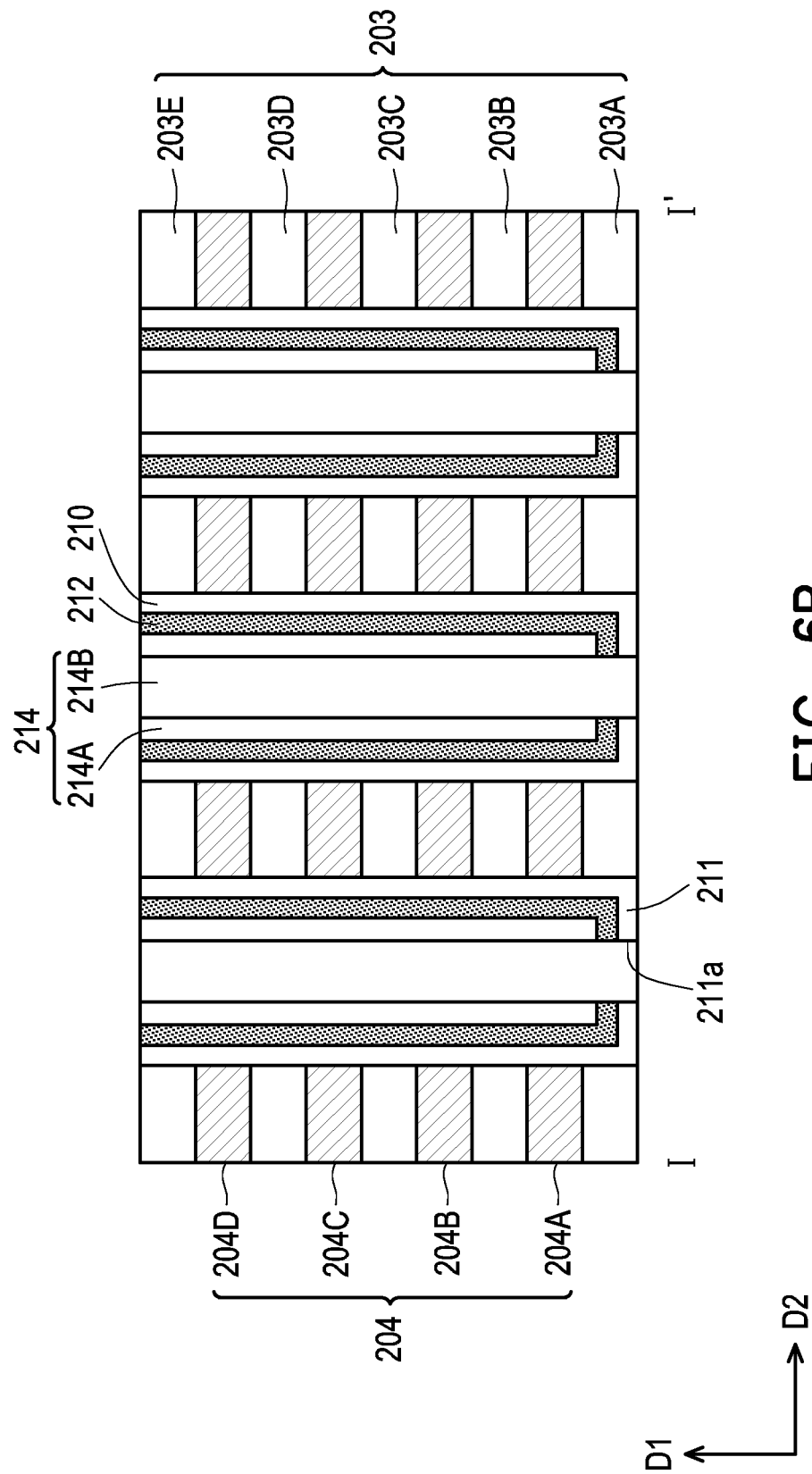

Referring to FIGS. 6A and 6B, a removal process is applied to the dielectric materials 214A/214B (collectively referred to as dielectric materials 214), the channel layer 212, and the memory material layer 210 to remove excess materials over the stacks 202. In some embodiments, a planarization process such as a CMP, an etch-back process, combinations thereof, or the like may be utilized. The planarization process exposes the stacks 202 such that top surfaces of the stacks 202 (e.g., the dielectric layers 203E), the memory material layer 210, the channel layer 212, the dielectric materials 214, and the dielectric material 206 are level after the planarization process is complete. In some embodiments, as shown in FIGS. 6A and 6B, a bottom 211 of the resulting memory material layer 210 may have an opening 211a for electrical connection to lower elements (such as a conductive contact 252B of FIG. 21A). However, the disclosure is not limited thereto.

Figure 7A:
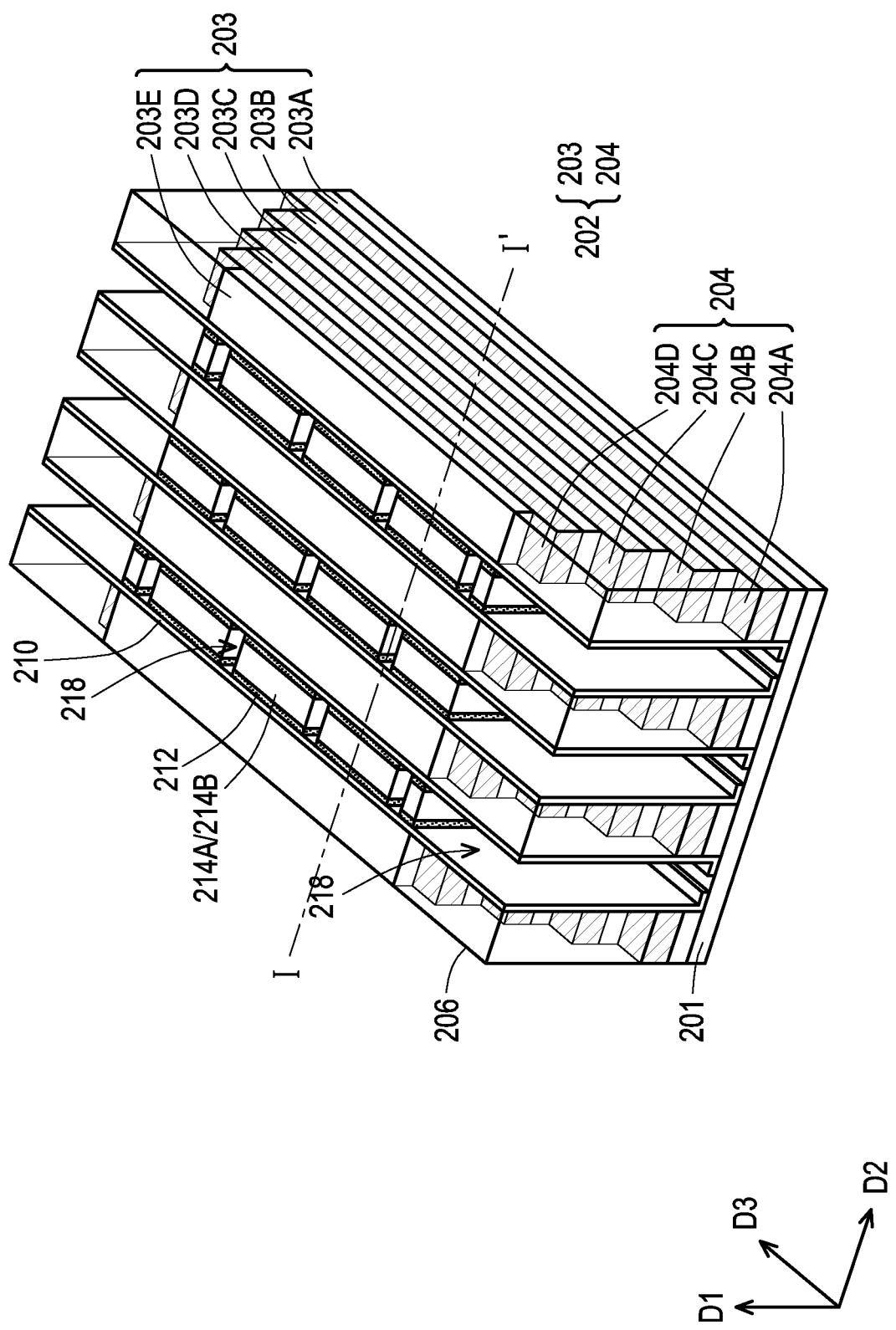
Figure 7B:
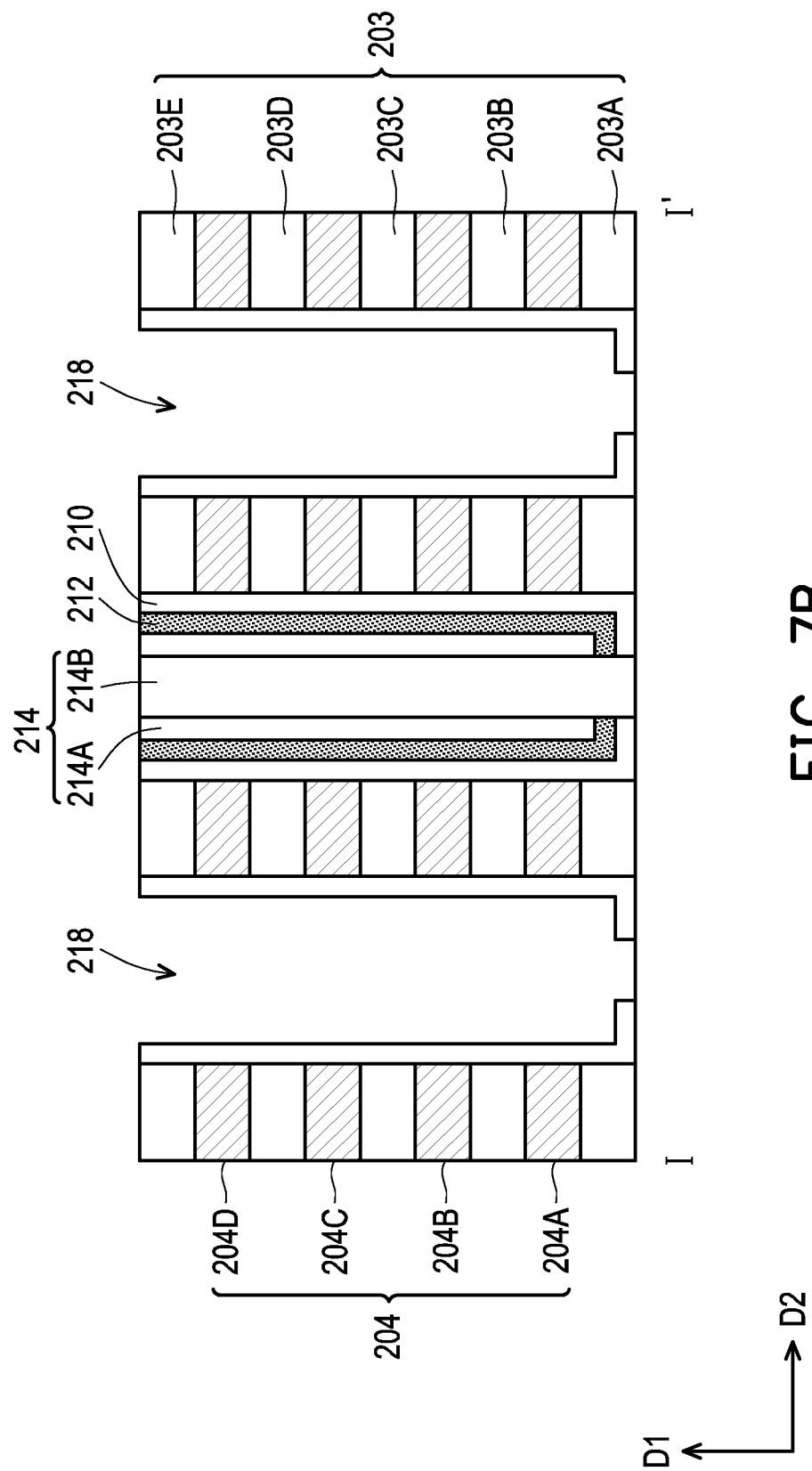

Referring to FIGS. 7A and 7B, trenches 218 are patterned through the channel layer 212 and the dielectric materials 214. Patterning the trenches 218 may be performed through a combination of photolithography and etching, for example. The trenches 218 may be disposed between opposing sidewalls of the memory material layer 210, and the trenches 218 may physically separate adjacent stacks 202.

As illustrated in FIG. 7A, the trenches 218 may be formed in peripheral areas adjacent to the dielectric material 206 by patterning the dielectric materials 214 and the channel layer 212. Dielectric materials (such as the dielectric materials 220, discussed below with respect to FIGS. 8A and 8B) may be subsequently formed in the trenches 218 in the peripheral areas adjacent to the dielectric material 206 and the dielectric materials may be subsequently patterned to form conductive contacts (such as conductive contacts 254, discussed below with respect to FIGS. 21A and 21B) to underlying structures, such as the interconnect structures.

Figure 8A:
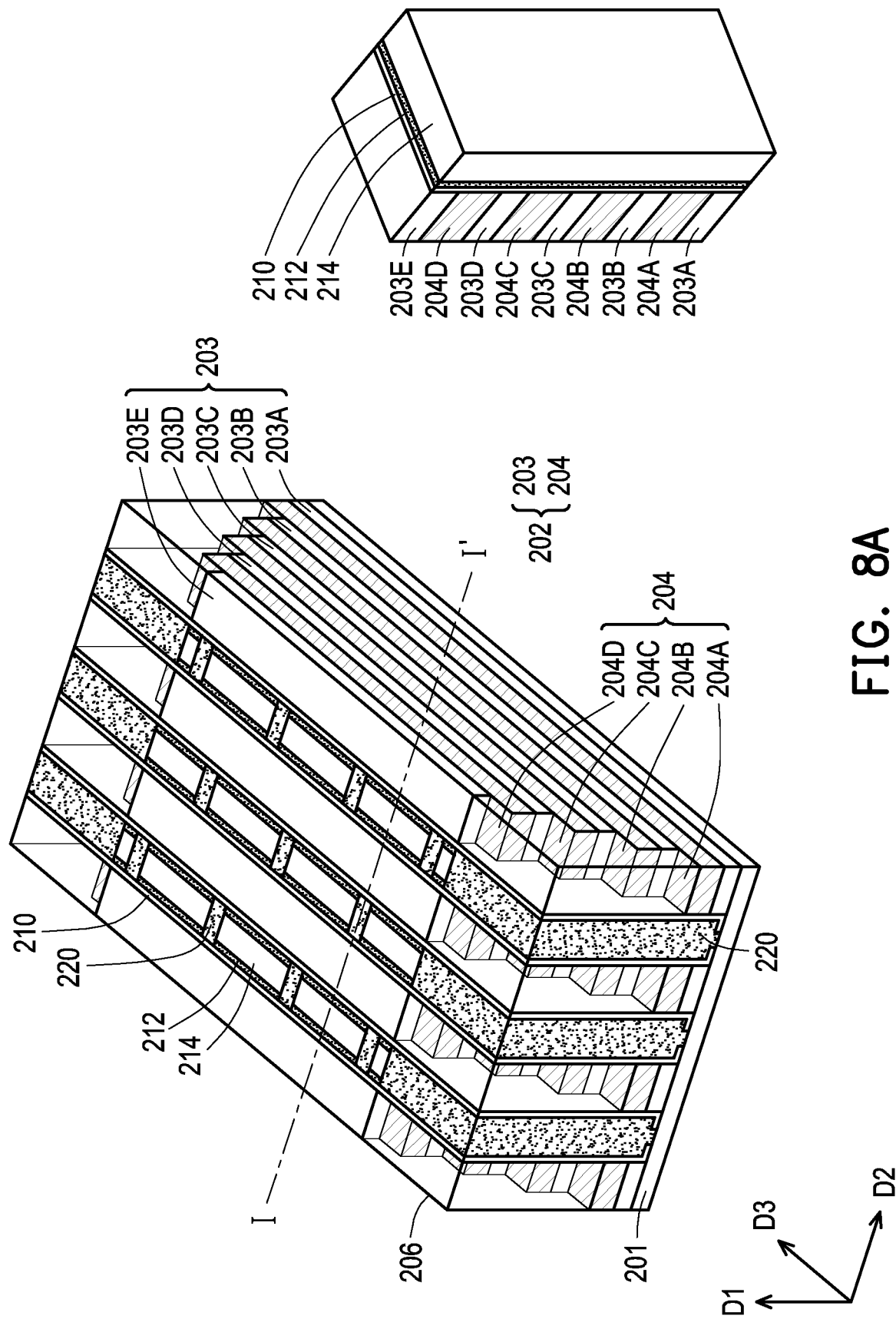
Figure 8B:
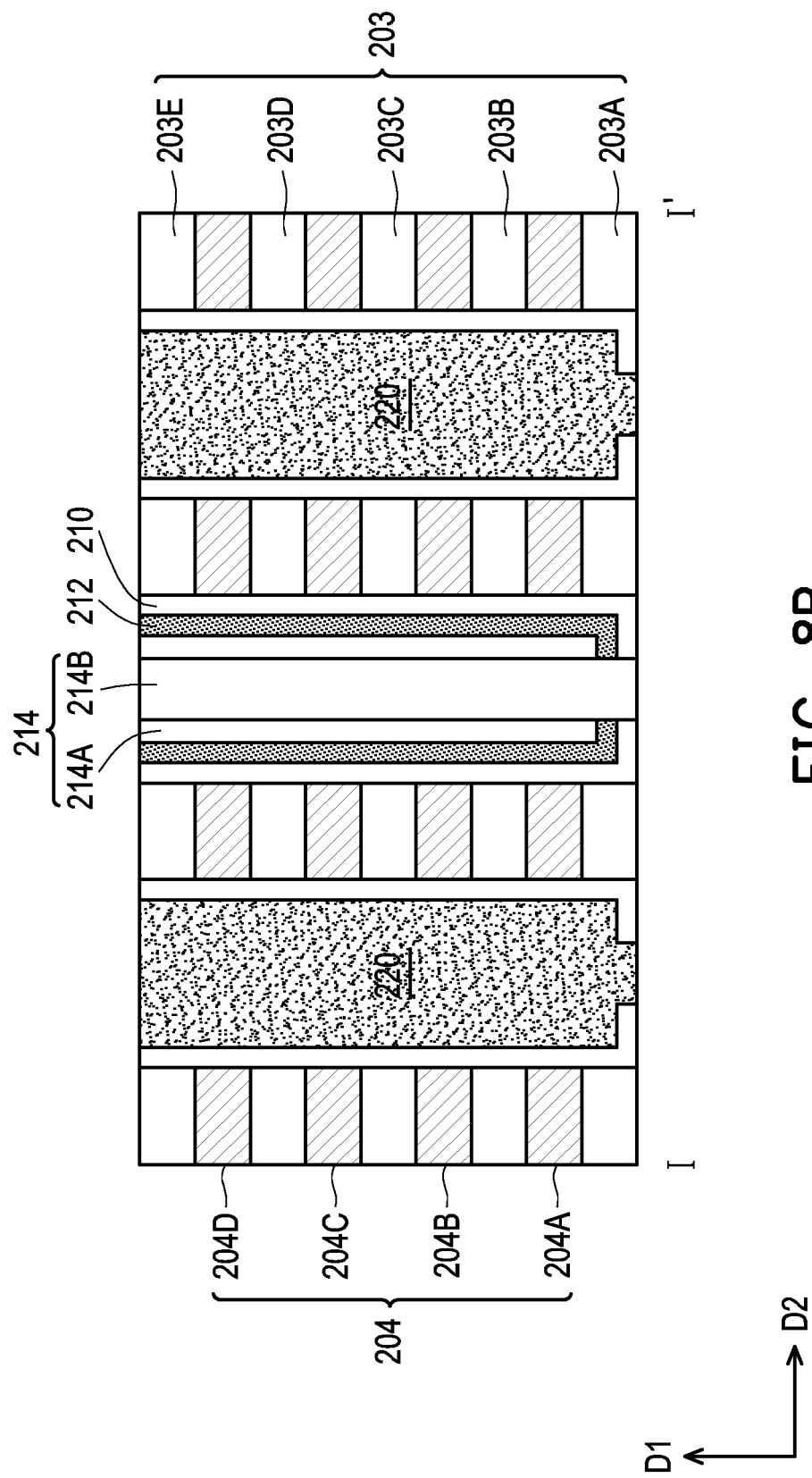

Referring to FIGS. 8A and 8B, dielectric materials 220 are formed in the trenches 218. In some embodiments, dielectric materials are deposited over the stacks 202 to fill the trenches 218. The dielectric material may include, for example, silicon oxide, silicon nitride, silicon oxynitride, or the like, which may be deposited by CVD, PVD, ALD, PECVD, or the like. The dielectric materials may extend along sidewalls and bottom surfaces of the trenches 218 over the channel layer 212. After deposition, a planarization process (e.g., a CMP, etch back, or the like) may be performed to remove excess portions of the dielectric materials. In the resulting structure, top surfaces of the stacks 202 (e.g., dielectric layers 203E), the memory material layer 210, the channel layer 212, and the dielectric materials 220 may be substantially level (e.g., within process variations). In some embodiments, materials of the dielectric materials 214 and the dielectric materials 220 may be selected so that they may be etched selectively relative each other. For example, in some embodiments, the dielectric materials 214 include oxide and the dielectric materials 220 include nitride. In some embodiments, the dielectric materials 214 include nitride and the dielectric materials 220 include oxide. Other materials are also possible.

Figure 9A:
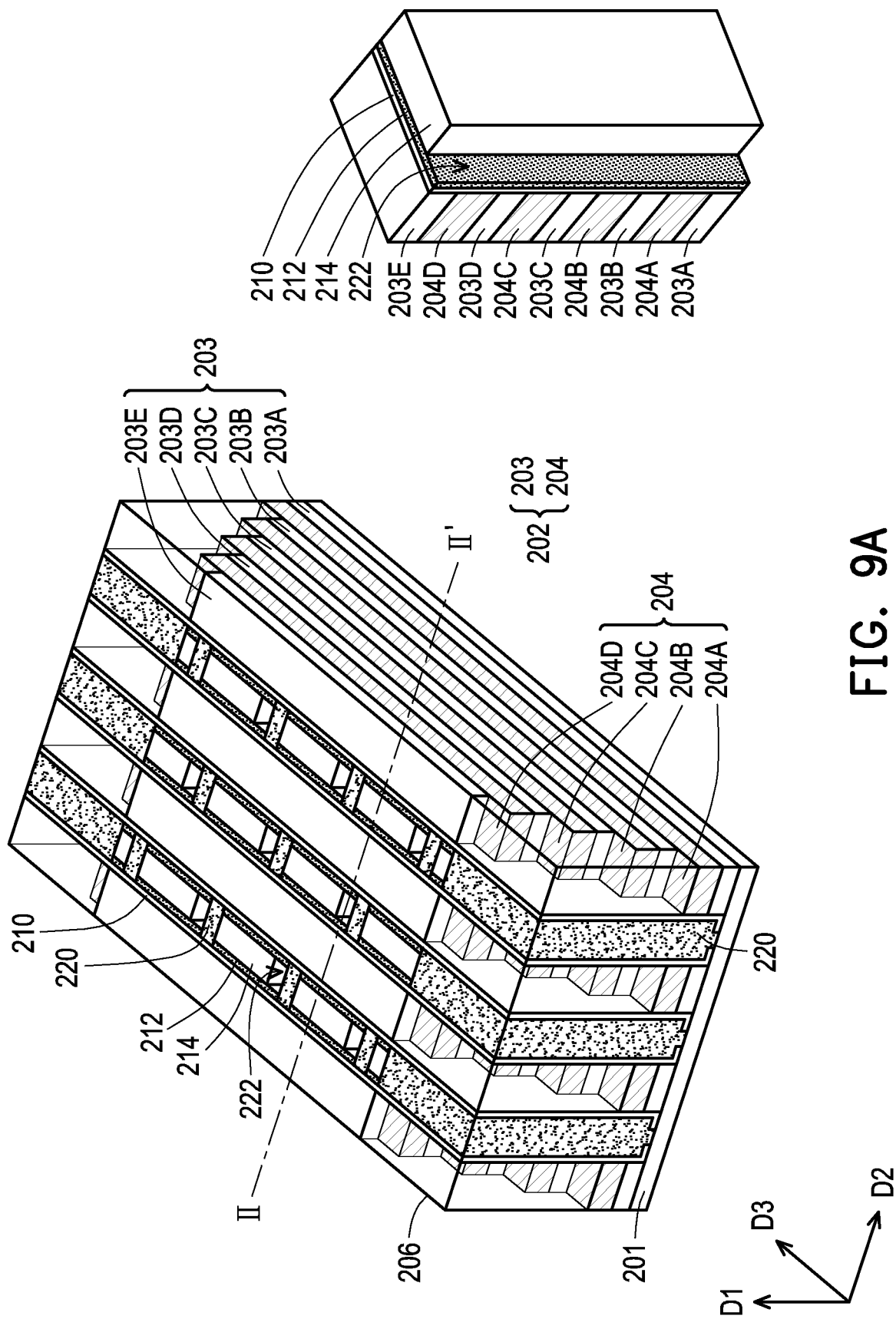
Figure 9B:
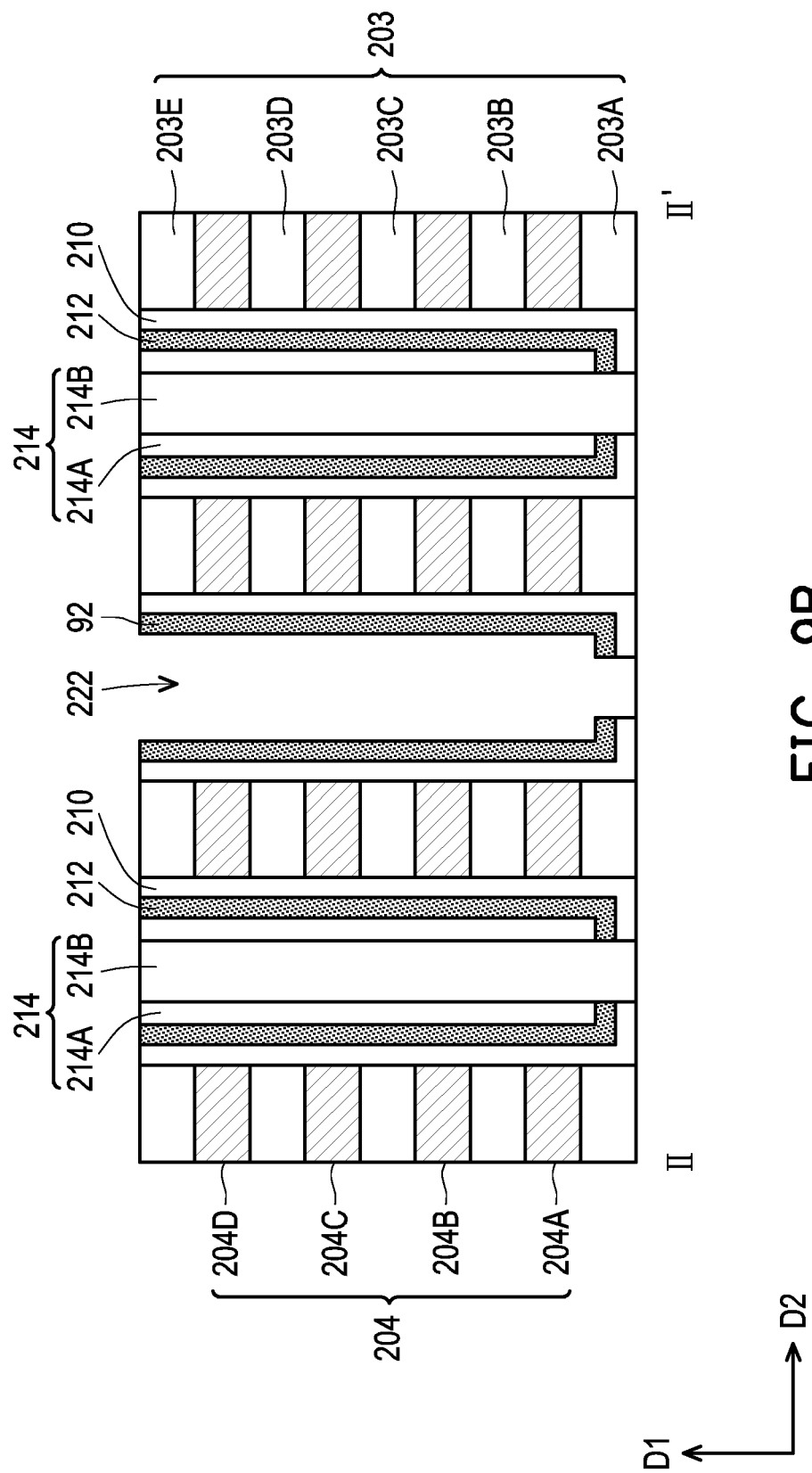

Referring to FIGS. 9A and 9B, trenches 222 are defined for the subsequently formed conductive pillars 224 (discussed below with respect to FIGS. 10A and 10B). The trenches 222 are formed by patterning the dielectric materials 214 with a combination of photolithography and etching, for example. In some embodiments, a photoresist (not shown) is formed over the stacks 202, the dielectric materials 214, the dielectric materials 220, the channel layer 212, and the memory material layer 210. In some embodiments, the photoresist is patterned by an acceptable photolithography technique to define openings (not shown). Each of the openings may expose a first side (i.e., first region) of the dielectric material 214 beside the dielectric material 220. In this way, each of the openings may define a pattern of the conductive pillar 224 adjacent to the dielectric material 220.

Subsequently, portions of the dielectric materials 214 exposed by the openings may be removed by an acceptable etching process, such as by a dry etch (e.g., RIE, NBE, the like), a wet etch, the like, or a combination thereof. The etching may be anisotropic. The etching process may use an etchant that etches the dielectric materials 214 without significantly etching the dielectric materials 220. As a result, even though the openings expose the dielectric materials 220, the dielectric materials 220 may not be significantly removed. Patterns of the trenches 222 may correspond to the conductive pillars 224. After the trenches 222 are patterned, the photoresist may be removed by ashing, for example. In some embodiments, as shown in FIG. 9A, a portion of the channel layer 212 is exposed by the trench 222.

Figure 10A:
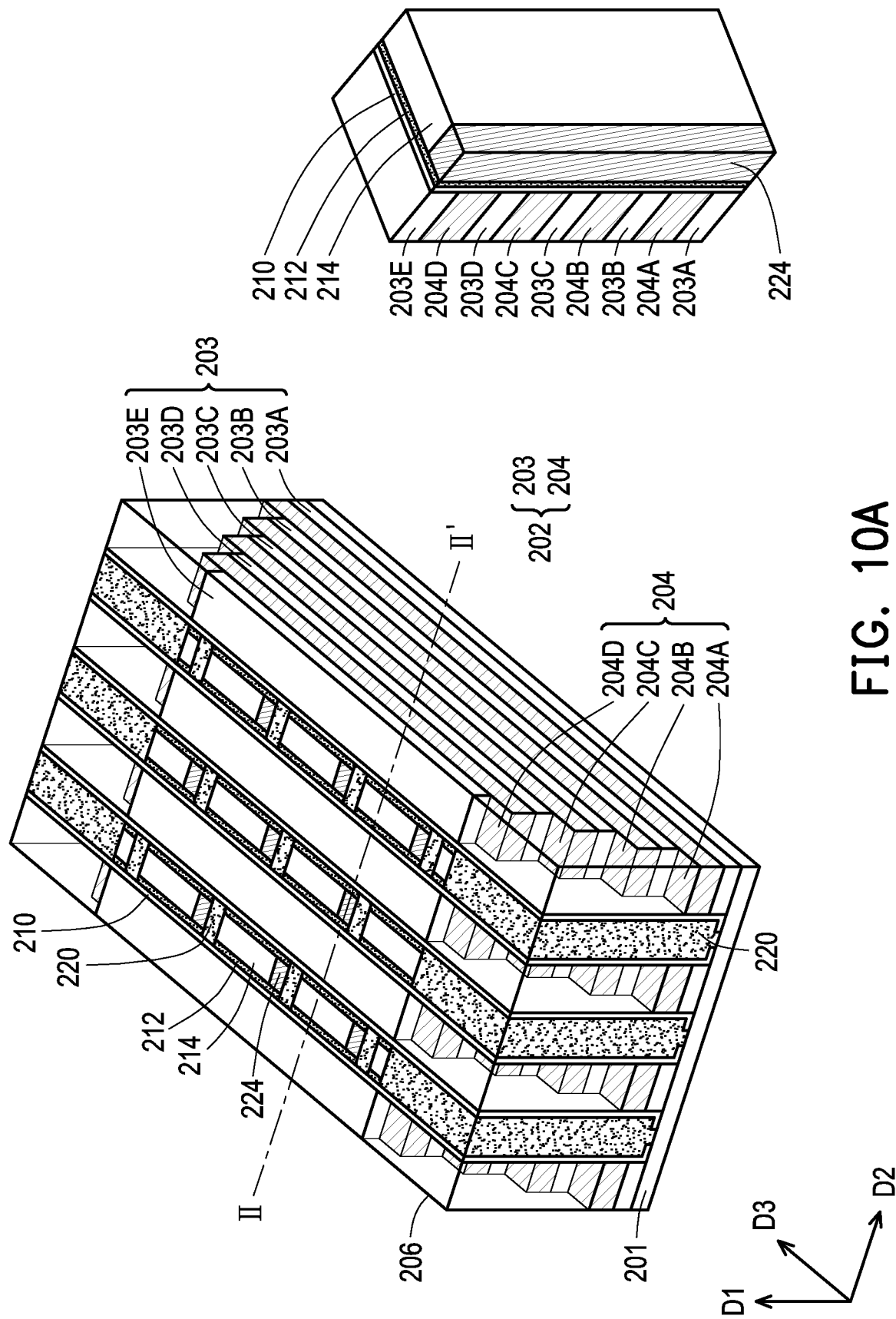
Figure 10B:
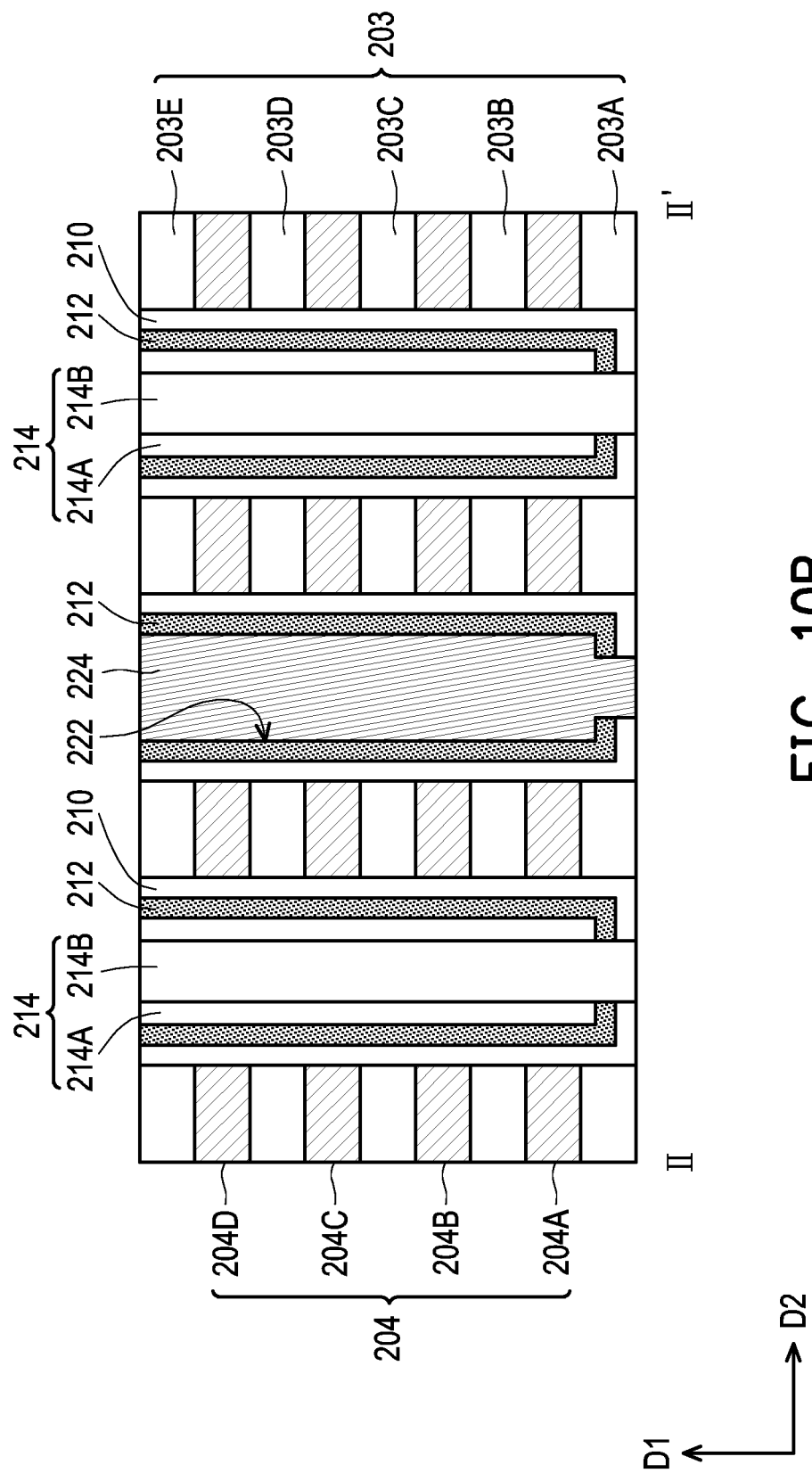

Referring to FIGS. 10A and 10B, the trenches 222 are filled with a conductive material to form the conductive pillars 224. The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 224. In the resulting structure, top surfaces of the stacks 202 (e.g., the dielectric layers 203E), the memory material layer 210, the channel layer 212 and the conductive pillars 224 may be substantially level (e.g., within process variations).

Figure 11A:
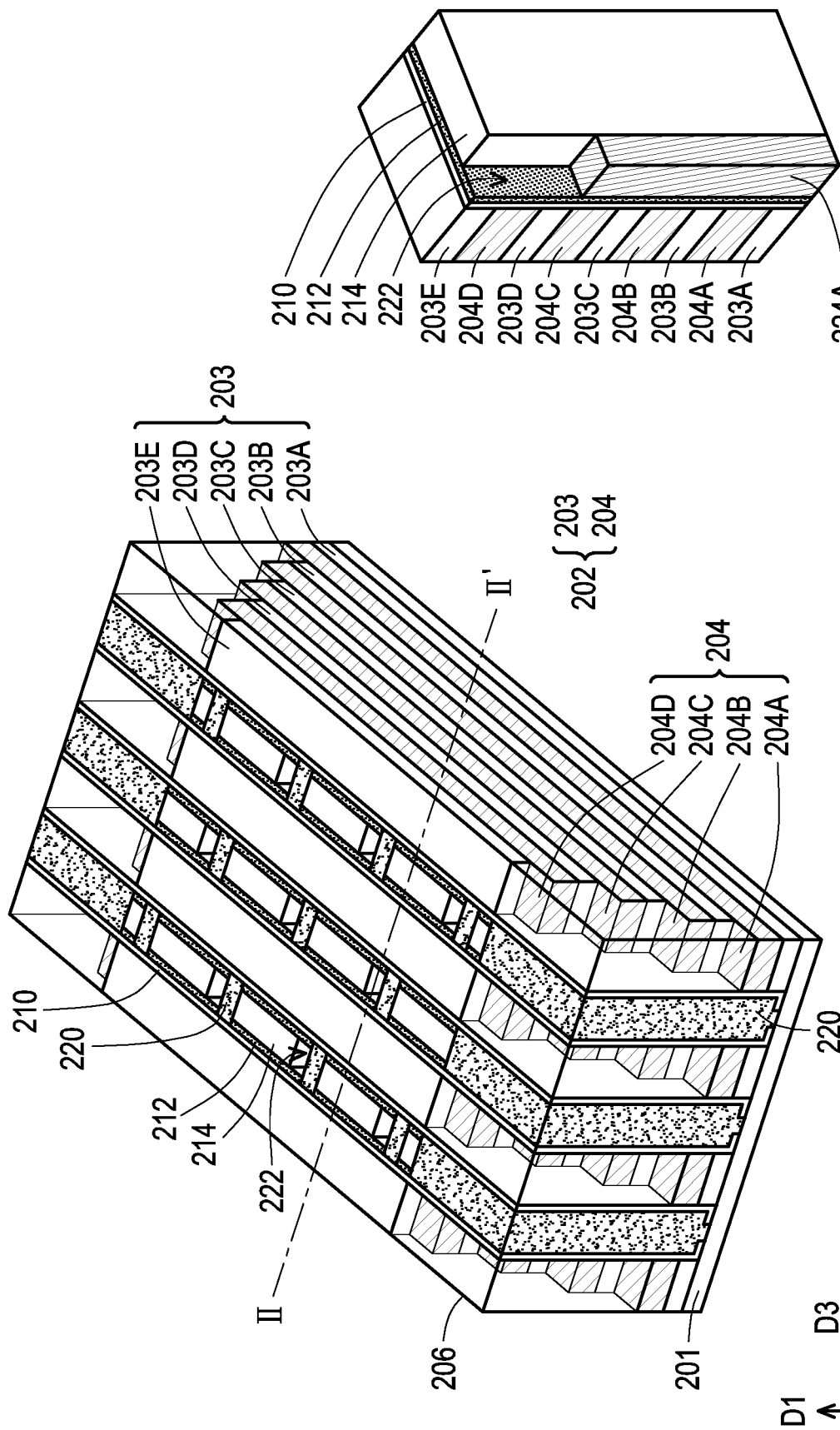
Figure 11B:
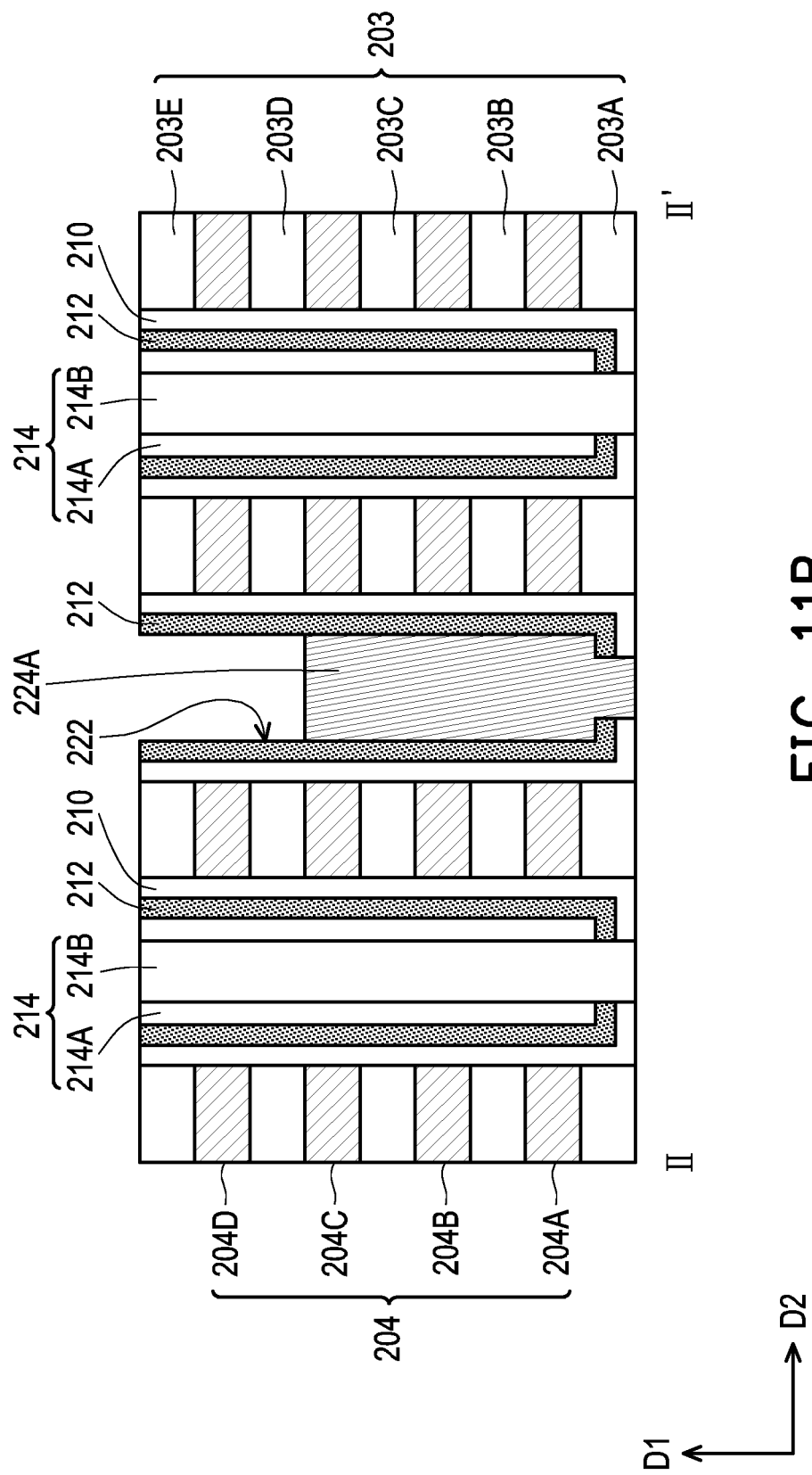

Referring to FIGS. 11A and 11B, portions of the conductive pillars 224 are removed, to form the conductive pillars 224A. The portions of the conductive pillars 224 may be removed by an acceptable etching process, such as by a dry etch (e.g., RIE, NBE, the like), a wet etch, an etch back, the like, or a combination thereof. The etching may be anisotropic. In some embodiments, top portions of the conductive pillars 224 are removed to expose the trenches 222, and the removed amount of the top portions of the conductive pillars 224 may be substantially the same. In other words, top surfaces of the remained conductive pillars 224 (i.e., the conductive pillars 224A) may be substantially level (e.g., within process variations) with each other. However, the disclosure is not limited thereto. In some embodiments, the conductive pillar 224A is not overlapped with the topmost conductive line 204D in the direction D2 (e.g., horizontal direction or x-direction) which is substantially perpendicular to the stacking direction D1. The conductive pillar 224A may be disposed beneath the topmost conductive line 204D. For example, the top surface of the conductive pillar 224A is lower than a bottom surface of the topmost conductive line 204D. The conductive pillar 224A may be disposed aside the conductive line 204C immediately beneath the topmost conductive line 204D. In some embodiments, the top surface of the conductive pillar 224A is substantially level (e.g., within process variations) with the top surface of the conductive line 204C. However, the disclosure is not limited thereto. The conductive pillars 224A may be at any height depended on the requirements.

Figure 12A:
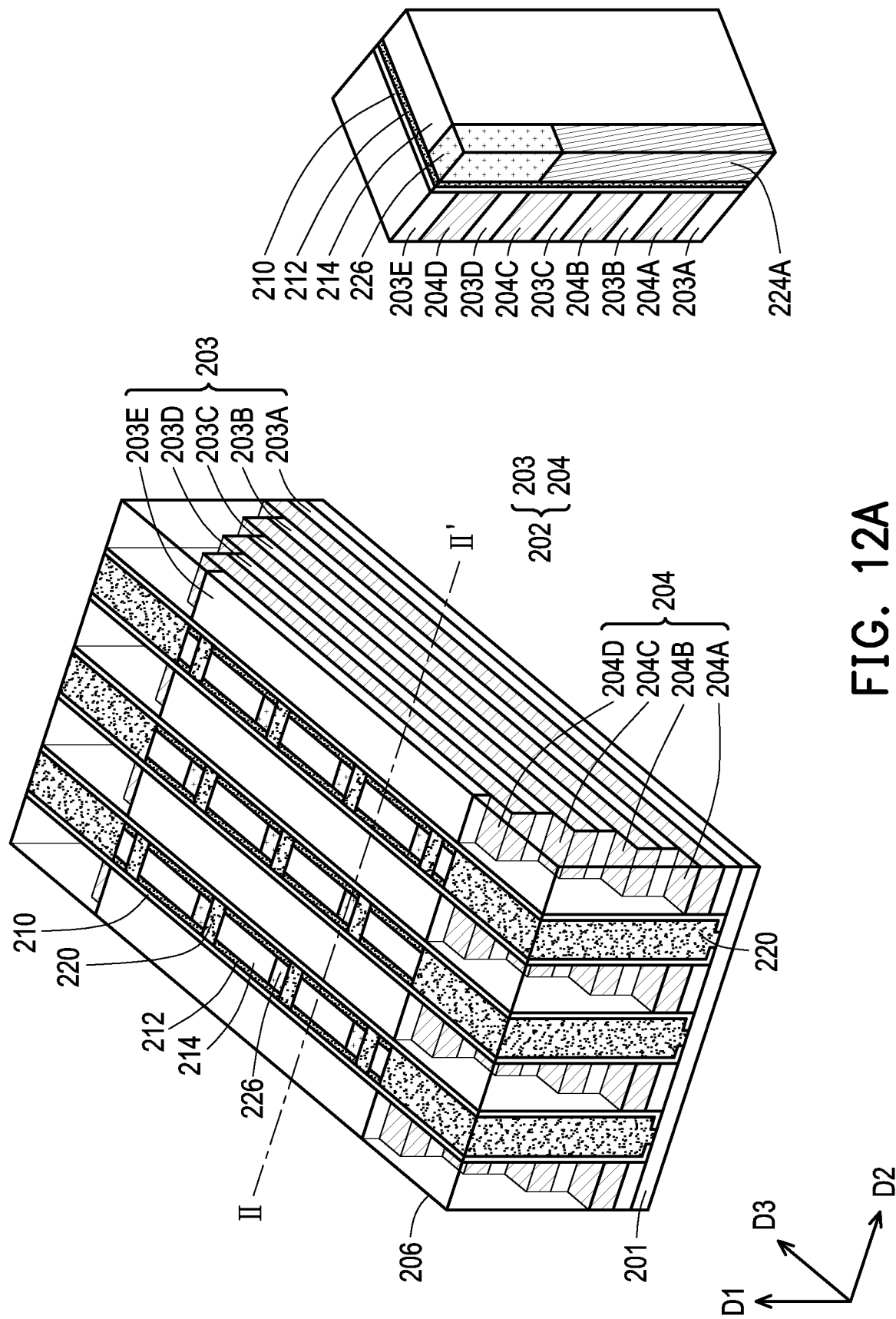
Figure 12B:
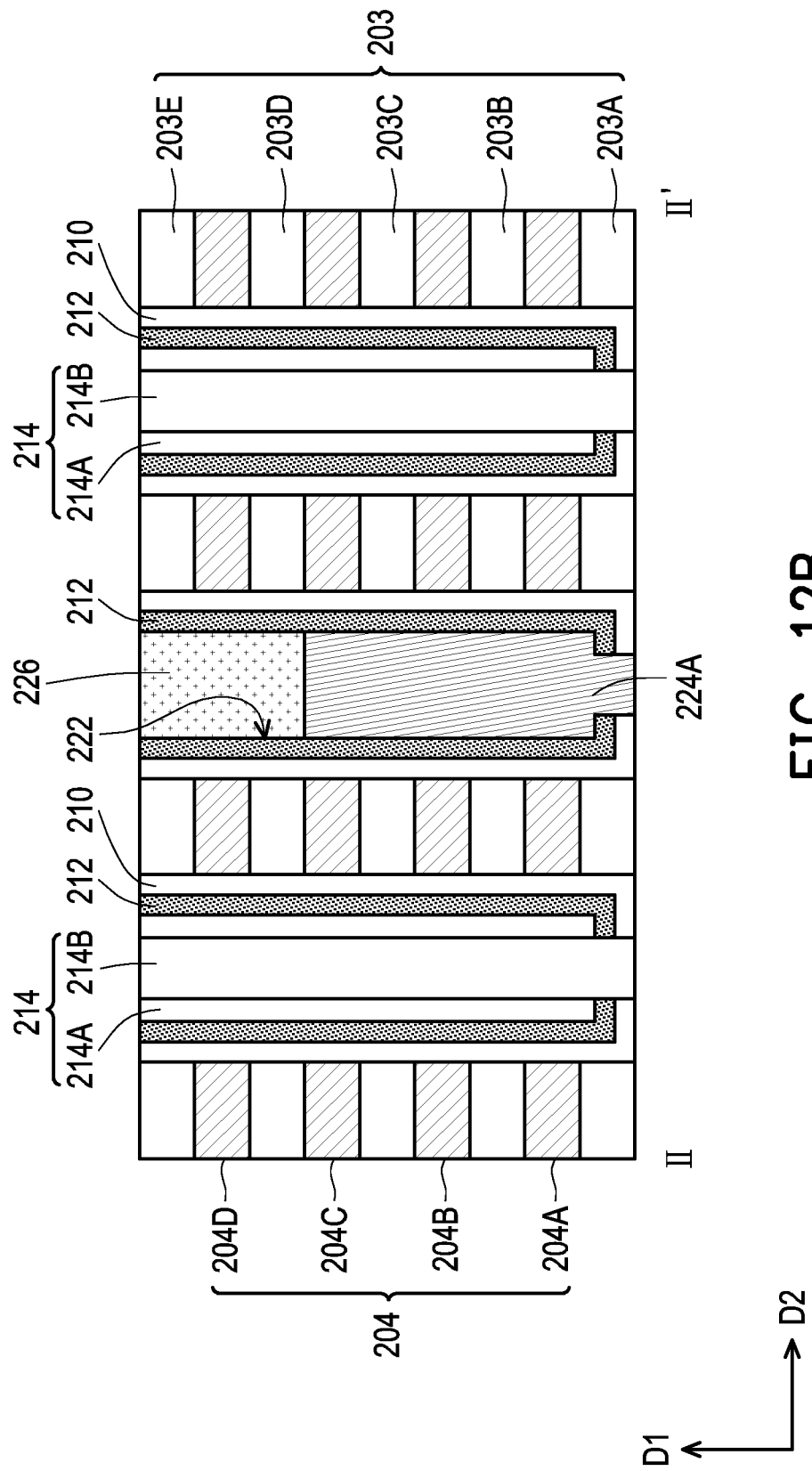

Referring to FIGS. 12A and 12B, dielectric pillars 226 are formed in the trenches 222 on the conductive pillars 224A. In some embodiments, a dielectric material is deposited over the stacks 202 to fill in the trenches 222. The dielectric material may include silicon oxide, silicon nitride, silicon oxynitride, or the like, which may be deposited by CVD, PVD, ALD, PECVD, or the like. The dielectric material may extend along sidewalls and bottom surfaces of the trenches 222 on the conductive pillars 224A. After deposition, a planarization process (e.g., a CMP, etch back, or the like) may be performed to remove excess portions of the dielectric material. In the resulting structure, top surfaces of the stacks 202 (e.g., dielectric layers 203E), the memory material layer 210, the channel layer 212, and the dielectric pillars 226 may be substantially level (e.g., within process variations). In some embodiments, materials of the dielectric pillars 226 and dielectric materials 214 may be selected so that they may be etched selectively relative each other. For example, the dielectric materials 214 include oxide and the dielectric pillars 226 include nitride. In alternative embodiments, the dielectric materials 214 include nitride and the dielectric pillars 226 include oxide. Other materials are also possible.

Figure 13A:
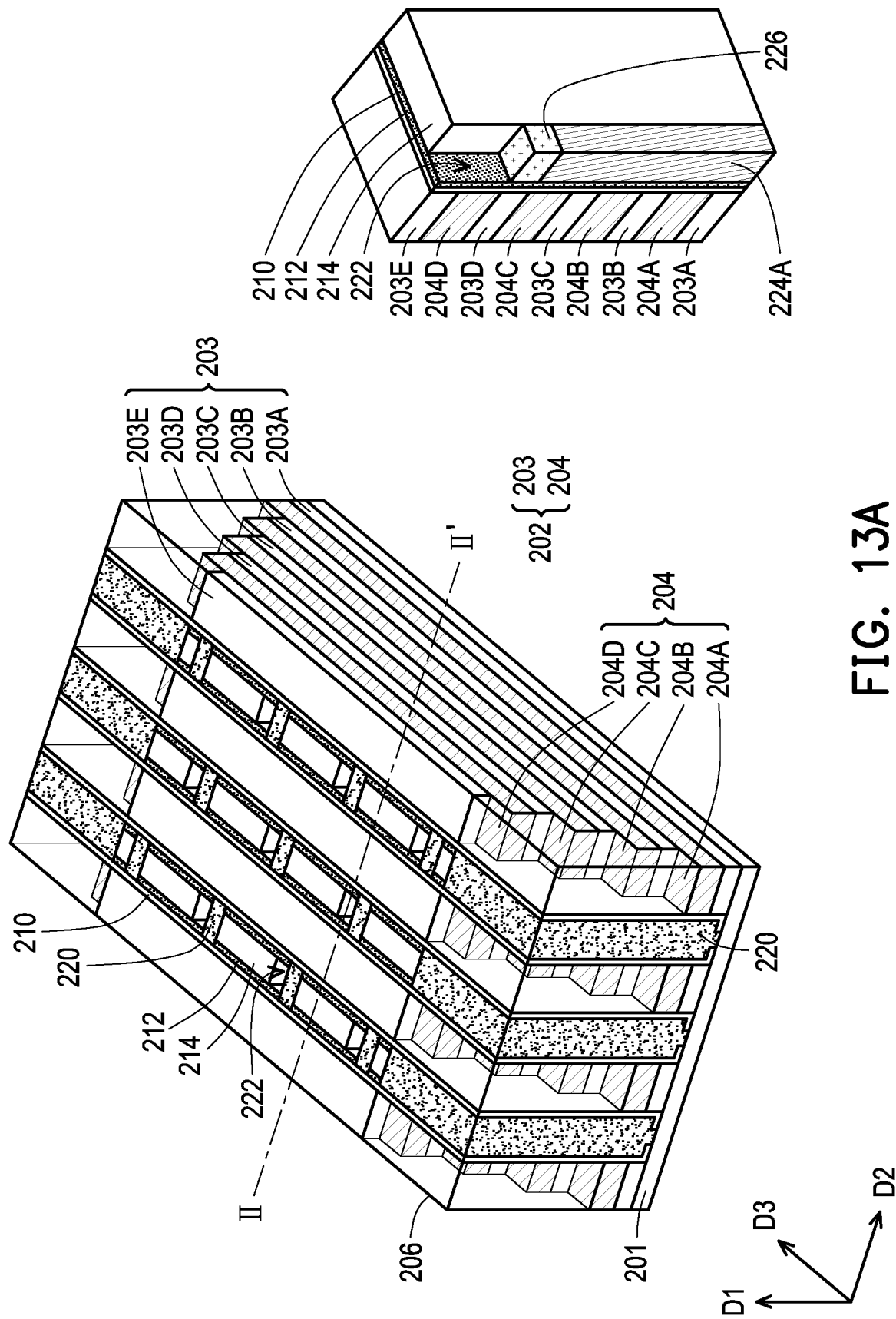
Figure 13B:
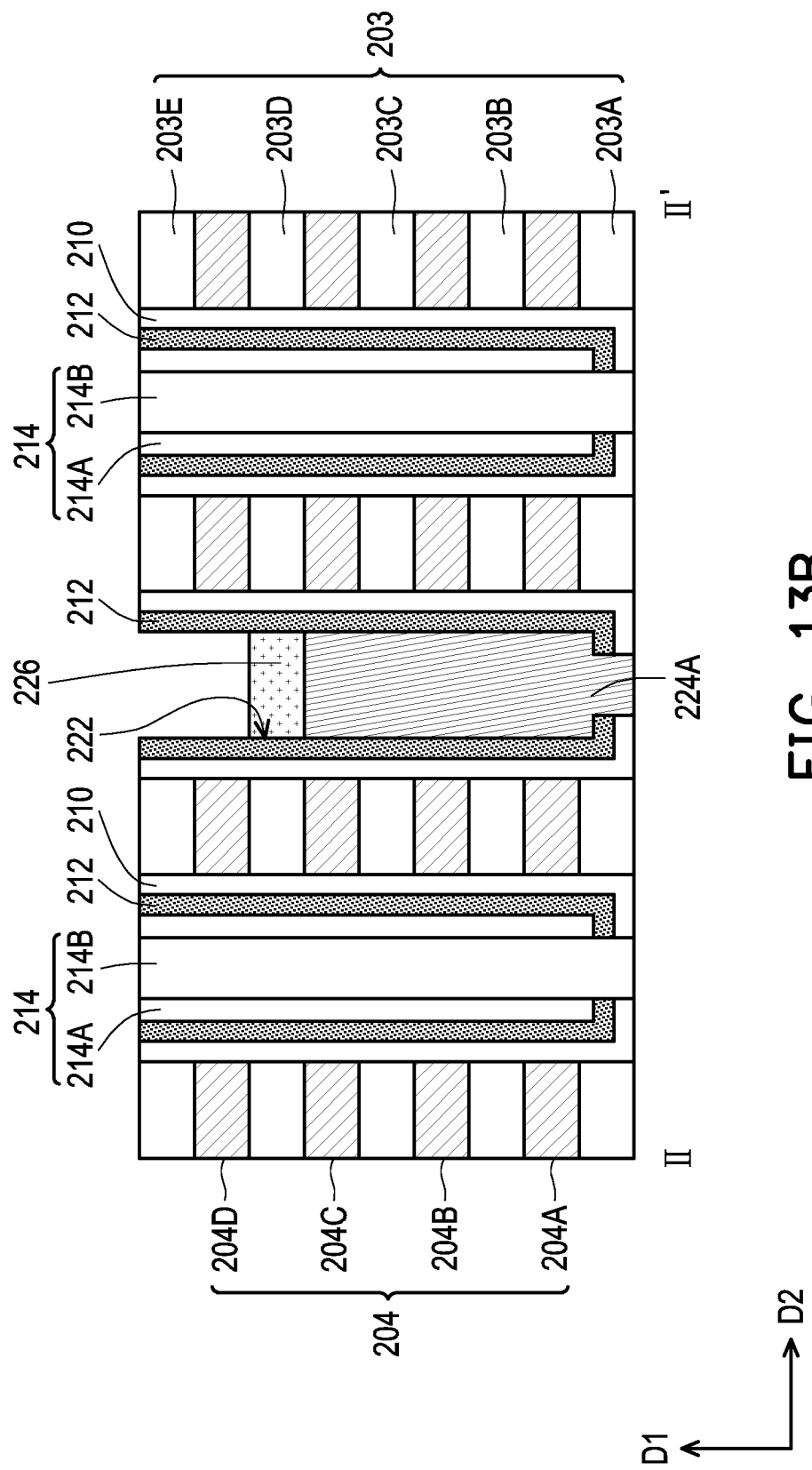

Referring to FIGS. 13A and 13B, portions of the dielectric pillars 226 are removed. The portions of the dielectric pillars 226 may be removed by an acceptable etching process, such as by a dry etch (e.g., RIE, NBE, the like), a wet etch, an etch back, the like, or a combination thereof. The etching may be anisotropic. In some embodiments, top portions of the dielectric pillars 226 are removed to expose the trenches 222, and the removed amount of the top portions of the dielectric pillars 226 is substantially the same. In other words, top surfaces of the remained dielectric pillars 226 may be substantially level (e.g., within process variations) with each other. However, the disclosure is not limited thereto. In some embodiments, the dielectric pillar 226 is adjacent to the dielectric layer 203D immediately beneath the topmost conductive line 204D. For example, top and bottom surfaces of the dielectric pillar 226 are substantially level (e.g., within process variations) with top and bottom surfaces of the dielectric layer 203D, respectively. However, the disclosure is not limited thereto. The top and bottom surface of the dielectric pillar 226 may be at any height depended on the requirements.

Figure 14A:
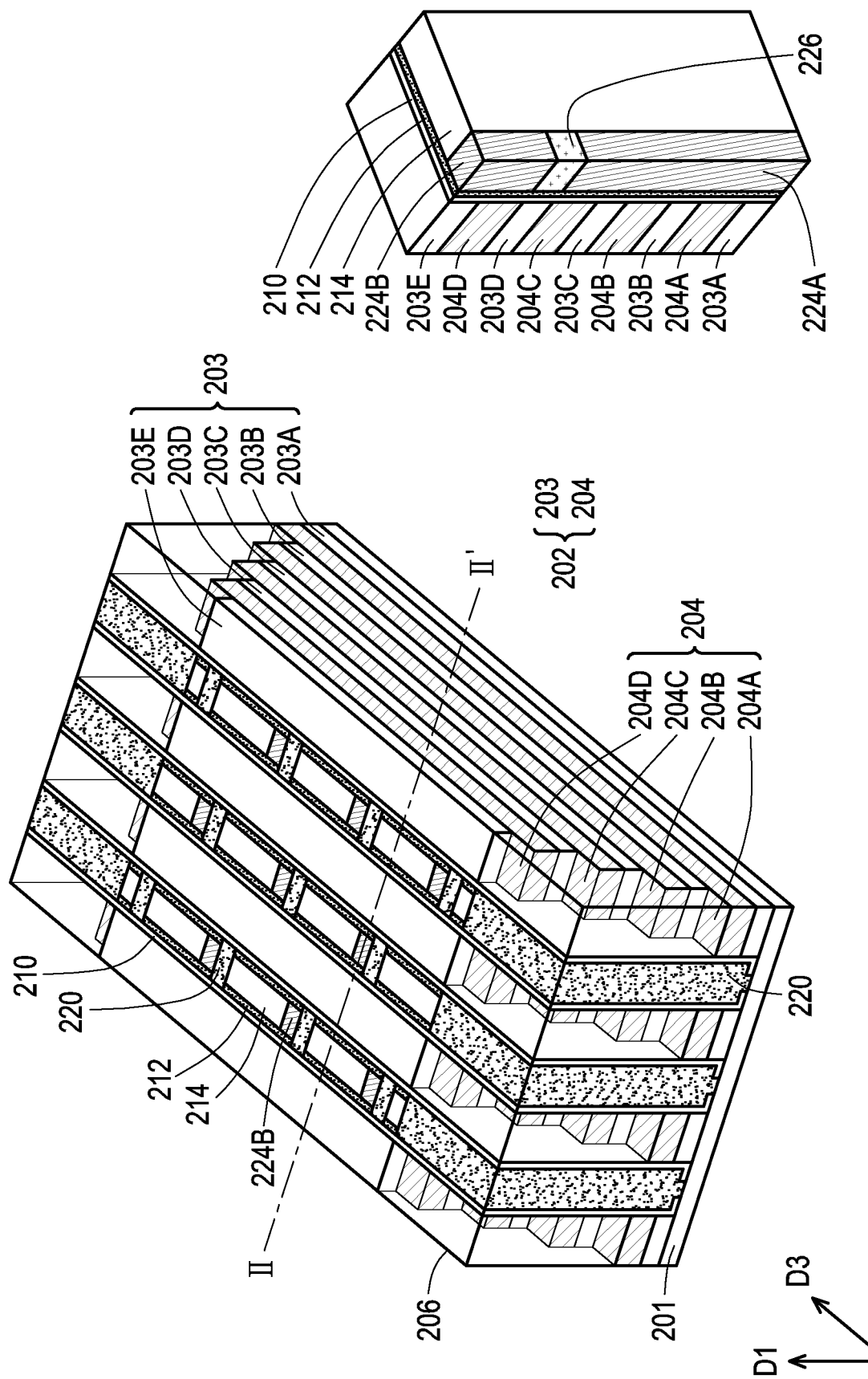
Figure 14B:
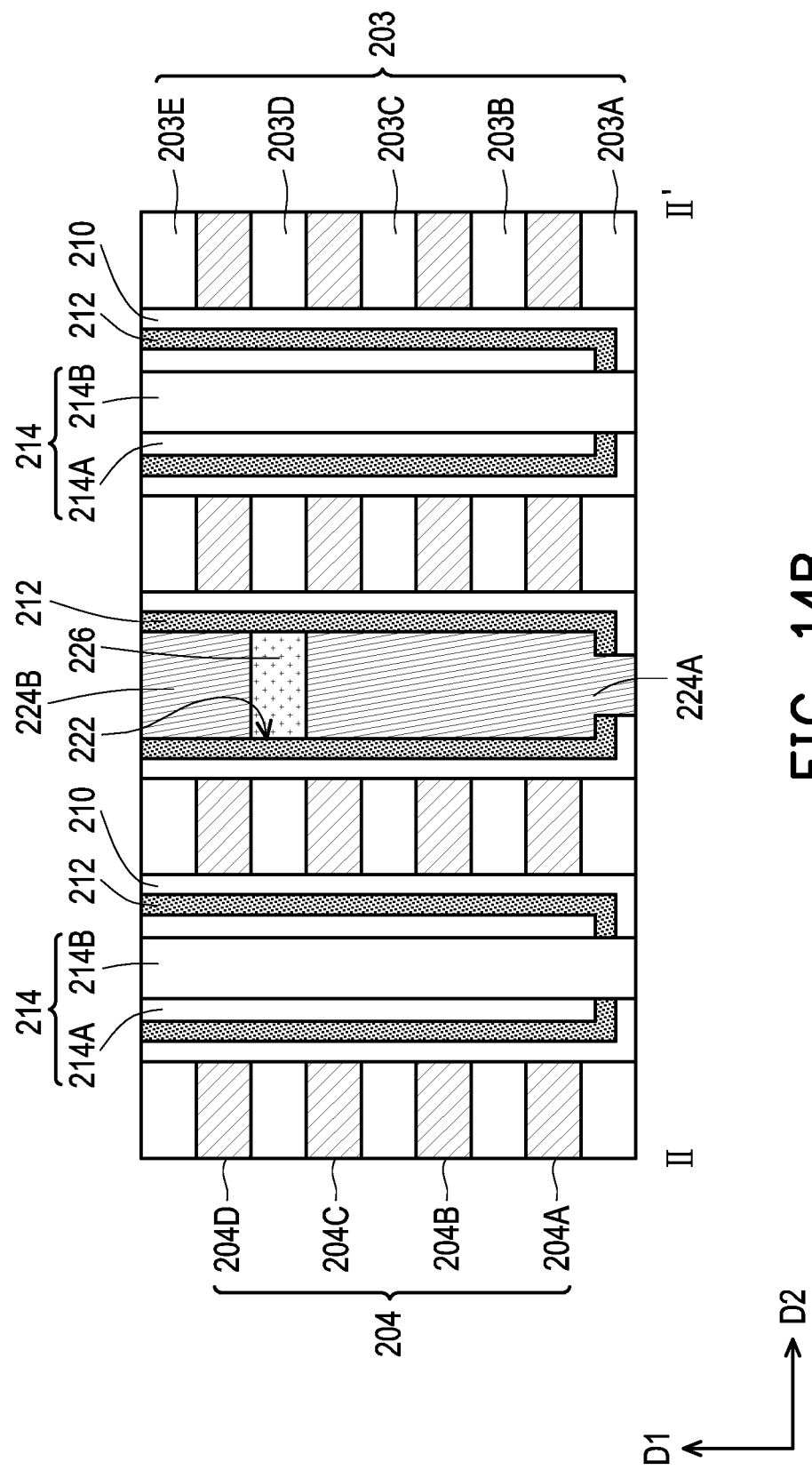

Referring to FIGS. 14A and 14B, conductive pillars 224B are formed in the trenches 222 on the dielectric pillars 226. The resistance of the conductive pillars 224B may be substantially the same as the conductive pillars 224A. For example, the material of the conductive pillars 224B may be substantially the same as the conductive pillars 224A. The conductive pillars 224B may be formed by filling a conductive material into the trenches 222. The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 224B. In the resulting structure, top surfaces of the stacks 202 (e.g., the dielectric layers 203E), the memory material layers 210, the channel layers 212 and the conductive pillars 224B may be substantially level (e.g., within process variations). The conductive pillar 224B is at least overlapped with the topmost conductive line 204D in the direction D2 (e.g., horizontal direction or x-direction). In some embodiments, the conductive pillar 224B is overlapped with the topmost conductive line 204D in the direction D2 (e.g., horizontal direction or x-direction), and the memory material layer 210 and the channel layer 212 are disposed between the conductive pillar 224B and the topmost conductive line 204D. For example, top and bottom surfaces of the conductive pillar 224B are substantially level (e.g., within process variations) with a top surface of the topmost dielectric layer 203E and a bottom surface of the dielectric layer 203D immediately adjacent to the topmost dielectric layer 203E, respectively. However, the disclosure is not limited thereto. The top and bottom surfaces of the conductive pillar 224B may be at any height depended on the requirements. In some embodiments, the conductive pillar 224B is in direct contact with the dielectric pillar 226, and the dielectric pillar 226 is disposed between the conductive pillar 224A and the conductive pillar 224B. In some embodiments, sidewalls of the conductive pillar 224A, the dielectric pillar 226 and the conductive pillar 224B are substantially flush (e.g., within process variations).

Figure 15A:
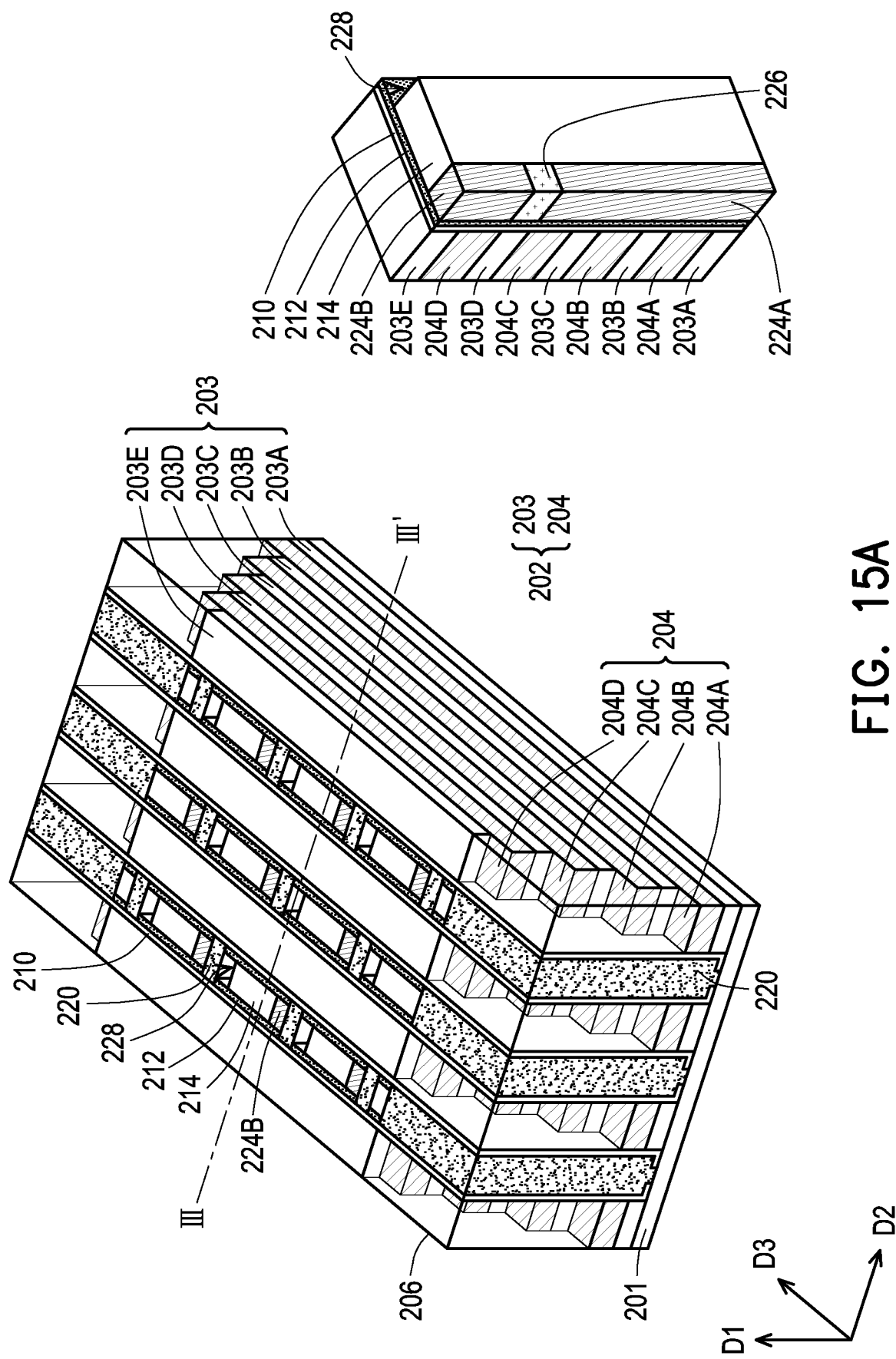
Figure 15B:
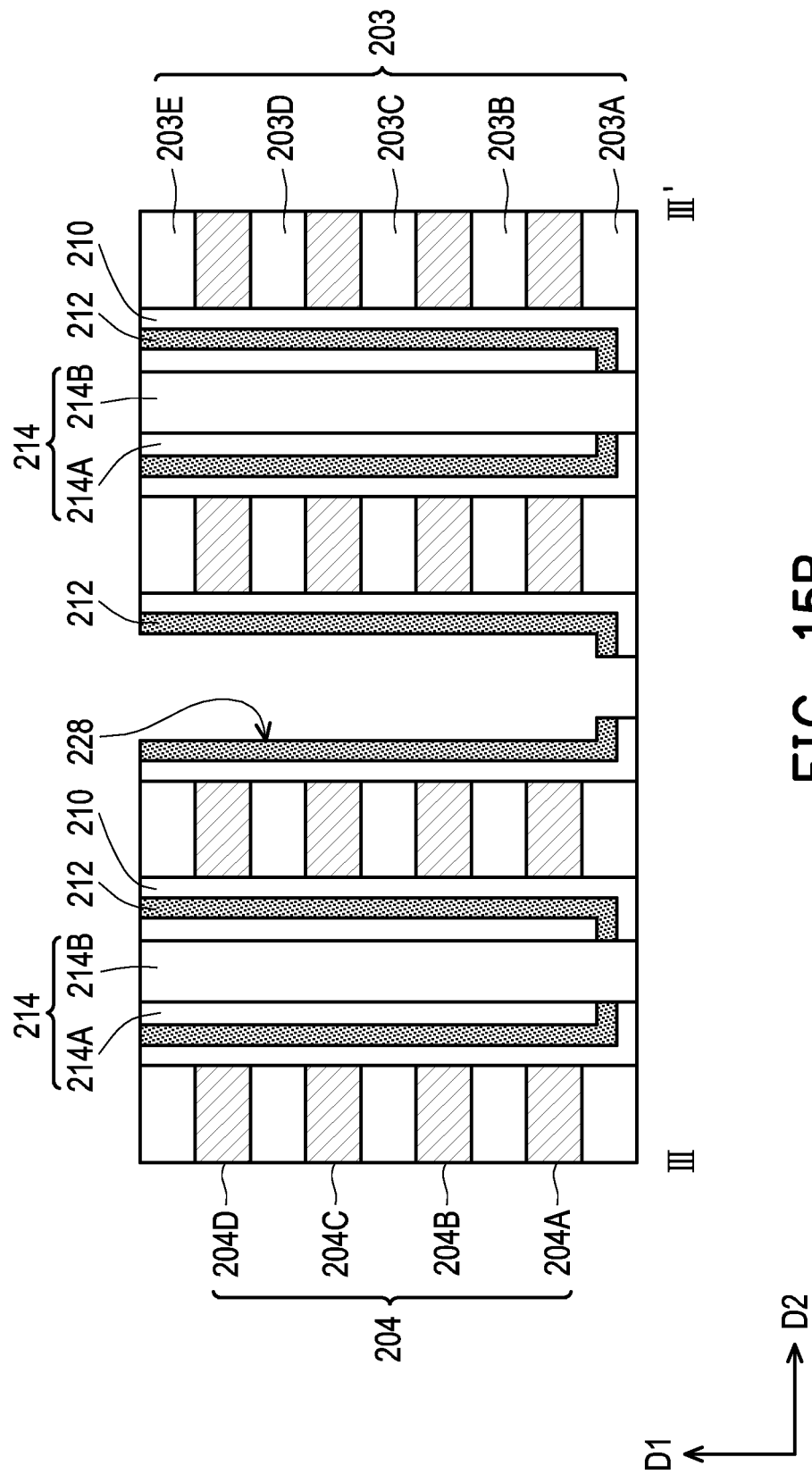

Referring to FIGS. 15A and 15B, trenches 228 are defined for the subsequently formed conductive pillars 230. The trenches 228 are formed by patterning the dielectric materials 214 with a combination of photolithography and etching, for example. In some embodiments, a photoresist (not shown) is formed over the stacks 202, the dielectric materials 214, the dielectric materials 220, the channel layer 212, and the memory material layer 210. In some embodiments, the photoresist is patterned by an acceptable photolithography technique to define openings (not shown). Each of the openings may expose a second side (i.e., second region) of the dielectric material 214 beside the dielectric material 220. In some embodiments, the second side of the dielectric material 214 is opposite to the first side at which the conductive pillars 224A and 224B are disposed. In this way, each of the openings may define a pattern of a conductive pillar 230 adjacent to the dielectric material 220.

Subsequently, portions of the dielectric materials 214 exposed by the openings may be removed by an acceptable etching process, such as by a dry etch (e.g., RIE, NBE, the like), a wet etch, the like, or a combination thereof. The etching may be anisotropic. The etching process may use an etchant that etches the dielectric materials 214 without significantly etching the dielectric materials 220. As a result, even though the openings expose the dielectric materials 220, the dielectric materials 220 may not be significantly removed. Patterns of the trenches 228 may correspond to the conductive pillars 230. After the trenches 228 are patterned, the photoresist may be removed by ashing, for example. As shown in FIG. 15A, a portion of the channel layer 212 is exposed by the trench 228.

Figure 16A:
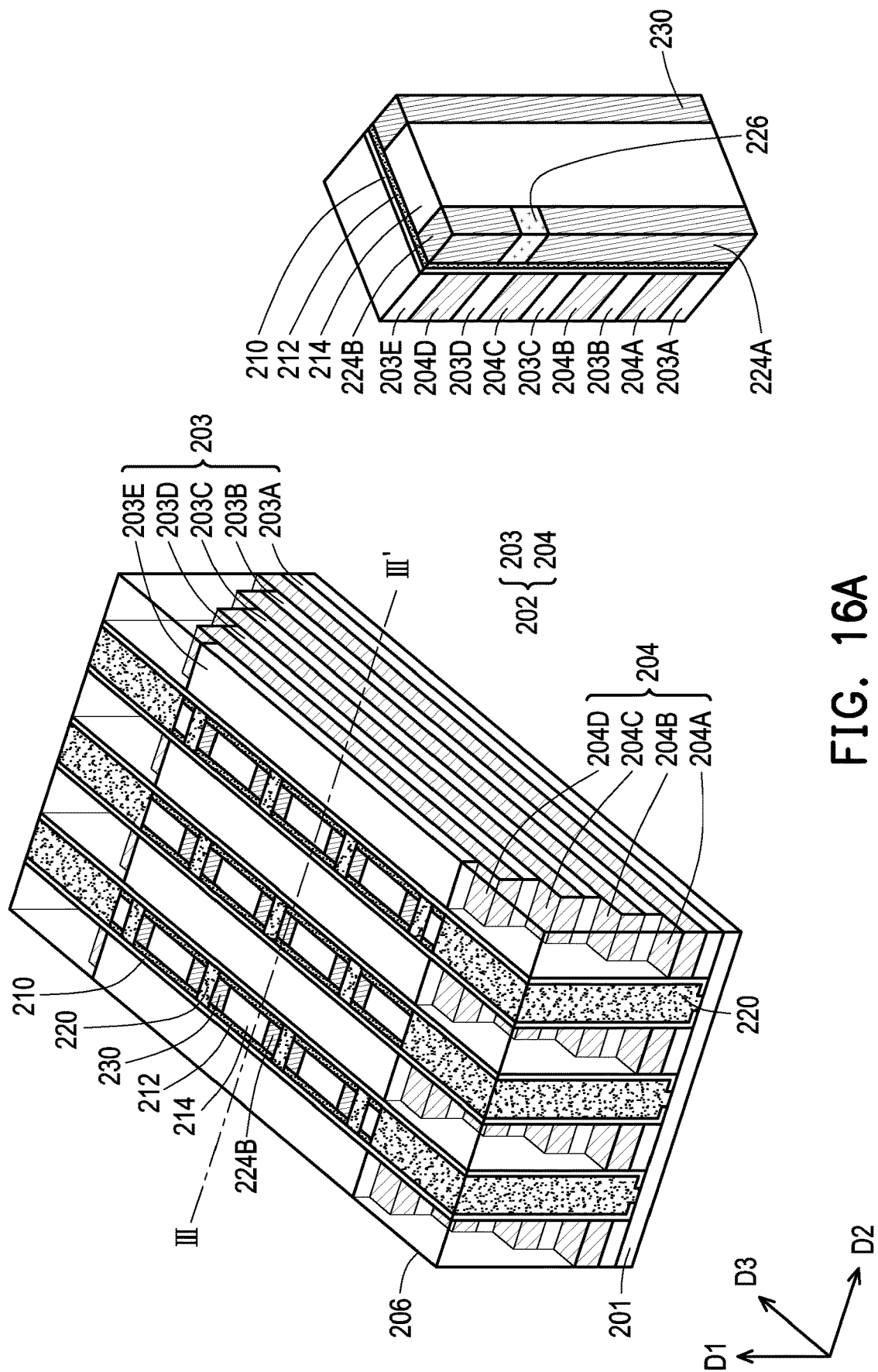
Figure 16B:
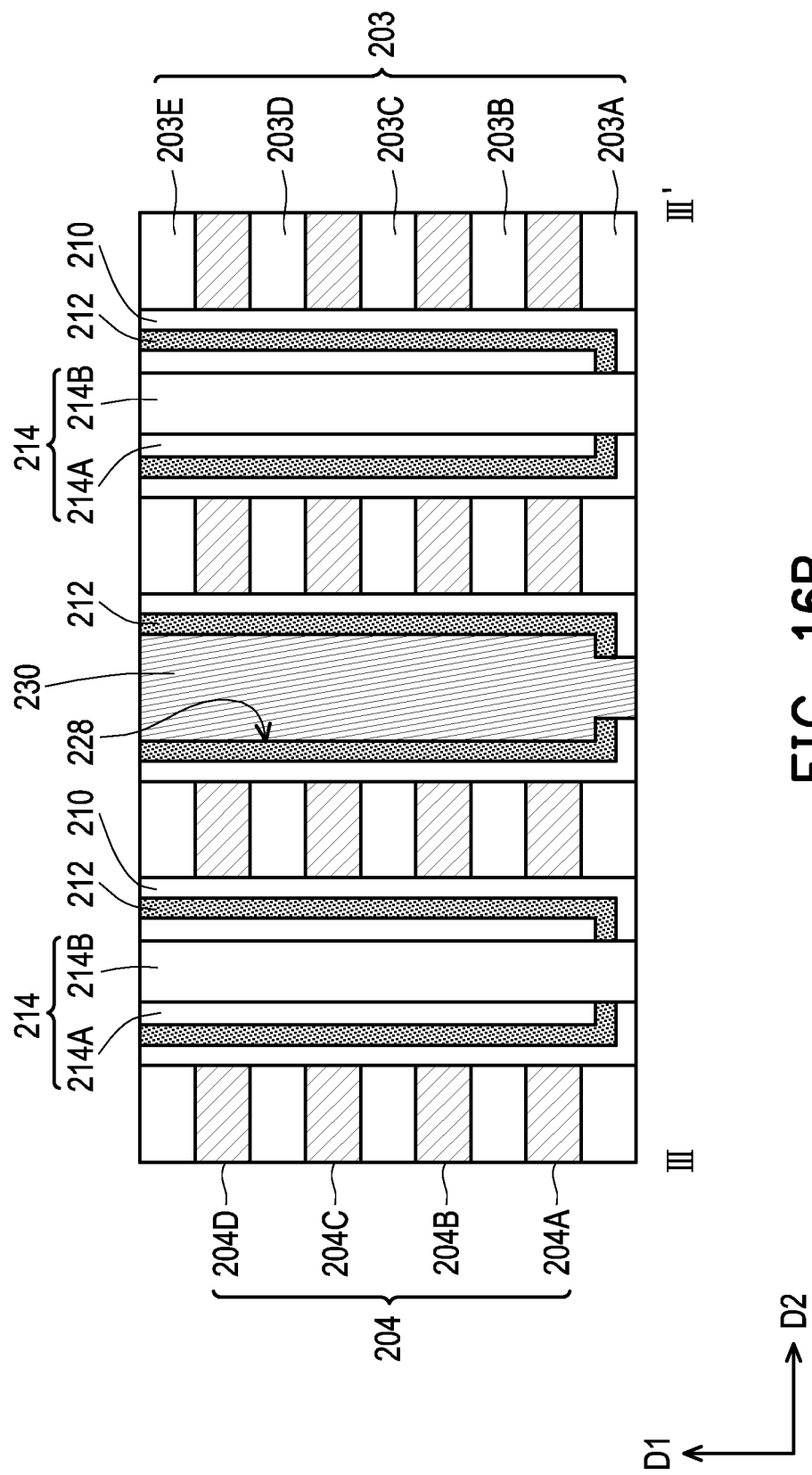

Referring to FIGS. 16A and 16B, the trenches 228 are filled with a conductive material to form the conductive pillars 230. The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 230. In the resulting structure, top surfaces of the stacks 202 (e.g., dielectric layers 203E), the memory material layer 210, the channel layer 212, the conductive pillars 224B and the conductive pillars 230 may be substantially level (e.g., within process variations).

Figure 17A:
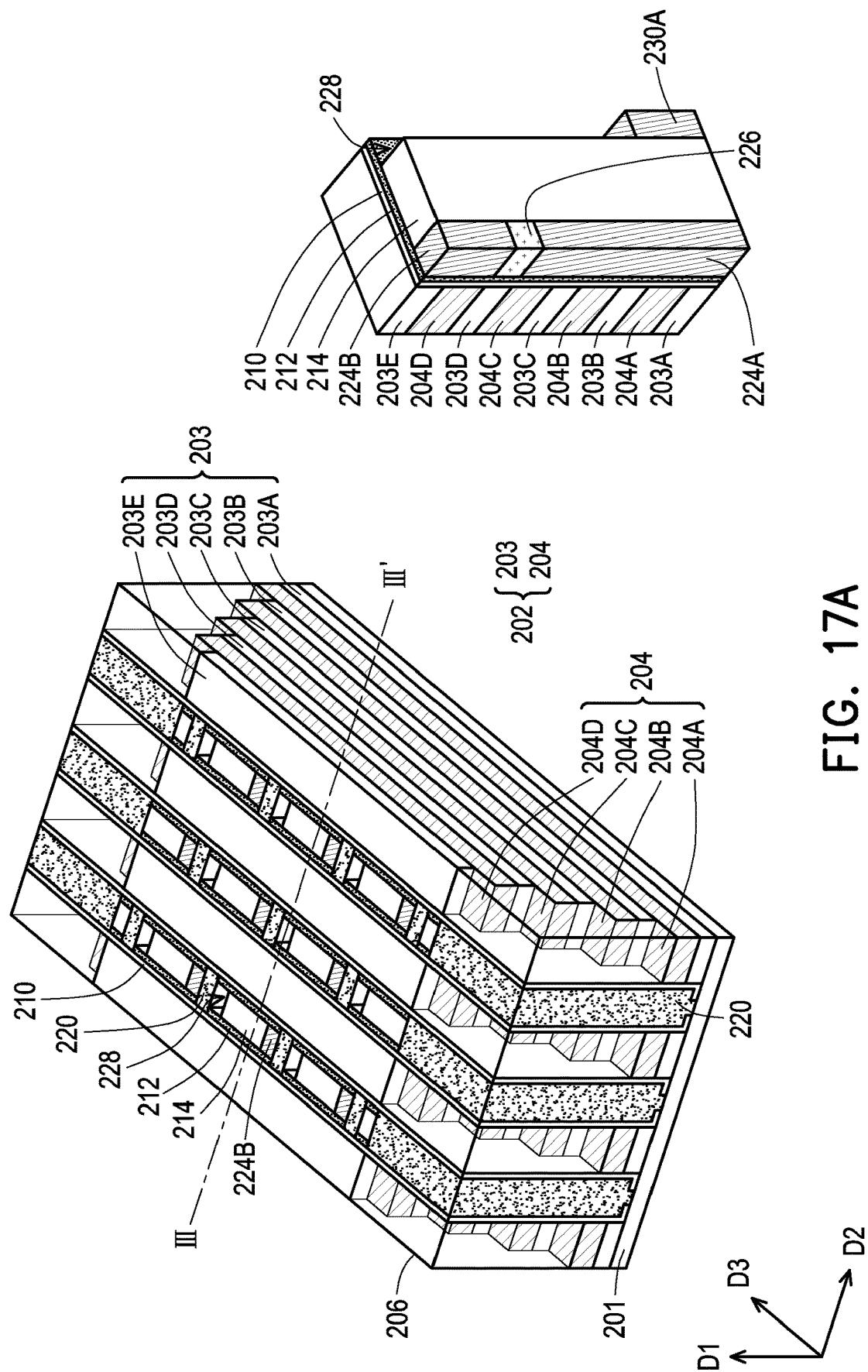
Figure 17B:
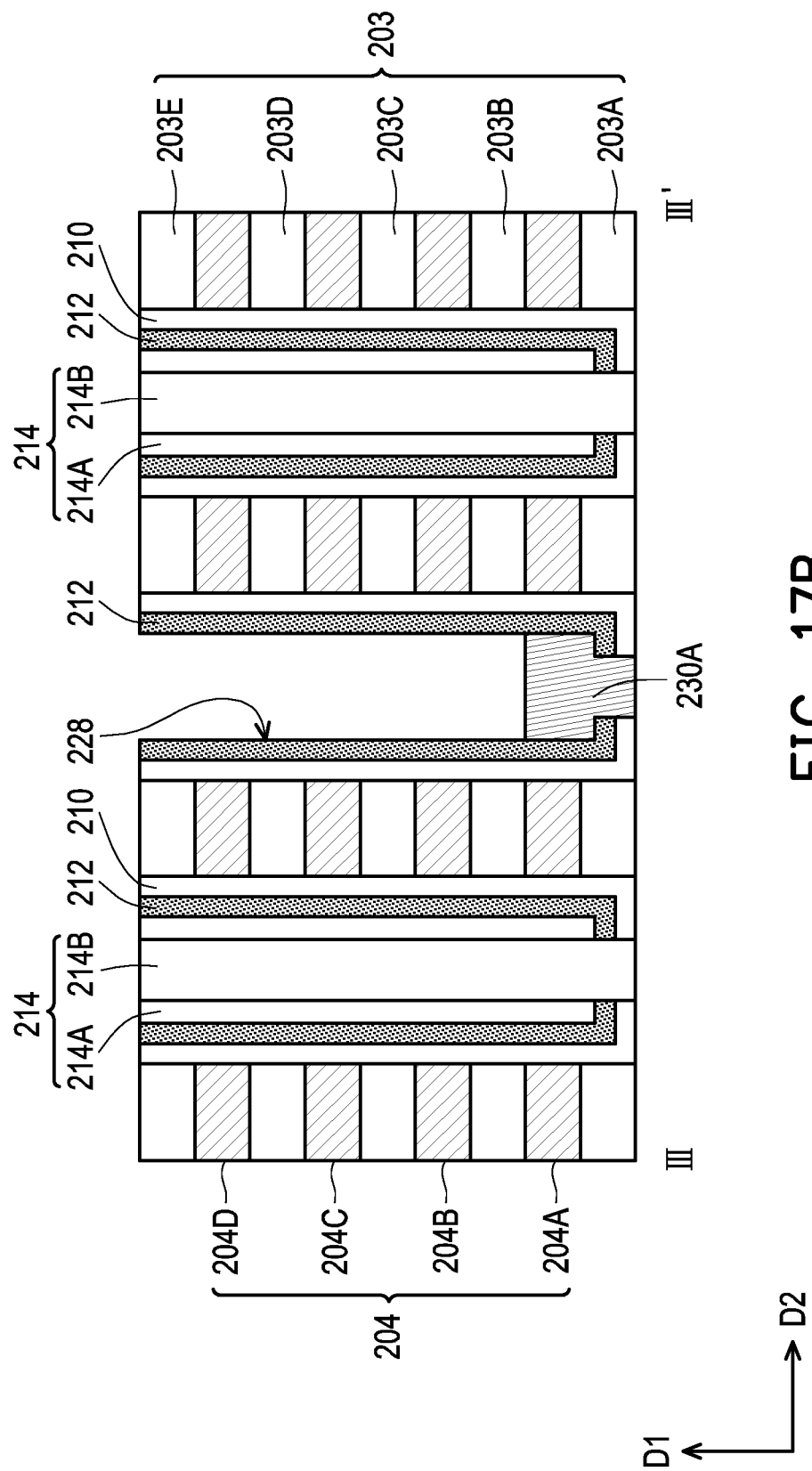

Referring to FIGS. 17A and 17B, portions of the conductive pillars 230 are removed, to form the conductive pillars 230A. The portions of the conductive pillars 230 may be removed by an acceptable etching process, such as by a dry etch (e.g., RIE, NBE, the like), a wet etch, an etch back, the like, or a combination thereof. The etching may be anisotropic. In some embodiments, top portions of the conductive pillars 230 are removed to expose the trenches 228, and the removed amount of the top portions of the conductive pillars 230 may be substantially the same. In other words, top surfaces of the remained conductive pillars 230 (i.e., the conductive pillars 230A) may be substantially level (e.g., within process variations) with each other. However, the disclosure is not limited thereto. The conductive pillar 230A is at least overlapped with the bottommost conductive line 204A in the direction D2 (e.g., horizontal direction or x-direction). In some embodiments, the conductive pillar 230A is overlapped with the bottommost conductive line 204A in the direction D2 (e.g., horizontal direction or x-direction), and the memory material layer 210 and the channel layer 212 are disposed between the conductive pillar 230A and the bottommost conductive line 204A. The top surface of the conductive pillar 230A may be not higher than a bottom surface of the conductive line 204B immediately above the bottommost conductive line 204A. For example, top and bottom surfaces of the conductive pillar 230A are substantially level (e.g., within process variations) with a top surface of the bottommost conductive line 204A and a bottom surface of the dielectric layer 203A immediately beneath the bottommost conductive line 204A, respectively. However, the disclosure is not limited thereto. The conductive pillar 230A may be at any height depended on the requirements.

Figure 18A:
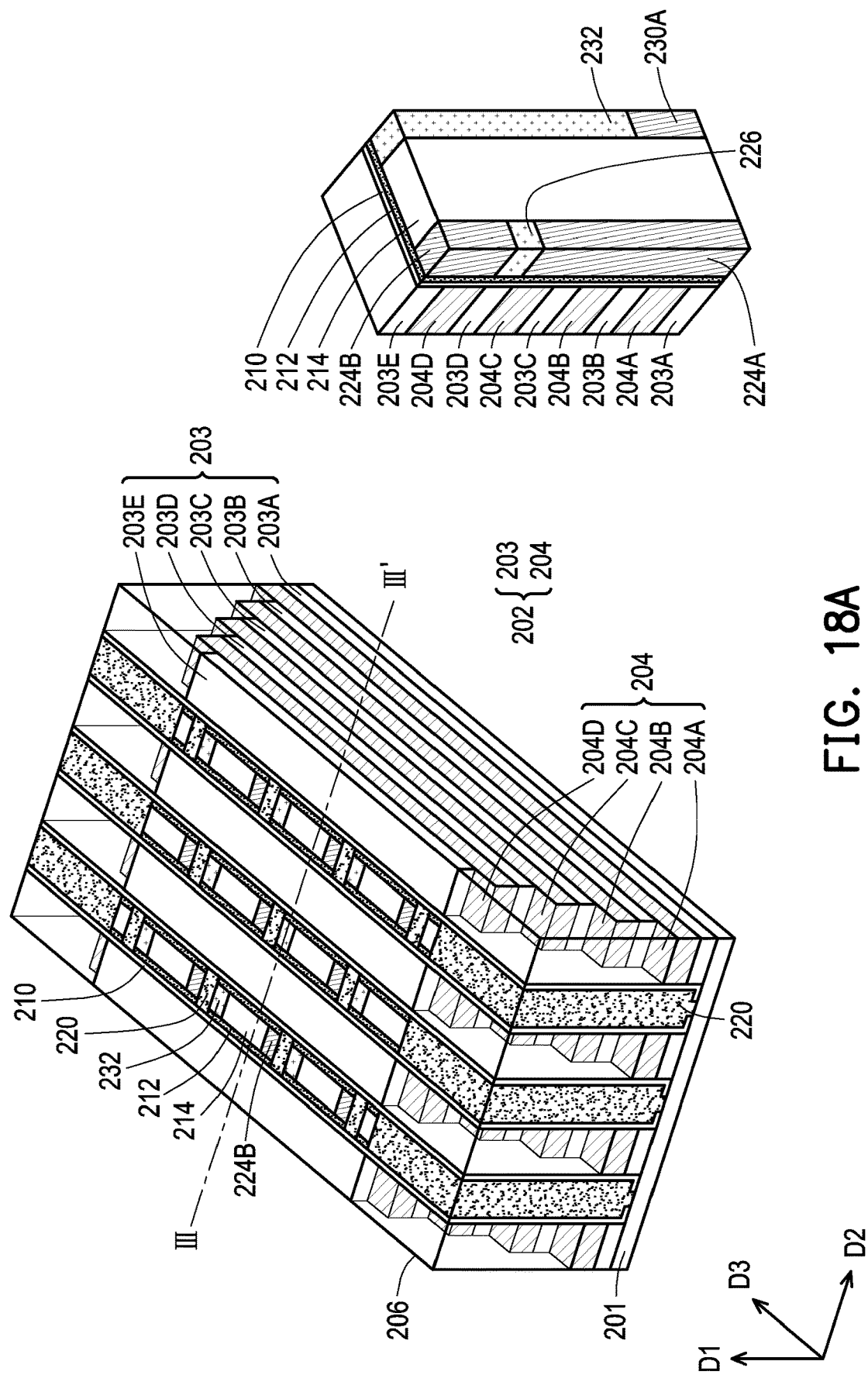
Figure 18B:
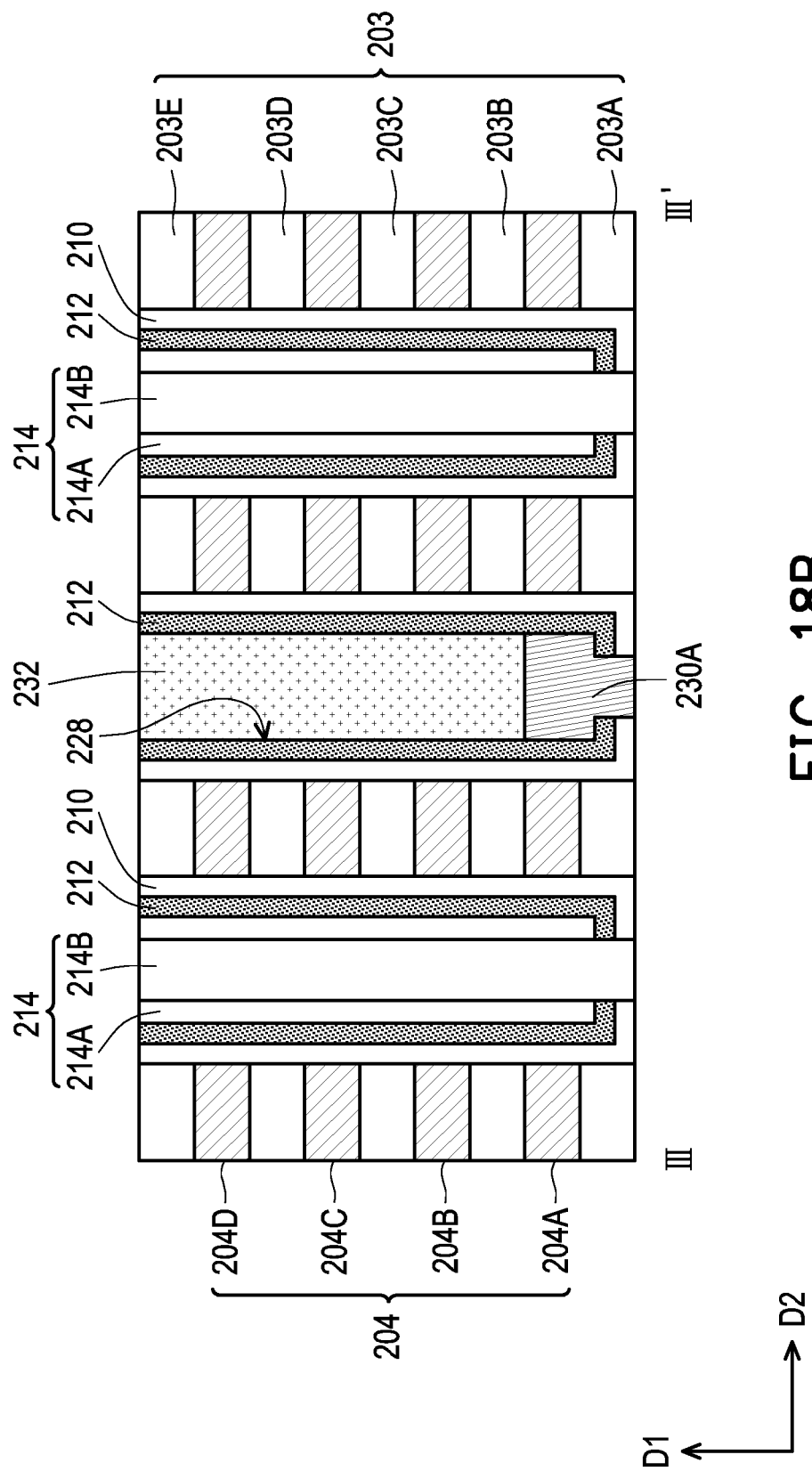

Referring to FIGS. 18A and 18B, dielectric pillars 232 are formed in the trenches 228 on the conductive pillars 230A.

In some embodiments, a dielectric material is deposited over the stacks 202 filling in the trenches 228. The dielectric material may include, for example, silicon oxide, silicon nitride, silicon oxynitride, or the like, which may be deposited by CVD, PVD, ALD, PECVD, or the like. The dielectric material may extend along sidewalls and bottom surfaces of the trenches 228 on the conductive pillars 230A. After deposition, a planarization process (e.g., a CMP, etch back, or the like) may be performed to remove excess portions of the dielectric material. In the resulting structure, top surfaces of the stacks 202 (e.g., dielectric layers 203E), the memory material layer 210, the channel layer 212, the conductive pillars 224B, and the dielectric pillars 232 may be substantially level (e.g., within process variations). In some embodiments, materials of the dielectric pillars 232 and dielectric materials 214 may be selected so that they may be etched selectively relative each other. For example, the dielectric pillars 232 include oxide and the dielectric pillars 226 include nitride. In alternative embodiments, the dielectric pillars 232 include nitride and the dielectric pillars 226 include oxide. Other materials are also possible.

Figure 19A:
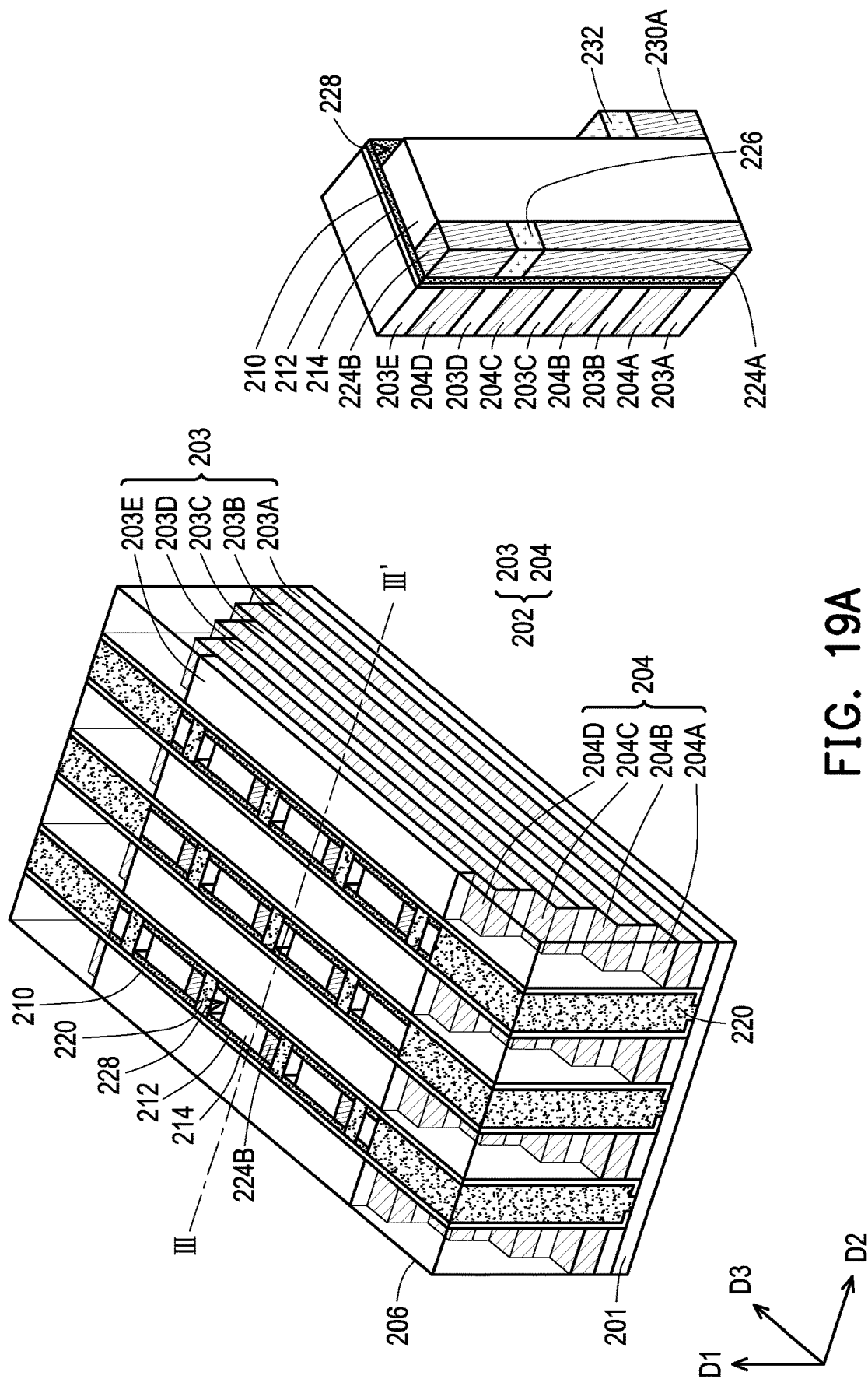
Figure 19B:
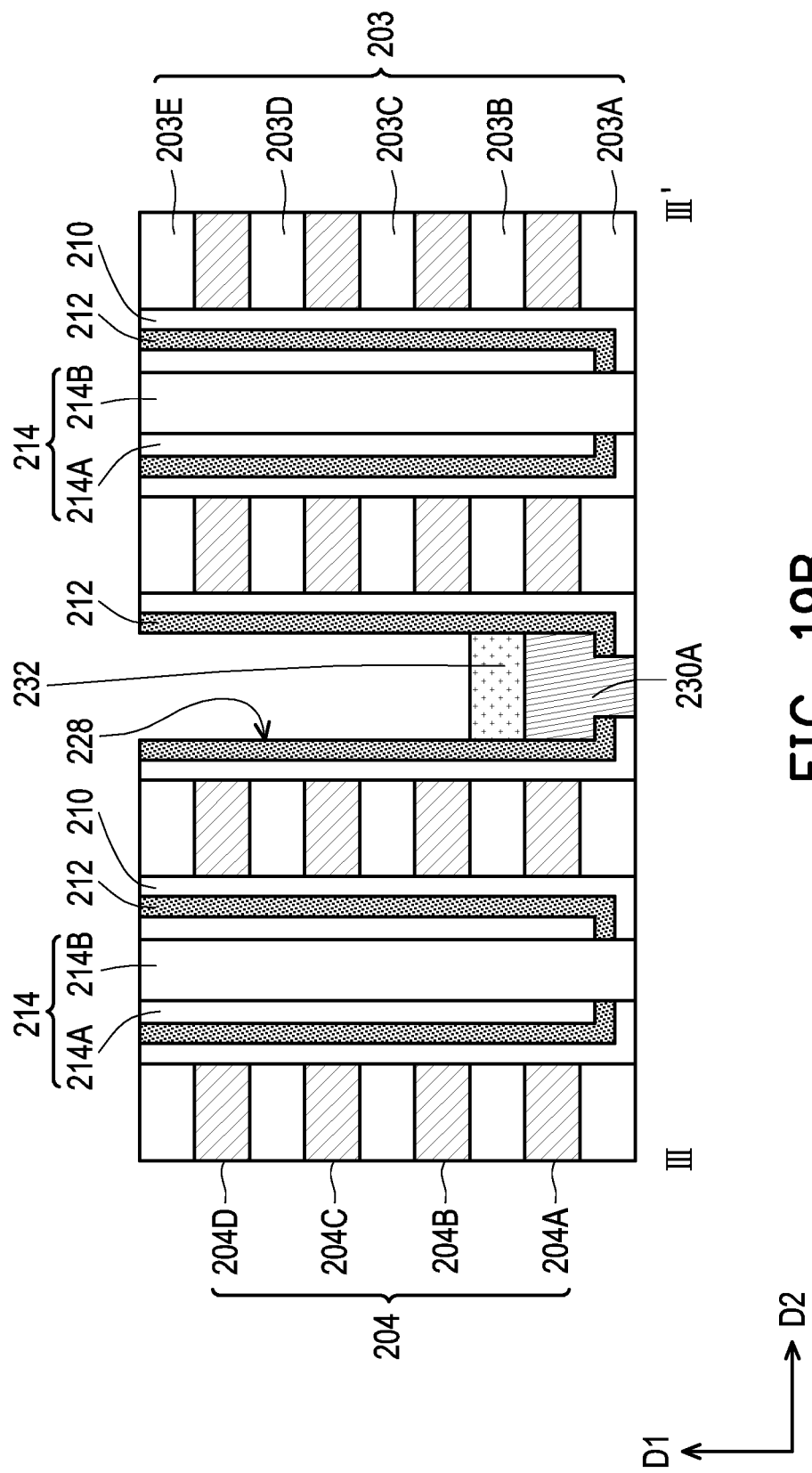

Referring to FIGS. 19A and 19B, portions of the dielectric pillars 232 are removed. The portions of the dielectric pillars 232 may be removed by an acceptable etching process, such as by a dry etch (e.g., RIE, NBE, the like), a wet etch, an etch back, the like, or a combination thereof. The etching may be anisotropic. In some embodiments, top portions of the dielectric pillars 232 are removed to expose the trenches 228, and the removed amount of the top portions of the dielectric pillars 232 may be substantially the same. In other words, top surfaces of the remained dielectric pillars 232 may be substantially level (e.g., within process variations) with each other. However, the disclosure is not limited thereto. In some embodiments, the dielectric pillar 232 is adjacent to the dielectric layer 203B immediately above the bottommost conductive line 204A. For example, top and bottom surfaces of the dielectric pillar 232 are substantially level (e.g., within process variations) with top and bottom surfaces of the dielectric layer 203B, respectively. However, the disclosure is not limited thereto. The top and bottom surfaces of the dielectric pillar 232 may be at any height depended on the requirements.

Figure 20A:
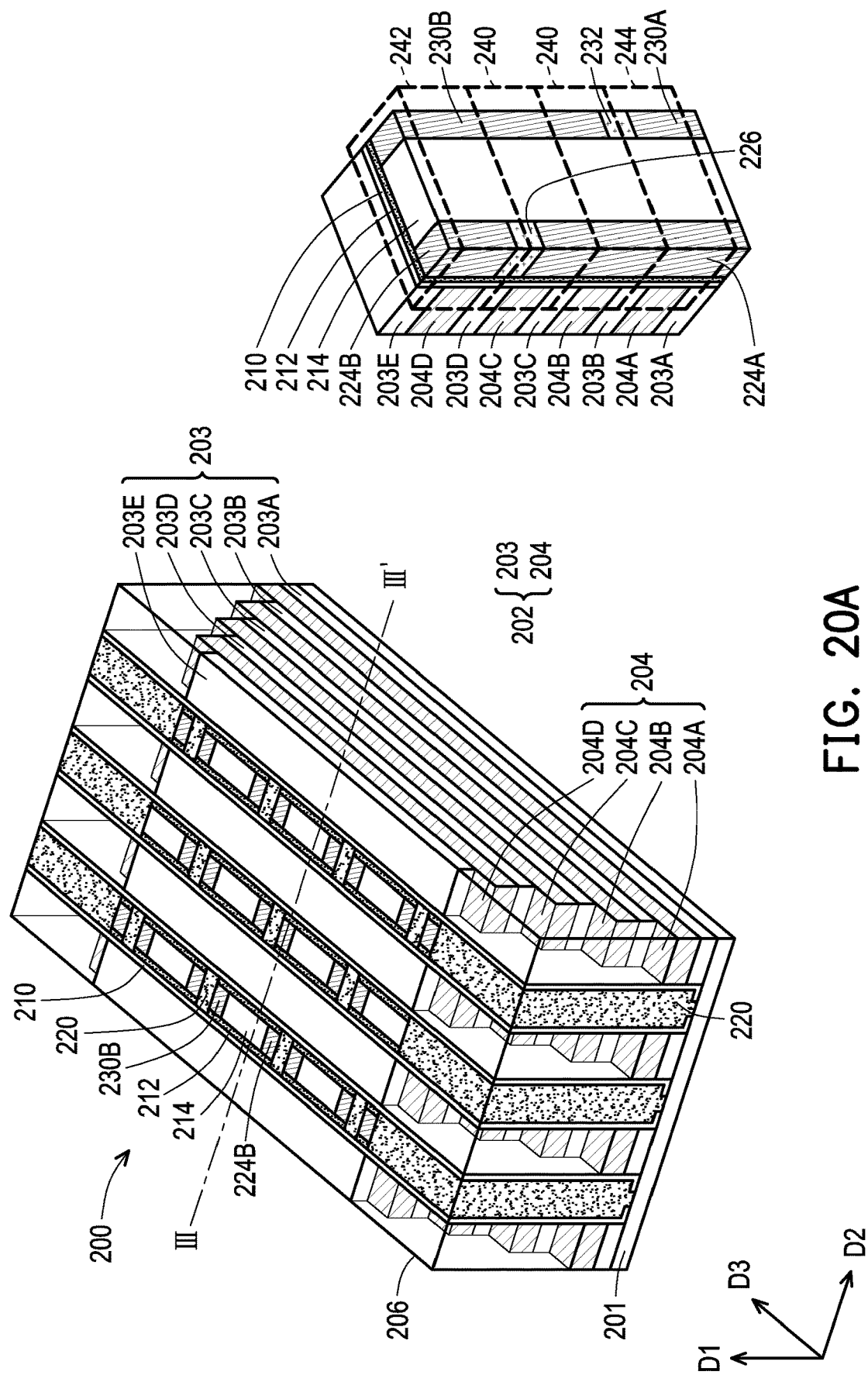
Figure 20B:
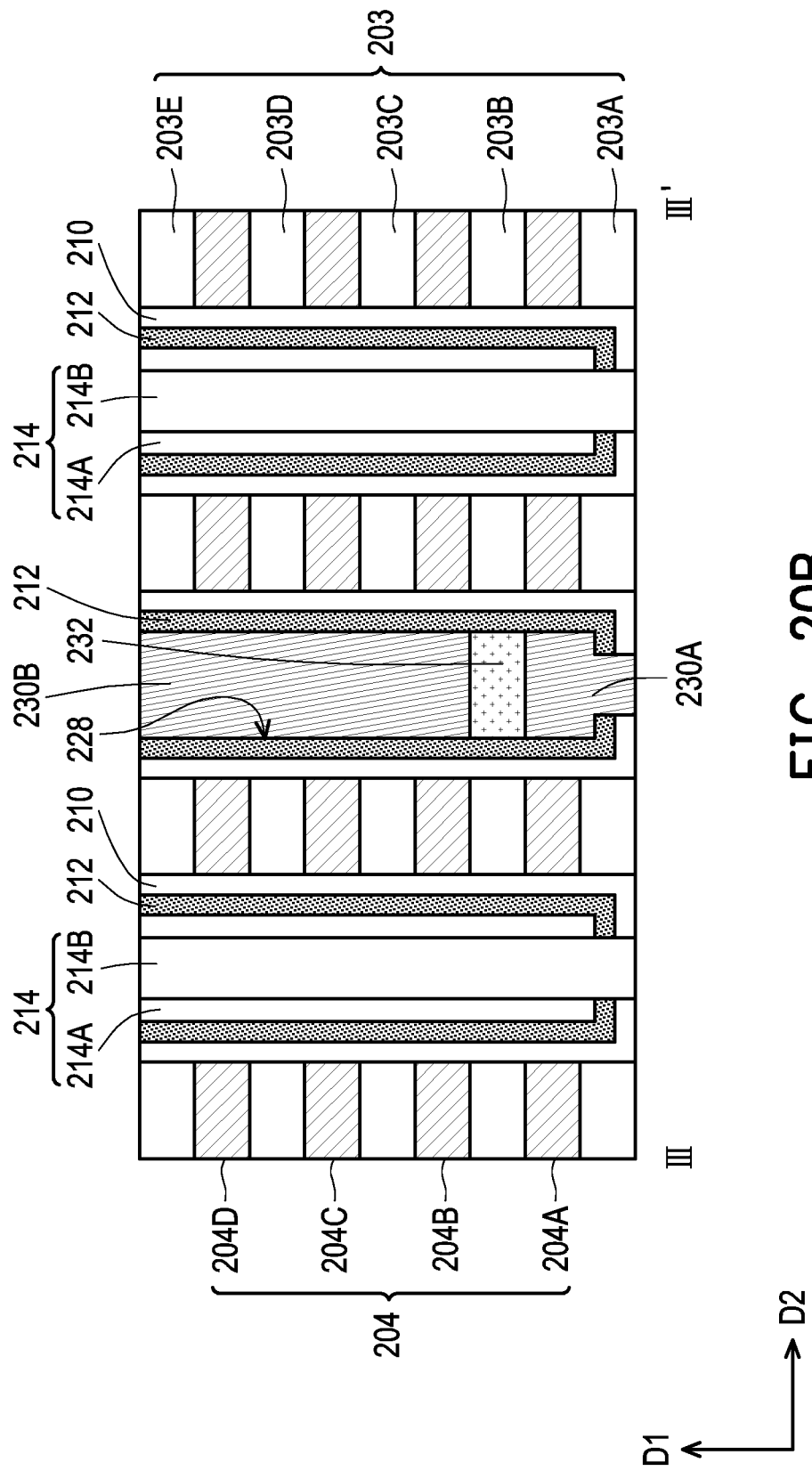

Referring to FIGS. 20A and 20B, conductive pillars 230B are formed in the trenches 228 on the dielectric pillars 232. The resistance of the conductive pillars 230B may be substantially the same as the conductive pillars 230A. For example, the material of the conductive pillars 230B may be substantially the same as the conductive pillars 230A. The conductive pillars 230B may be formed by filling a conductive material into the trenches 228. The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 230B. In the resulting structure, top surfaces of the stacks 202 (e.g., dielectric layers 203E), the memory material layers 210, the channel layers 212, the conductive pillars 224B and the conductive pillars 230B may be substantially level (e.g., within process variations). In some embodiments, the conductive pillar 230B is not overlapped with the bottommost conductive line 204A in the direction D2 (e.g., horizontal direction or x-direction). The conductive pillar 230B may be disposed above the bottommost conductive line 204A. For example, the bottom surface of the conductive pillar 230B is higher than a top surface of the bottommost conductive line 204A. The conductive pillar 230B may be disposed aside the conductive line 204B immediately above the bottommost conductive line 204A. In some embodiments, the bottom surface of the conductive pillar 230B is substantially level (e.g., within process variations) with the bottom surface of the conductive line 204B. However, the disclosure is not limited thereto. The conductive pillars 230B may be at any height depended on the requirements. In some embodiments, the conductive pillar 230B is in direct contact with the dielectric pillar 232, and the dielectric pillar 232 is disposed between the conductive pillar 230A and the conductive pillar 230B. In some embodiments, sidewalls of the conductive pillar 230A, the dielectric pillar 232 and the conductive pillar 230B are substantially flush (e.g., within process variations).

As illustrated in FIG. 20A, a memory device 200 includes the stacks 202. In some embodiments, each of the stacks 202 includes a first memory cell 242, a second memory cell 244 and a plurality of memory cells 240 stacked between the first and second memory cells 242, 244. In some embodiments, the first and second memory cells 242, 244 are configured to function as a switch for coupling a source line and/or a bit line to the memory cells 240, and thus the first memory cell 242, 244 may be referred to as a select device, a select transistor, a switch, or a select gate. In some embodiments, the first and second memory cells 242, 244 may be implemented by other a transistor different from the memory cells 240. The memory cells 240 and the first and second memory cells 242, 244 are stacked along the stacking direction D1. In some embodiments, each memory cell 240 includes a gate electrode (e.g., a portion of a corresponding conductive line 204B, 204C), a gate dielectric (e.g., a portion of a corresponding memory material layer 210), a channel region (e.g., a portion of a corresponding channel layer 212), and first and second regions (e.g., portions of corresponding conductive pillars 224A, 230B). The first and second regions may be referred to as source and drain regions of the memory cells 240. The memory cells 240, 242, 244 may be disposed in an array of vertically stacked rows and columns. In FIG. 20A, two memory cells 240 are shown, but the number of the memory cells 240 depends on the number of the conductive lines 204 and may vary depending on the layout design.

In some embodiments, the first and second memory cells 242, 244 are disposed at two opposite ends of the stacked memory cells 240. For example, the first memory cell 242 (e.g., top select device) is formed at a first end of the stacked memory cells 240, which couples the stacked memory cells 240 to a first signal line (e.g., source line). The second memory cell 244 (e.g., bottom select device) is formed at a second end of the stacked memory cells 240, which couples the stacked memory cells 240 to a second signal line (e.g., bit line). In other words, the second memory cell 244 is disposed immediately beneath the bottommost memory cell 240, and the first memory cell 242 is disposed immediately on the topmost memory cell 240. In some embodiments, each memory cell 242, 244 includes a gate electrode (e.g., a portion of a corresponding conductive line 204A, 204D), a gate dielectric (e.g., a portion of the memory material layer 210), a channel region (e.g., a portion of the channel layer 212), and first and second regions (e.g., portions of the corresponding conductive pillars 224A, 224B, 230A, 230B). In the embodiments, the structure of the first and second memory cells 242, 244 may be the same or similar to the stacked memory cells 240. However, the disclosure is not intended limited the implementation of the first and second memory cells 242, 244. In some alternative embodiments, the first and second memory cells 242, 244 may be implemented by transistors having different structure and/or made of different process as compared to the stacked memory cells 240.

In some embodiments, a first end of the channel layer 212 of the first memory cell 242 is coupled to the first signal line through the first conductive pillar 224B, and a second end of the channel layer 212 of the first memory cell 242 is coupled to the first terminal of the memory cells 240 through the conductive pillar 230B. Similarly, a second end of the channel layer 212 of the second memory cell 244 is coupled to the second signal line through the first conductive pillar 230A, and a first end of the channel layer 212 of the second memory cell 244 is coupled to the second terminal of the memory cells 240 through the conductive pillar 224A, for example. In the embodiments, a first end of the channel layer 212 of the memory cell 240 is coupled to the channel layer 212 of the first memory cell 242 through the conductive pillar 230B, and a second end of the channel layer 212 of the memory cell 240 is coupled to the channel layer 212 of the second memory cell 244 through the conductive pillar 224A. In the embodiments, a first terminal (e.g., a portion of conductive pillar 224B) of the first memory cell 242 is coupled to the first signal line directly, and a second terminal (e.g., a portion of conductive pillar 230B) of the first memory cell 242 is coupled to the first terminal (e.g., a portion of conductive pillar 230B) of the memory cell 240 directly. In the embodiments, a second terminal (e.g., a portion of conductive pillar 230A) of the second memory cell 244 is coupled to the second signal line directly, and a first terminal (e.g., a portion of conductive pillar 224A) of the second memory cell 244 is coupled to the second terminal (e.g., a portion of conductive pillar 224A) of the memory cell 240 directly.

Figure 21A:
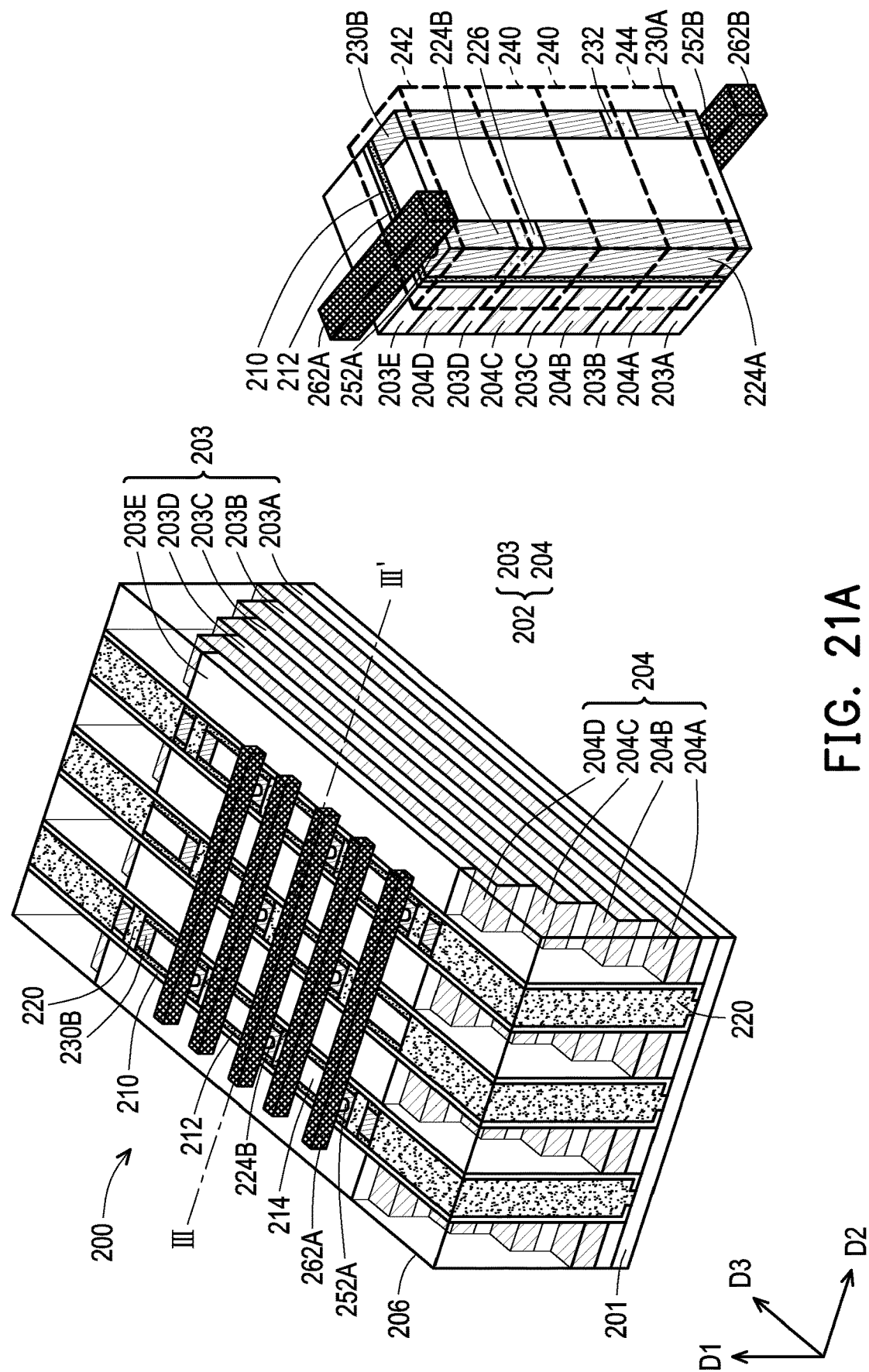
FIG. 21A illustrates a perspective view of the memory device in accordance with some embodiments.
Figure 21B:
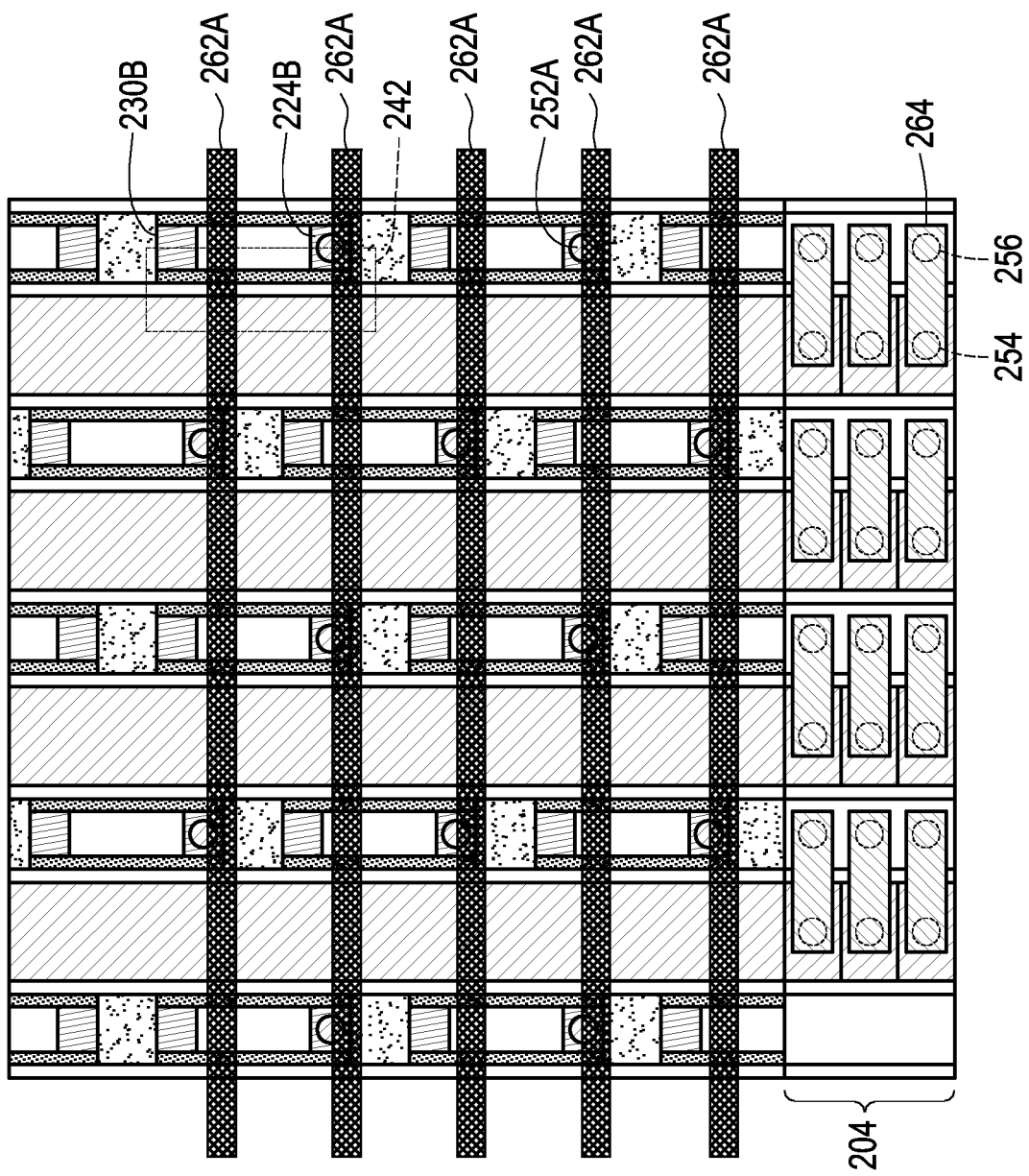
FIG. 21B illustrates a top view of the memory device.
Figure 21C:
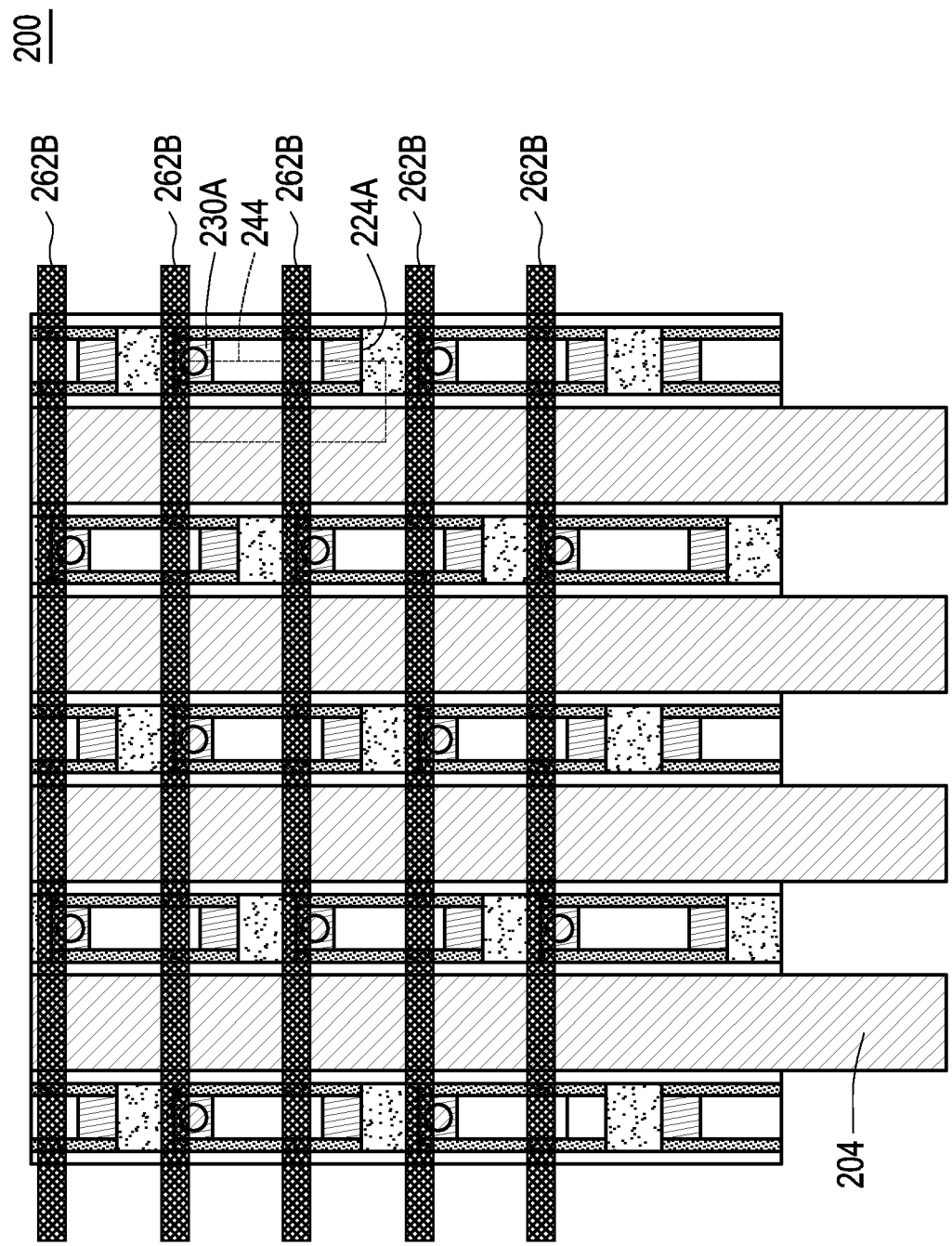
FIG. 21C illustrates a bottom view of the memory device.
Figure 21D:
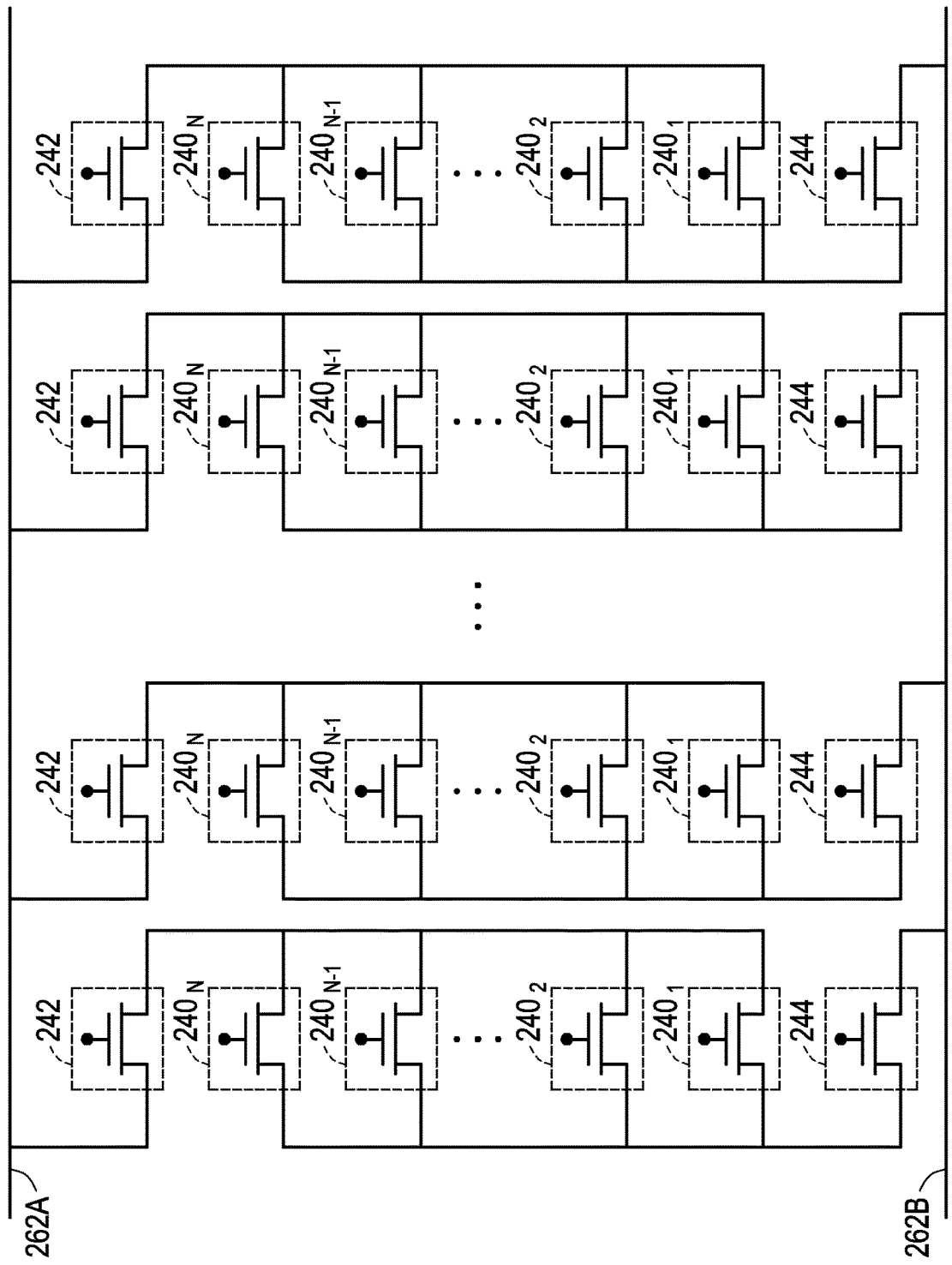
FIG. 21D illustrates a circuit diagram of the memory device.

FIG. 21A illustrates a perspective view of the memory device 200 in accordance with some embodiments, in which the enlarged partial 3D view of a portion of the memory device is shown at the right side. FIG. 21B illustrates a top view of the memory device 200. FIG. 21C illustrates a bottom view of the memory device 200. In addition, FIG. 21D illustrates a circuit diagram of the memory device 200.

Referring to FIGS. 21A-21C, conductive lines 262A, conductive lines 262B and conductive lines 264 are formed to electrically connect the conductive pillars 224B, the conductive pillars 230A, and the conductive lines 204A-204D, respectively. In some embodiments, the conductive lines 262A are formed above the conductive pillars 224B, and the conductive lines 262A are electrically connected to the conductive pillars 224B through a plurality of conductive contacts 252A therebetween. The conductive lines 262B may be formed below the conductive pillars 230A, and the conductive lines 262B are electrically connected to the conductive pillars 230A through a plurality of conductive contacts 252B therebetween. In some embodiments, a portion of the conductive pillars 230A serves as the conductive contacts 252B. In some embodiments, a plurality of conductive contacts 254 are formed on exposed portions of the conductive lines 204A-204D, and the conductive lines 264 are electrically connected to the conductive lines 204A-204D through the conductive contacts 254 therebetween. In some embodiments, the conductive lines 264 are formed in a dielectric layer (not shown) to electrically couple the conductive contacts 254 to conductive contacts 256. In some embodiments, the conductive contacts 254 are referred to as word line contacts, gate contacts, or the like. The conductive contacts 256 extend through the memory device 200, such as through the dielectric material 220. In embodiments in which bottom portions of the memory material layer 210 are not removed, the conductive contacts 256 extend through the dielectric materials 220 and the memory material layer 210. The contacts 256 may be electrically coupled to underlying conductive features, such as the conductive features of the interconnect structure.

The conductive lines 262A and the conductive lines 262B may each extend in a direction (e.g., the direction D2) perpendicular to the extending direction (e.g., the direction D3) of the conductive lines 204A-204D. The conductive lines 262A may be parallel to each other and arranged over the stacks 202 along the direction D3. Similarly, the conductive lines 262B may be parallel to each other and arranged below the stacks 202 along the direction D3. In some embodiments, the conductive contacts 252A, 252B and 254 and the conductive lines 262A, 262B and 264 connect the memory device 200 to an underlying/overlying circuitry (e.g., control circuitry) and/or signal, power, and ground lines, respectively. Other conductive contacts or vias may be formed to electrically connect the conductive lines 262A, 262B and 264 to the underlying active devices of the substrate. In alternative embodiments, routing and/or power lines to and from the memory device are provided by an interconnect structure formed over the memory device 200. In some embodiments, the conductive lines 262A, 262B and 264 are formed using a combination of photolithography and etching techniques. The conductive lines 262A, 262B and 264 may include copper, silver, gold, tungsten, aluminum, combinations thereof, or the like. In addition, the conductive lines 262A, 262B and 264 may have other configurations.

The conductive pillars 224B are electrically connected to the conductive lines 262A, and the conductive pillars 230A are electrically connected to the conductive lines 262B. In some embodiments, the conductive pillars 224B are referred to as first local signal lines and the conductive lines 262A are referred to as first global signal lines. Similarly, the conductive pillars 230A are referred to as second local signal lines while the conductive lines 262B are referred to as second global signal lines. The first (local/global) signal line is one of a bit line and a source line, and the second (local/global) signal line is the other of the bit line and the source line. For example, the conductive pillars 224B and the conductive lines 262A serve as local source lines and global source lines respectively, and the conductive pillars 230B and the conductive lines 262B serve as local bit lines and global bit lines respectively. In alternative embodiments, the conductive pillars 224B and the conductive lines 262A serve as local bit lines and global bit lines respectively, and the conductive pillars 230B and the conductive lines 262B serve as local source lines and global source lines respectively.

Referring to FIG. 21D, in some embodiments, the memory device 200 has a plurality of columns, each column has N memory cells $240_1$, $240_2$, ..., $240_{N-1}$, $240_N$ (collectively referred to as memory cells 240) stacked between the first and second memory cells 242, 244, where N is any positive integer. For example, N is 16, 32, 48 or 64. In the embodiments, a first terminal of the first memory cell 242 is coupled to the first signal line directly, and a second terminal of the first memory cell 242 is coupled to the first terminal of the memory cell 240 directly. In the embodiments, a second terminal of the second memory cell 244 is coupled to the second signal line directly, and a first terminal of the second memory cell 244 is coupled to the second terminal of the memory cell 240 directly. When any one of the memory cells 240 is to be accessed, the corresponding first and second memory cells 242, 244 are turned on. In such case, a first terminal of the memory cell 240 (i.e., the accessed memory cell) is coupled to the first signal line (e.g., conductive line 262A) via the first memory cell 242 (i.e., the turned-on select transistor), and a second terminal of the memory cell 240 (i.e., the accessed memory cell) is coupled to the second signal line (e.g., conductive line 262B) via the second memory cell 244 (i.e., the turned-on select transistor). Since the first and second memory cells 242, 244 in other columns are turned off, the parasitic capacitance (also referred to as parallel capacitance) of the memory cells 240 in other columns is isolated from the accessed memory cell 240. Due to the configuration of the first and second memory cells 242, 244, the parasitic capacitance is decreased by 1/N as compared to an embodiment where the memory cells 240 are directly connected to the first and second signal lines.

The first terminal is one of the source and drain regions of the memory cell 240, and the second terminal is the other of the source and drain regions of the memory cell 240. The first signal line is one of a bit line and a source line corresponding to the first terminal, and the second signal line is the other of the bit line and the source line corresponding to the second terminal. For example, the source region of the memory cell 240 is coupled to the source line (e.g., conductive line 262A) through the first memory cell 242 (e.g., the channel layer 212 of the first memory cell 242), and the drain region of the memory cells 240 is coupled to the bit line (e.g., conductive line 262B) through the second memory cell 244 (e.g., the channel layer of the second memory cell 244). In some embodiments, the source region of the first memory cell 242 is coupled to the source line (e.g., conductive line 262A) directly, and the drain region of the first memory cell 242 is coupled to the source region of the memory cell 240 directly. In some embodiments, the drain region of the second memory cell 244 is coupled to the bit line (i.e., conductive line 262B) directly, and the source region of the second memory cell 244 is coupled to the drain region of the memory cell 240 directly.

In some embodiments, the memory cell 240 is coupled to the first and second signal lines through the first and second memory cells 242, 244, respectively. However, the disclosure is not limited thereto. In alternative embodiments, the memory cell 240 is coupled to one of the first and second signal lines directly without the memory cell 242, 244.

Figure 22A:
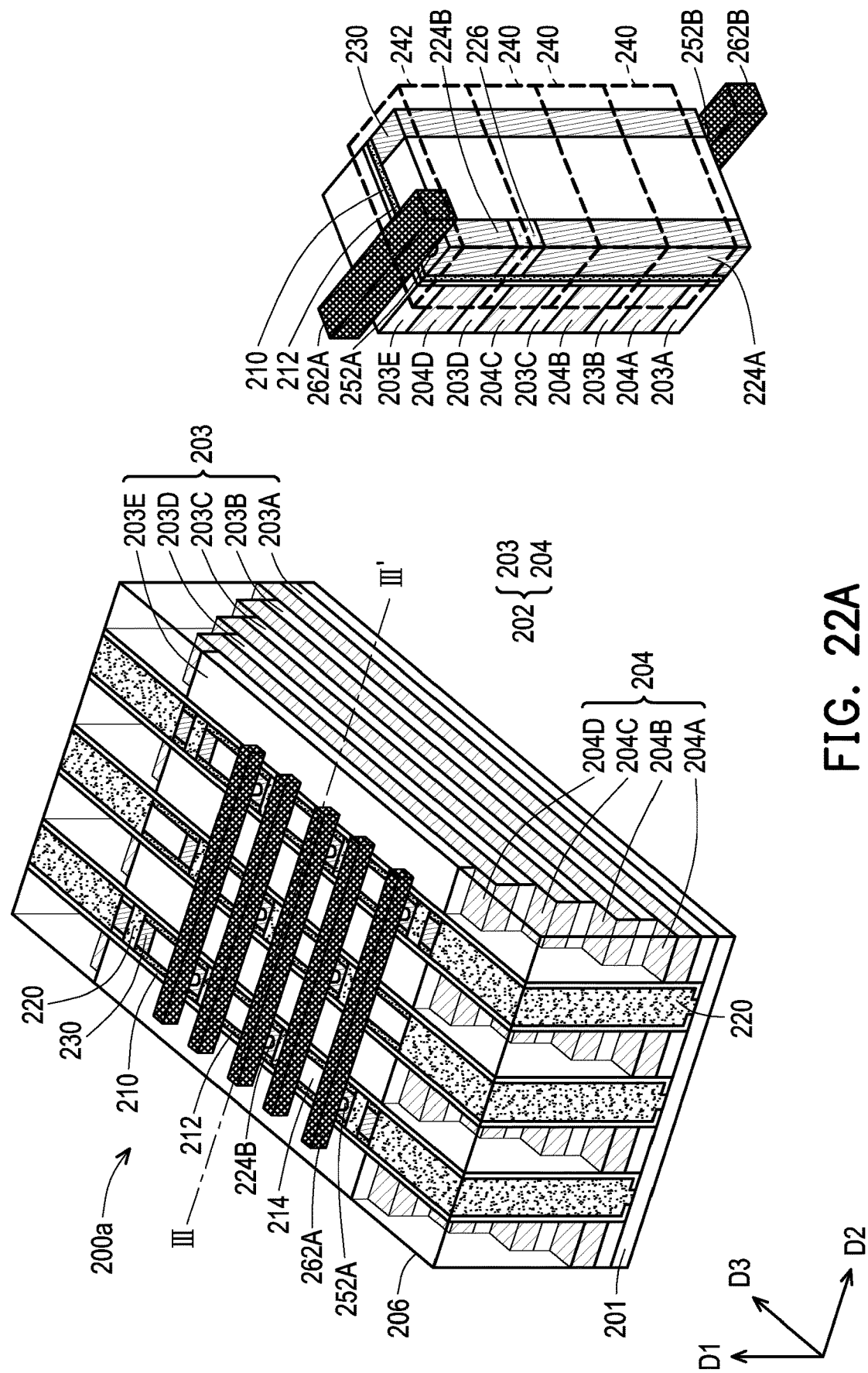
FIG. 22A illustrates a perspective view of the memory device in accordance with some embodiments.
Figure 22B:
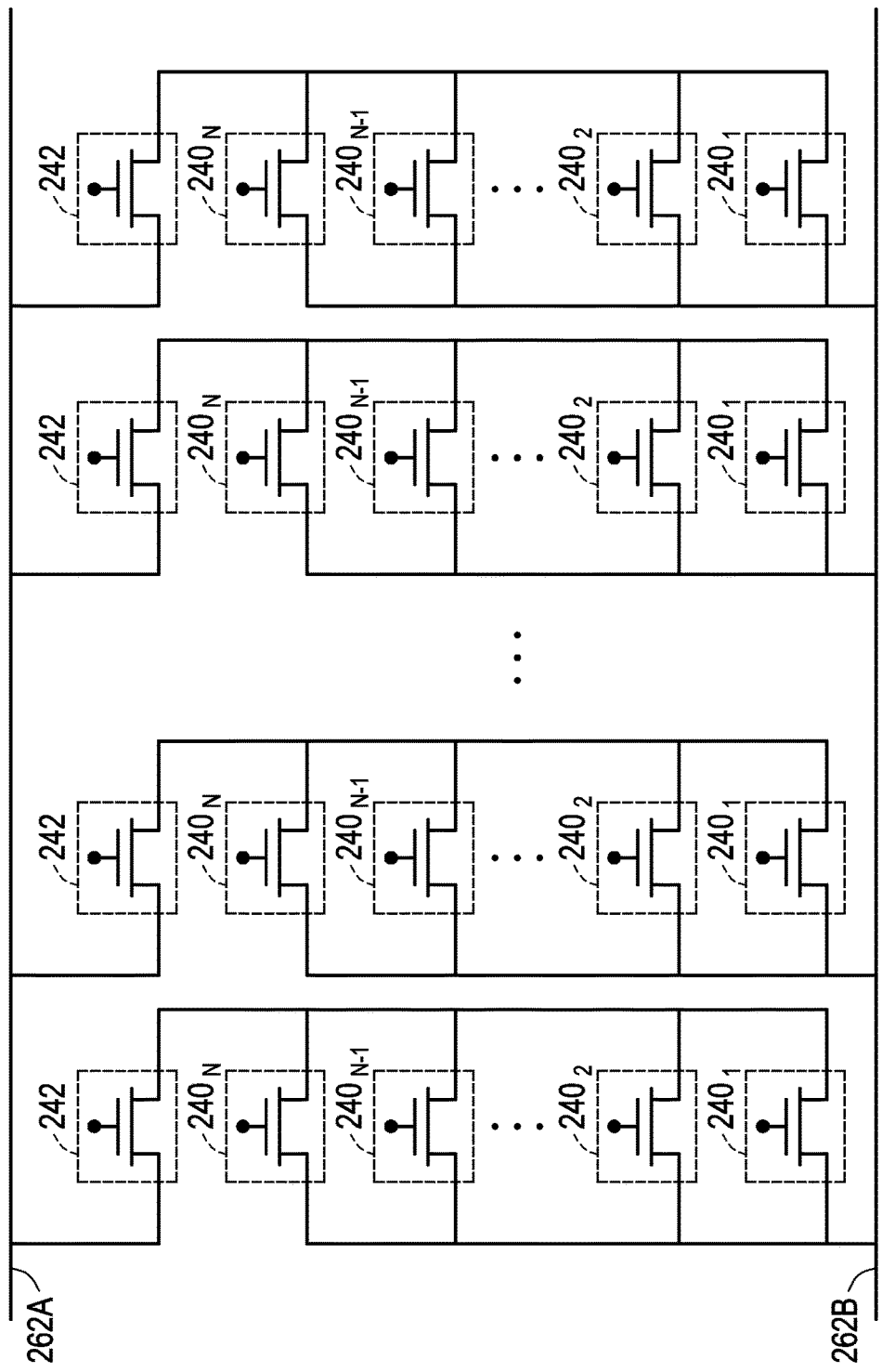
FIG. 22B illustrates a circuit diagram of the memory device.

FIG. 22A illustrates a perspective view of the memory device in accordance with some embodiments, in which the enlarged partial 3D view of a portion of the memory device is shown at the right side. FIG. 22B illustrates a circuit diagram of the memory device. The memory device 200a of FIG. 22A and FIG. 22B is similar to the memory device of FIG. 21A and FIG. 21D, and the difference lies in that the memory cell 240 of the memory device 200a is coupled to the first signal line through the memory cell 242 and coupled to the second signal line directly. Referring to FIG. 22A, in the memory device 200a, the dielectric pillar 226 is inserted between the conductive pillar 224A and the conductive pillar 224B, and the conductive pillar 230 is continuously extended from the bottommost conductive line 204A to the topmost conductive line 204D of the stack 202. For example, top and bottom surfaces of the conductive pillars 230 are substantially level with top and bottom surfaces of stack 202. In some embodiments, the top surface of the conductive pillars 230 is level with top surfaces of the stacks 202 (e.g., dielectric layers 203E), the memory material layers 210, the channel layers 212 and the conductive pillars 224B.

In some embodiments, the memory device 200a includes stacks 202, and each stack 202 includes memory cells 240 and the memory cell 242 disposed at one side of the stacked memory cells 240. In some embodiments, each memory cell 240 includes a gate electrode (e.g., a portion of a corresponding conductive line 204A, 204B, 204C), a gate dielectric (e.g., a portion of a corresponding memory material layer 210), a channel region (e.g., a portion of a corresponding channel layer 212), and first and second regions (e.g., portions of corresponding conductive pillars 224A, 230). The first and second regions may be source and drain regions of the memory cells 240. The memory cell 242 includes a gate electrode (e.g., a portion of a corresponding conductive line 204D), a gate dielectric (e.g., a portion of a corresponding memory material layer 210), a channel region (e.g., a portion of a corresponding channel layer 212), and first and second regions (e.g., portions of corresponding conductive pillars 224B, 230), for example.

Figure 23:
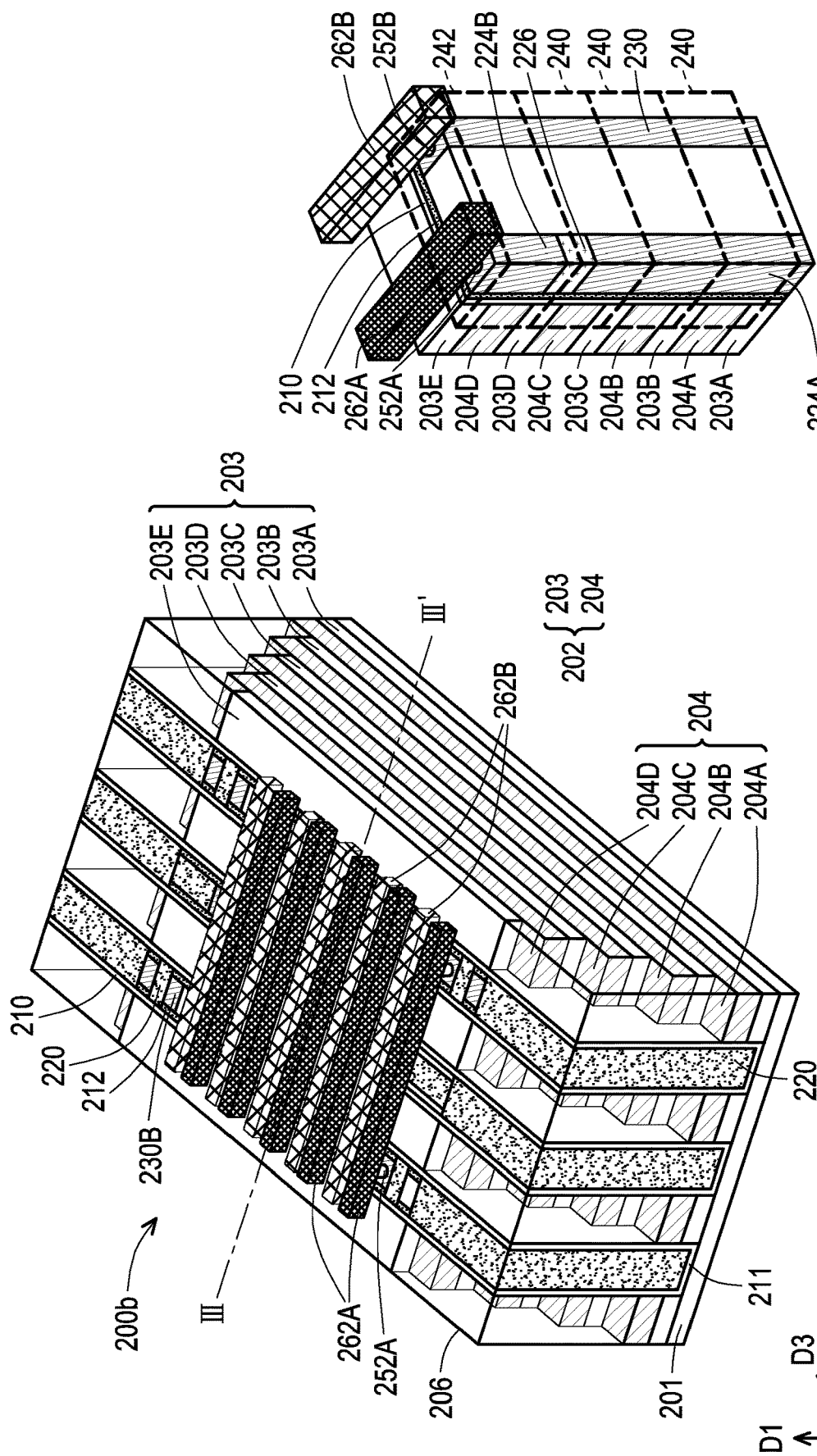
FIG. 23 illustrates a perspective view of the memory device in accordance with some embodiments.

In some embodiments, the conductive pillars 224B are electrically connected to the conductive lines 262A, and the conductive pillars 230 are electrically connected to the conductive lines 262B. In some embodiments, the conductive lines 262A and the conductive lines 262B are disposed at opposite sides of the stacks 202. For example, as shown in FIG. 22A, the conductive lines 262A are disposed over the stacks 202, and the conductive lines 262B are disposed beneath the stacks 202. However, the disclosure is not limited thereto. As shown in FIG. 23, in the memory device 200b, the conductive lines 262B may be disposed at the same side of the stacks 202 as the conductive lines 262A. For example, the conductive lines 262A and the conductive lines 262B are alternately arranged. In addition, since the conductive lines 262A and the conductive lines 262B are disposed at the same side (e.g., upper side) of the stacks 202, the bottom 211 of the memory material layer 210 may be formed without an opening for the lower electrical connection. However, the disclosure is not limited thereto.

In some embodiments, as shown in FIG. 22B, when any one of the memory cells 240 is to be accessed, the corresponding memory cell 242 is turned on. In such case, the first terminal of the memory cell 240 (i.e., the accessed memory cell) is coupled to the first signal line (i.e., conductive line 262A) via the memory cell 242 (i.e., the turned-on select transistor), and the second terminal of the memory cell 240 (i.e., the accessed memory cell) is coupled to the second signal line (i.e., conductive line 262B) directly. Since the memory cells 242 in other columns are turned off, the parasitic capacitance of the memory cells 240 in other columns is isolated from the accessed memory cell 240.

Figure 24A:
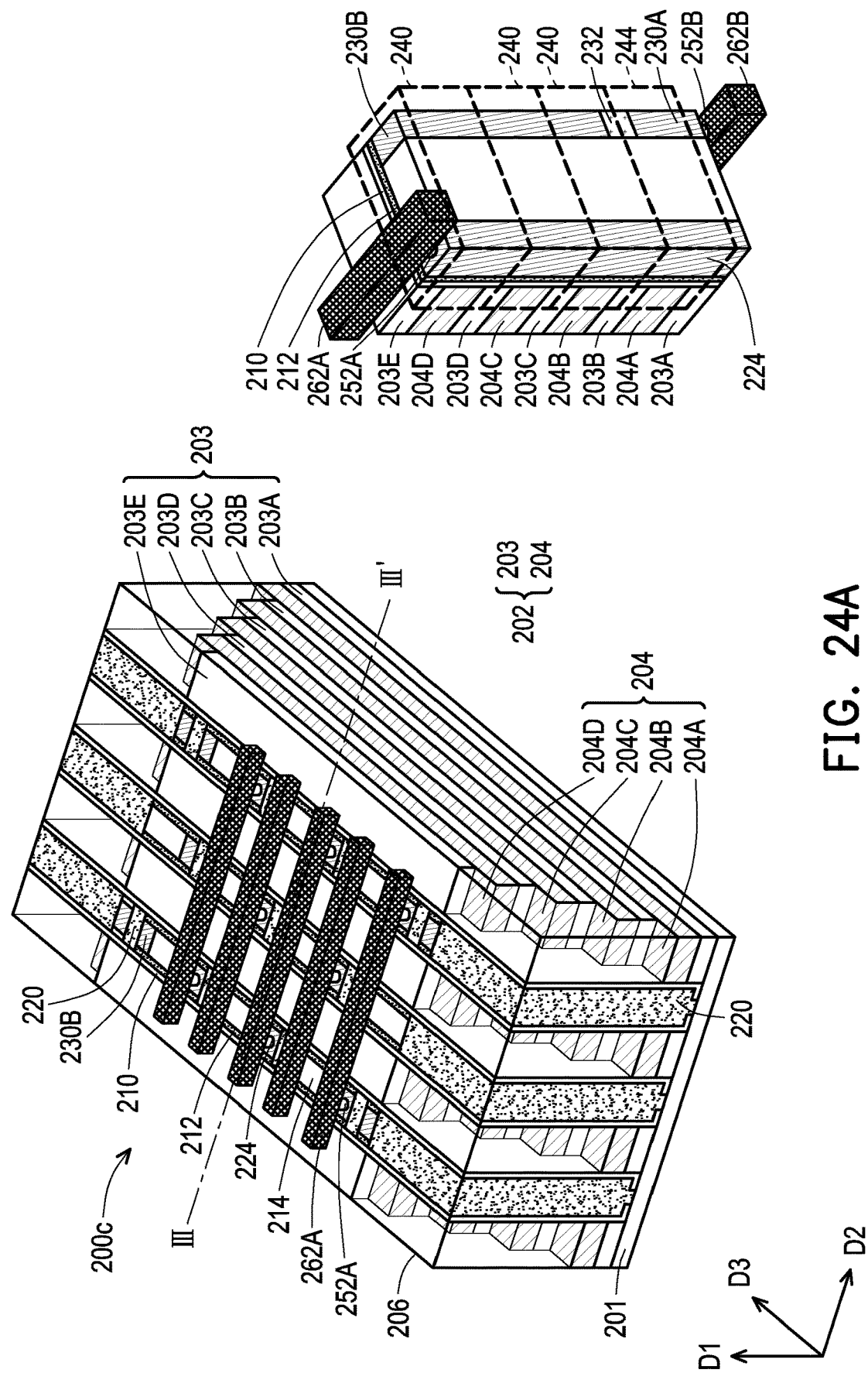
FIG. 24A illustrates a perspective view of the memory device in accordance with some embodiments.
Figure 24B:
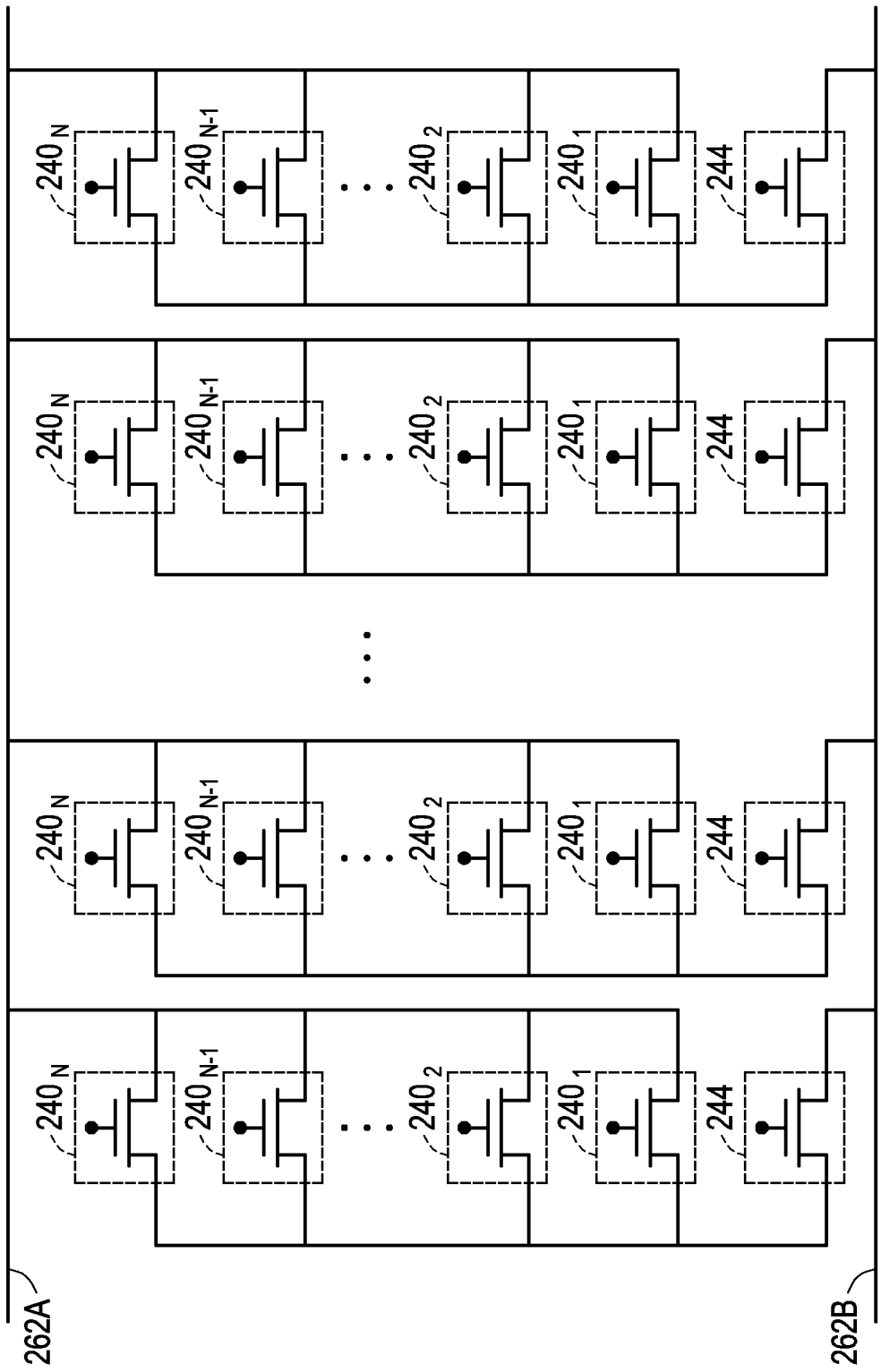
FIG. 24B illustrates a circuit diagram of the memory device.

FIG. 24A illustrates a perspective view of the memory device in accordance with some embodiments, in which the enlarged partial 3D view of a portion of the memory device is shown at the right side. FIG. 24B illustrates a circuit diagram of the memory device. The memory device 200c of FIG. 24A and FIG. 24B is similar to the memory device of FIG. 21A and FIG. 21D, and the difference lies in that the memory cell 240 of the memory device 200c is coupled to the first signal line directly and coupled to the second signal line through the memory cell 244. Referring to FIG. 24A, in the memory device 200c, the dielectric pillar 232 is inserted between the conductive pillar 230A and the conductive pillar 230B, and the conductive pillar 224 is continuously extended from the bottommost conductive line 204A to the topmost conductive line 204D of the stack 202. For example, top and bottom surfaces of the conductive pillars 224 are substantially level with top and bottom surfaces of stack 202. In some embodiments, the top surface of the conductive pillars 224 is level with top surfaces of the stacks 202 (e.g., dielectric layers 203E), the memory material layers 210, the channel layers 212 and the conductive pillars 230B.

In some embodiments, the memory device 200c includes stacks 202, and each stack 202 includes memory cells 240 and the memory cell 244 disposed at one side of the stacked memory cells 240. In some embodiments, each memory cell 240 includes a gate electrode (e.g., a portion of a corresponding conductive line 204A, 204B, 204C), a gate dielectric (e.g., a portion of a corresponding memory material layer 210), a channel region (e.g., a portion of a corresponding channel layer 212), and first and second regions (e.g., portions of corresponding conductive pillars 224, 230B). The first and second regions may be source and drain regions of the memory cells 240. The memory cell 244 includes a gate electrode (e.g., a portion of a corresponding conductive line 204A), a gate dielectric (e.g., a portion of a corresponding memory material layer 210), a channel region (e.g., a portion of a corresponding channel layer 212), and first and second regions (e.g., portions of corresponding conductive pillars 224, 230A), for example.

In some embodiments, the conductive pillars 224 are electrically connected to the conductive lines 262A, and the conductive pillars 230A are electrically connected to the conductive lines 262B. In some embodiments, the conductive lines 262A and the conductive lines 262B are disposed at opposite sides of the stacks 202. For example, as shown in FIG. 24A, the conductive lines 262A are disposed over the stacks 202, and the conductive lines 262B are disposed beneath the stacks 202. However, the disclosure is not limited thereto. In alternative embodiments, the conductive lines 262A may be disposed at the same side of the stacks 202 as the conductive lines 262B. In such embodiments, the conductive lines 262A and the conductive lines 262B are alternately arranged.

In some embodiments, as shown in FIG. 24B, when any one of the memory cells 240 is to be accessed, the corresponding memory cell 244 is turned on. In such case, the first terminal of the memory cell 240 (i.e., the accessed memory cell) is coupled to the first signal line (i.e., conductive line 262A) directly, and the second terminal of the memory cell 240 (i.e., the accessed memory cell) is coupled to the second signal line (i.e., conductive line 262B) via the memory cell 244 (i.e., the turned-on select transistor). Since the memory cells 244 in other columns are turned off, the parasitic capacitance of the memory cells 240 in other columns is isolated from the accessed memory cell 240.

Although the above embodiments illustrate a particular pattern for the conductive pillars 224(224A/224B) and 230 (230A/230B), other configurations are also possible. For example, in these embodiments, the conductive pillars 224 (224A/224B) and 230(230A/230B) have a staggered pattern. However, in other embodiments (not shown), the conductive pillars 224(224A/224B) and 230(230A/230B) in a same row of the array are all aligned with each other.

Figure 25:
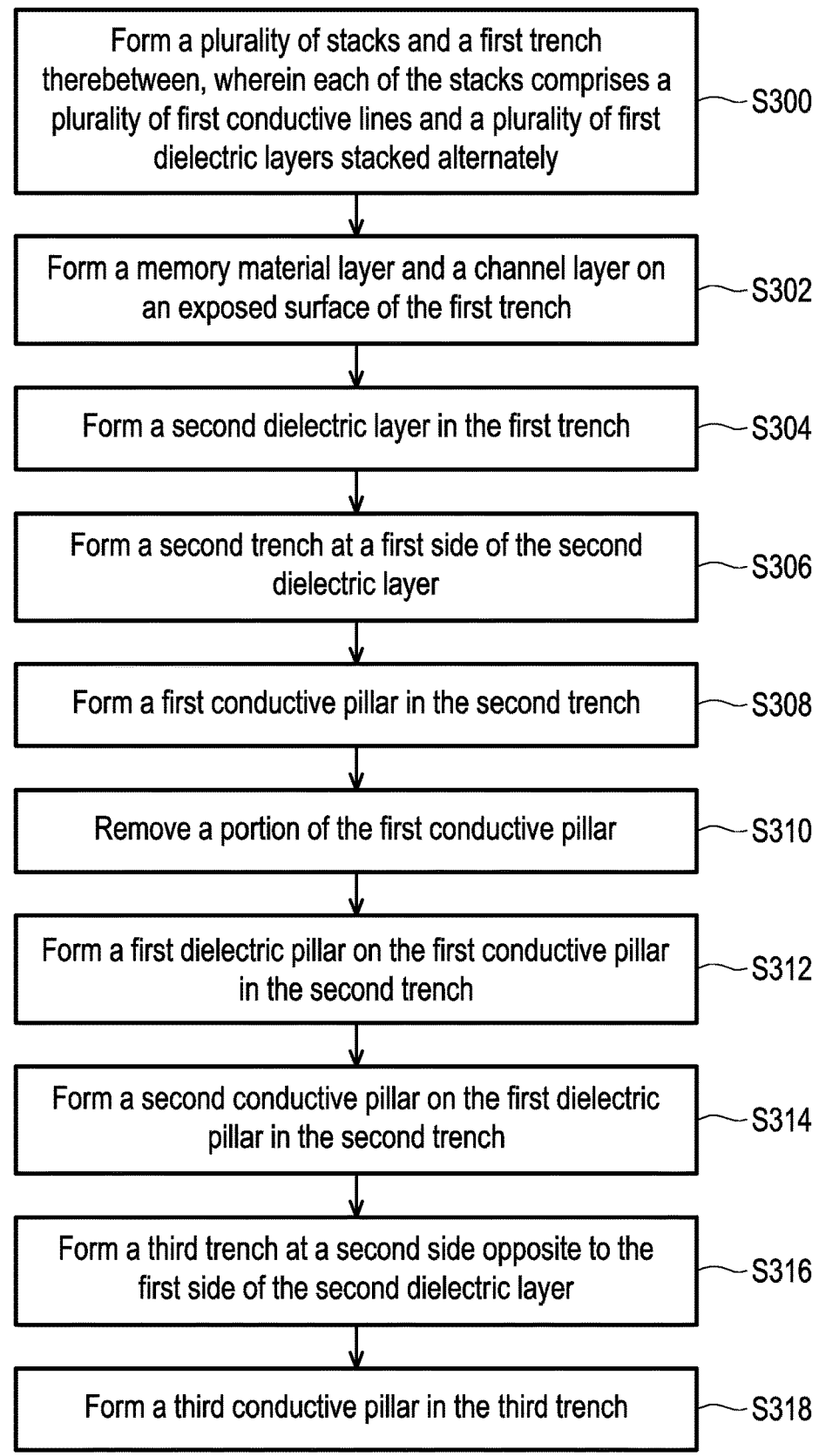
FIG. 25 illustrates a method of forming a memory device in accordance with some embodiments.

FIG. 25 illustrates a method of forming a memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S300, a plurality of stacks and a first trench therebetween are formed, wherein each of the stacks comprises a plurality of first conductive lines and a plurality of first dielectric layers stacked alternately. FIGS. 2A and 2B illustrate varying views corresponding to some embodiments of act S300.

At act S302, a memory material layer and a channel layer are formed on an exposed surface of the first trench. FIGS. 3A-4 illustrate varying views corresponding to some embodiments of act S302.

At act S304, a second dielectric layer is formed in the first trench. FIGS. 5-8B illustrate varying views corresponding to some embodiments of act S304.

At act S306, a second trench is formed at a first side of the second dielectric layer. FIGS. 9A and 9B illustrate varying views corresponding to some embodiments of act S306.

At act S308, a first conductive pillar is formed in the second trench. FIGS. 10A and 10B illustrate varying views corresponding to some embodiments of act S308.

At act S310, a portion of the first conductive pillar is removed. FIGS. 11A and 11B illustrate varying views corresponding to some embodiments of act S310.

At act S312, a first dielectric pillar is formed on the first conductive pillar in the second trench. FIGS. 12A-13B, 22A, 23 and 24A illustrate varying views corresponding to some embodiments of act S312.

At act S314, a second conductive pillar is formed on the first dielectric pillar in the second trench. FIGS. 14A, 14B, 22A, 23 and 24A illustrate varying views corresponding to some embodiments of act S314.

At act S316, a third trench is formed at a second side opposite to the first side of the second dielectric layer. FIGS. 15A, 15B, 22A, 23 and 24A illustrate varying views corresponding to some embodiments of act S316.

At act S318, a third conductive pillar is formed in the third trench. FIGS. 16A-20B, 22A, 23 and 24A illustrate varying views corresponding to some embodiments of act S318.

In some embodiments, at least one terminal of the memory cell is coupled to the signal line through a select transistor (i.e., the memory cell configured to function as a switch). When the memory cell is to be accessed, the corresponding select transistor is turned on. In such case, the at least one terminal of the accessed memory cell is coupled to the signal line via the turned-on select transistor. Since the select transistors in other columns are turned off, the parasitic capacitance of the memory cells in other columns may be isolated from the accessed memory cell. Accordingly, the parasitic capacitance is decreased.

In accordance with some embodiments of the disclosure, a memory device includes a first signal line, a second signal line, a first memory cell and a plurality of second memory cells. The first memory cell is coupled to the first signal line. Each of the second memory cells has a first terminal coupled to the first signal line through the first memory cell and a second terminal coupled to the second signal line.

In accordance with some embodiments of the disclosure, a memory device includes a stack including a plurality of first conductive lines and a plurality of first dielectric layers, a second dielectric layer, a first conductive pillar, a first dielectric pillar, a second conductive pillar, a third conductive pillar, a channel layer and a memory material layer. The first conductive lines and the first dielectric layers are stacked alternately in a first direction. The second dielectric layer is disposed adjacent to the first conductive lines and the first dielectric layers. The second dielectric layer, the first conductive pillar and the first dielectric pillar are stacked in the first direction and disposed at a first side of the second dielectric layer. The first dielectric pillar is disposed between the first conductive pillar and the second conductive pillar. The third conductive pillar is disposed at a second side opposite to the first side of the second dielectric layer. The channel layer is disposed adjacent to the first conductive lines and the first dielectric layers. The memory material layer is disposed between the channel layer and each of the first conductive lines and the first dielectric layers.

In accordance with some embodiments of the disclosure, a method of forming a memory device includes the following steps. A plurality of stacks and a first trench therebetween are formed, wherein each of the stacks comprises a plurality of first conductive lines and a plurality of first dielectric layers stacked alternately. A memory material layer and a channel layer are formed on an exposed surface of the first trench. A second dielectric layer is formed in the first trench. A second trench is formed at a first side of the second dielectric layer. A first conductive pillar is formed in the second trench. A portion of the first conductive pillar is removed. A first dielectric pillar is formed on the first conductive pillar in the second trench. A second conductive pillar is formed on the first dielectric pillar in the second trench. A third trench is formed at a second side opposite to the first side of the second dielectric layer. A third conductive pillar is formed in the third trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a first signal line and a second signal line;
   a first memory cell coupled to the first signal line;
   a plurality of second memory cells, each of the second memory cells having a first terminal coupled to the first signal line through the first memory cell and a second terminal coupled to the second signal line;
   a first conductive pillar, coupled to the first signal line, and including a first terminal of the first memory cell; and
   a second conductive pillar, including a plurality of portions being the first terminals of the second memory cells and a second terminal of the first memory cell, respectively,
   wherein a channel layer of the first memory cell has a first end and a second end, the first end of the channel layer is coupled to the first signal line through the first conductive pillar, and the second end of the channel layer is coupled to the first terminal of each of the second memory cells through the second conductive pillar.

2. The memory device of claim 1, further comprising:
   a third memory cell coupled to the second signal line, wherein each of the second memory cells is coupled to the second signal line through the third memory cell.

3. The memory device of claim 1, wherein each of the second memory cells is coupled to the second signal line directly.

4. The memory device of claim 1, further comprising:
a third memory cell coupled to the first signal line; and
a plurality of fourth memory cells, each coupled to the first signal line through the third memory cell, wherein a parasitic capacitance of the fourth memory cells is isolated from the second memory cells through the third memory cell.

5. A memory device, comprising:
a first memory cell comprising a first conductive pillar extending along a first direction;
a second memory cell comprising a second conductive pillar extending along the first direction, wherein the first memory cell and the second memory cell are stacked along the first direction;
a third conductive pillar extending along the first direction, shared by the first and second memory cells;
a channel layer extending along the first direction, shared by the first and second memory cells;
a memory material layer extending along the first direction, shared by the first and second memory cells; and
a first dielectric pillar between the first conductive pillar and the second conductive pillar, wherein the second memory cell is coupled to a first signal line through the first memory cell.

6. The memory device of claim 5, wherein a top surface of the first conductive pillar is substantially flush with top surfaces of the third conductive pillar, the channel layer and the memory material layer.

7. The memory device of claim 5, wherein sidewalls of the first conductive pillar, the first dielectric pillar and the second conductive pillar are substantially flush with one another.

8. The memory device of claim 5, further comprising a stack, the stack comprising a plurality of first conductive lines and a plurality of first dielectric layers stacked alternately in the first direction and adjacent to the first memory cell and the second memory cell.

9. The memory device of claim 8, wherein top and bottom surfaces of the first dielectric pillar are substantially flush with top and bottom surfaces of one of the first dielectric layers.

10. The memory device of claim 8, wherein the first conductive pillar is overlapped with the topmost first conductive line in a second direction substantially perpendicular to the first direction, and the second conductive pillar is overlapped with the bottommost first conductive line in the second direction.

11. The memory device of claim 10, wherein a bottom surface of the second conductive pillar is substantially flush with a bottom surface of the bottommost first dielectric layer.

12. The memory device of claim 8, wherein the first conductive pillar is directly connected to one of a source line and a bit line through a first contact, and the third conductive pillar is directly connected to the other of the source line and the bit line through a second contact.

13. The memory device of claim 12, wherein the source line and the bit line are disposed at opposite sides of the stack.

14. The memory device of claim 8, further comprising a fourth conductive pillar and a second dielectric pillar, wherein the third conductive pillar, the second dielectric pillar and the fourth conductive pillar are stacked in the first direction, and the second dielectric layer is disposed between the third conductive pillar and the fourth conductive pillar.

15. The memory device of claim 14, wherein the first conductive pillar is directly connected to one of a source line and a bit line through a first contact, and the third conductive pillar is directly connected to the other of the source line and the bit line through a second contact.

16. The memory device of claim 14, wherein the first conductive pillar is overlapped with the bottommost first conductive line in a second direction substantially perpendicular to the first direction, and the fourth conductive pillar is overlapped with the bottommost first conductive line in the second direction.

17. The memory device of claim 8, wherein the stack is shaped into a first staircase structure and a second staircase structure at first and second sides.

18. A memory device, comprising:
a stack, comprising a plurality of first conductive lines and a plurality of first dielectric layers stacked alternately in a first direction;
a first memory cell comprising a first conductive pillar penetrating through the stack;
a second memory cell comprising a second conductive pillar penetrating through the stack, wherein the first memory cell and the second memory cell are stacked along the first direction;
a third conductive pillar extending along the first direction, penetrating through the stack and shared by the first and second memory cells; and
a first dielectric pillar between the first conductive pillar and the second conductive pillar, wherein the second memory cell is coupled to a first signal line through the first memory cell.

19. The memory device of claim 18, wherein the stack is shaped into a first staircase structure and a second staircase structure at first and second sides.

20. The memory device of claim 18, wherein the first conductive pillar is overlapped with the topmost first conductive line in a second direction substantially perpendicular to the first direction, and the second conductive pillar is overlapped with the bottommost first conductive line in the second direction.

* * * * *